(12) United States Patent
Hatade

(10) Patent No.: US 7,812,402 B2
(45) Date of Patent: Oct. 12, 2010

(54) SEMICONDUCTOR DEVICE

(75) Inventor: Kazurnari Hatade, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 1276 days.

(21) Appl. No.: 11/194,532

(22) Filed: Aug. 2, 2005

(65) Prior Publication Data

US 2006/0118860 A1 Jun. 8, 2006

(30) Foreign Application Priority Data

Dec. 2, 2004 (JP) ............................. 2004-349702

(51) Int. Cl.
*H01L 29/72* (2006.01)

(52) U.S. Cl. ................. 257/372; 257/168; 257/288; 257/355; 257/371; 257/401; 257/492; 257/493

(58) Field of Classification Search ................ 257/168, 257/288, 355, 371, 372, 401, 492, 493
See application file for complete search history.

(56) References Cited

U.S. PATENT DOCUMENTS

| | | | |
|---|---|---|---|
| 4,292,642 A | 9/1981 | Appels et al. | |
| 5,894,156 A * | 4/1999 | Terashima et al. | 257/374 |
| 6,376,891 B1 * | 4/2002 | Nagatani et al. | 257/492 |
| 6,507,085 B2 | 1/2003 | Shimizu | |
| 6,825,700 B2 | 11/2004 | Hano | |
| 6,979,850 B2 | 12/2005 | Hatade | |
| 7,190,034 B2 | 3/2007 | Hatade et al. | |
| 7,242,059 B2 | 7/2007 | Negoro et al. | |
| 2003/0218186 A1 * | 11/2003 | Hano | 257/197 |
| 2004/0232522 A1 * | 11/2004 | Shimizu | 257/548 |

FOREIGN PATENT DOCUMENTS

| | | |
|---|---|---|
| JP | 5-152523 | 6/1993 |
| JP | 9-283716 | 10/1997 |
| JP | 11-214531 | 6/1999 |
| JP | 11-214530 | 8/1999 |
| JP | 2002-324848 | 11/2002 |

(Continued)

OTHER PUBLICATIONS

Korean Office Action dated Nov. 22, 2006 (with English Translation).

(Continued)

*Primary Examiner*—Edward Wojciechowicz
(74) *Attorney, Agent, or Firm*—Buchanan Ingersoll & Rooney PC

(57) ABSTRACT

In the upper surface of a $p^-$ substrate, an n-type impurity region is formed. In the upper surface of the n-type impurity region, a p-well is formed. Also in the upper surface of the n-type impurity region, a $p^+$-type source region and a $p^+$-type drain region are formed. In the upper surface of the p-well, an $n^+$-type drain region and an $n^+$-type source region are formed. In the $p^-$ substrate, an $n^+$ buried layer having an impurity concentration higher than that of the n-type impurity region is formed. The $n^+$ buried layer is formed in contact with the bottom surface of the n-type impurity region at a greater depth than the n-type impurity region.

10 Claims, 71 Drawing Sheets

FOREIGN PATENT DOCUMENTS

| | | |
|---|---|---|
| JP | 2003-068872 | 7/2003 |
| JP | 2004-47937 | 2/2004 |
| JP | 2004-241613 | 8/2004 |
| JP | 2004-296831 | 10/2004 |
| JP | 2004-349702 | 7/2010 |
| KR | 10-2004-0085031 | 10/2004 |

OTHER PUBLICATIONS

German Office Action dated Dec. 12, 2006 (with English Translation).

Japanese Office Action issued in JP 2004-349702 dated Jul. 20, 2010 with English Translation.

\* cited by examiner

F I G. 2A
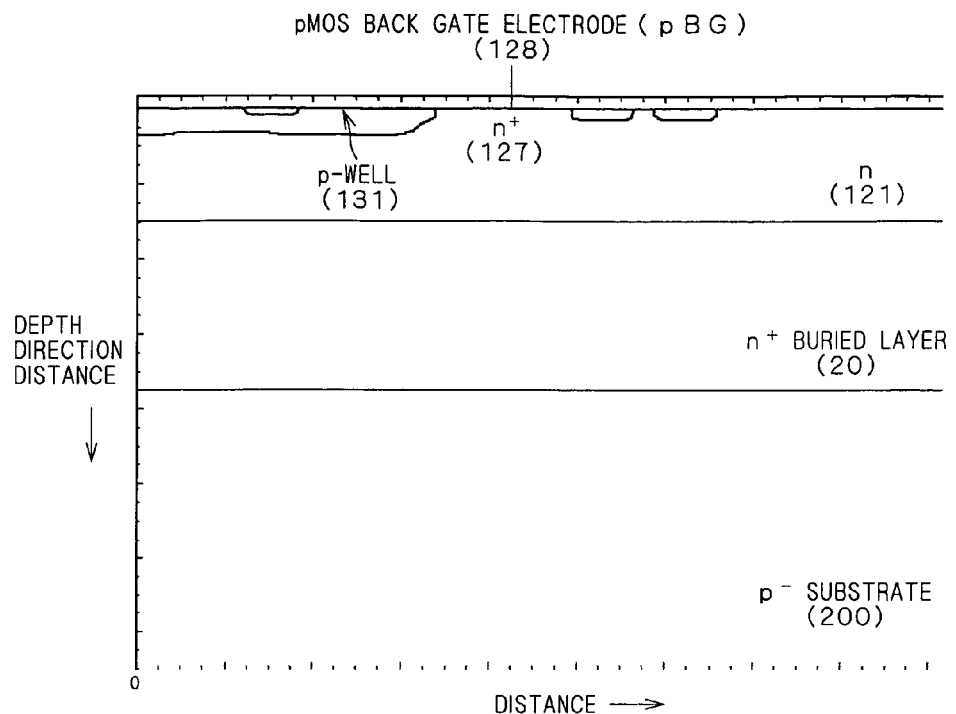
F I G. 2B
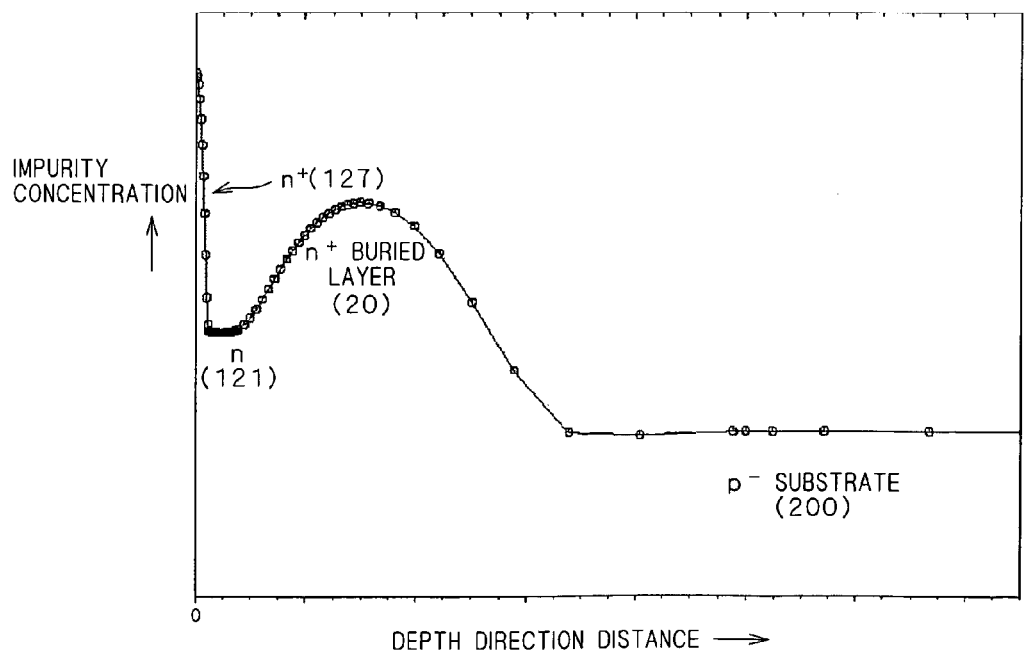

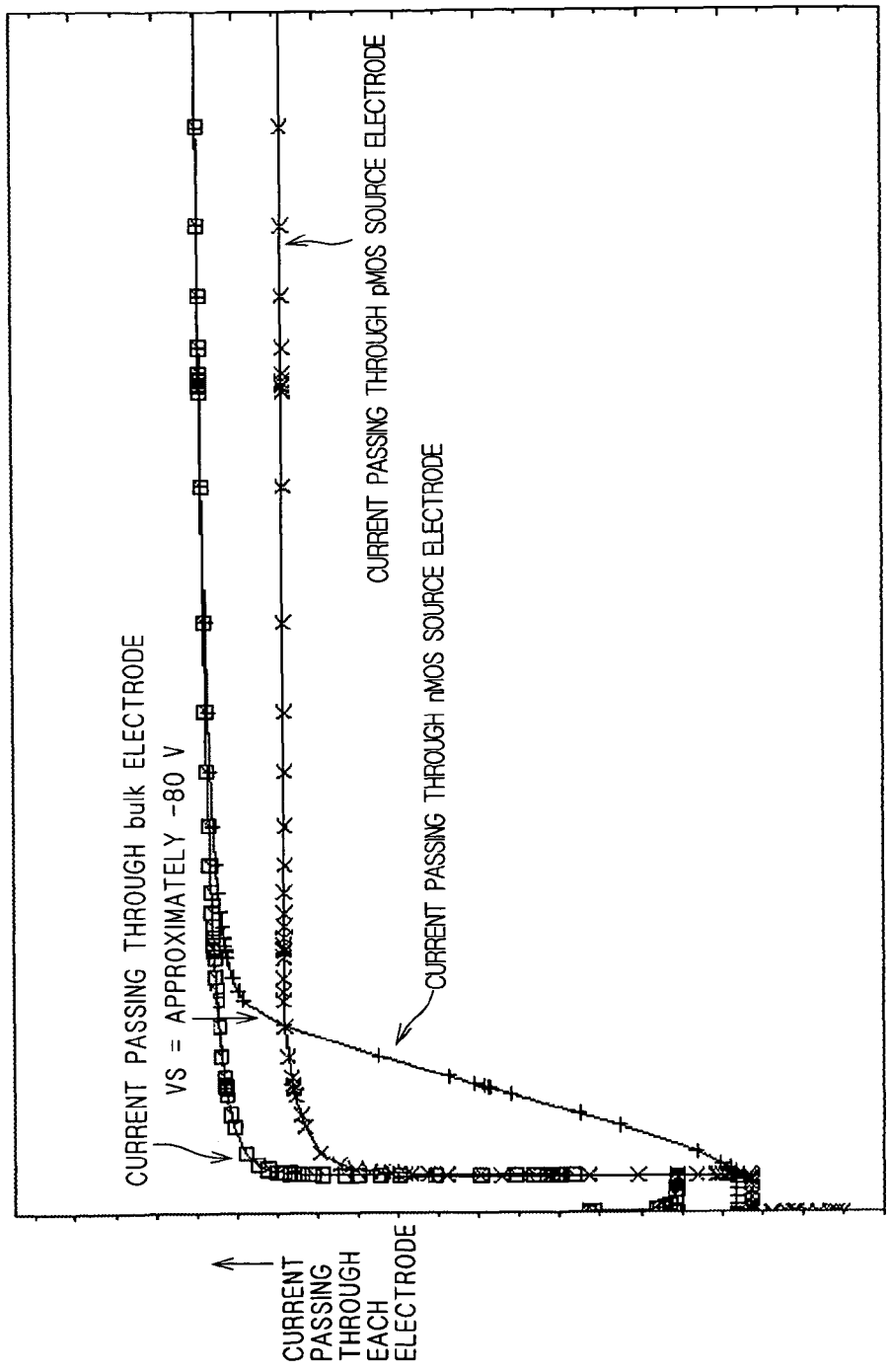

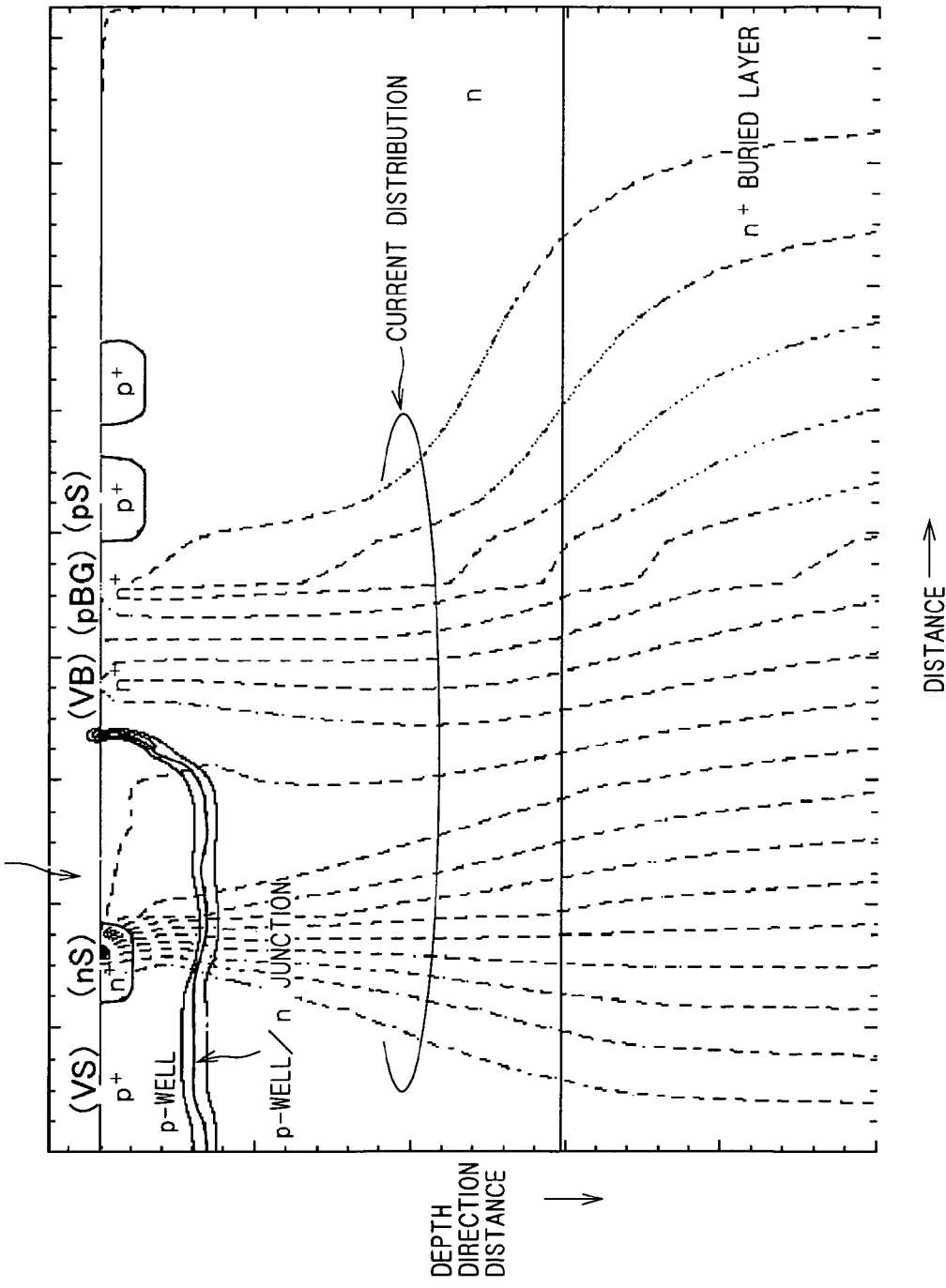
F I G . 5

F I G. 9 A
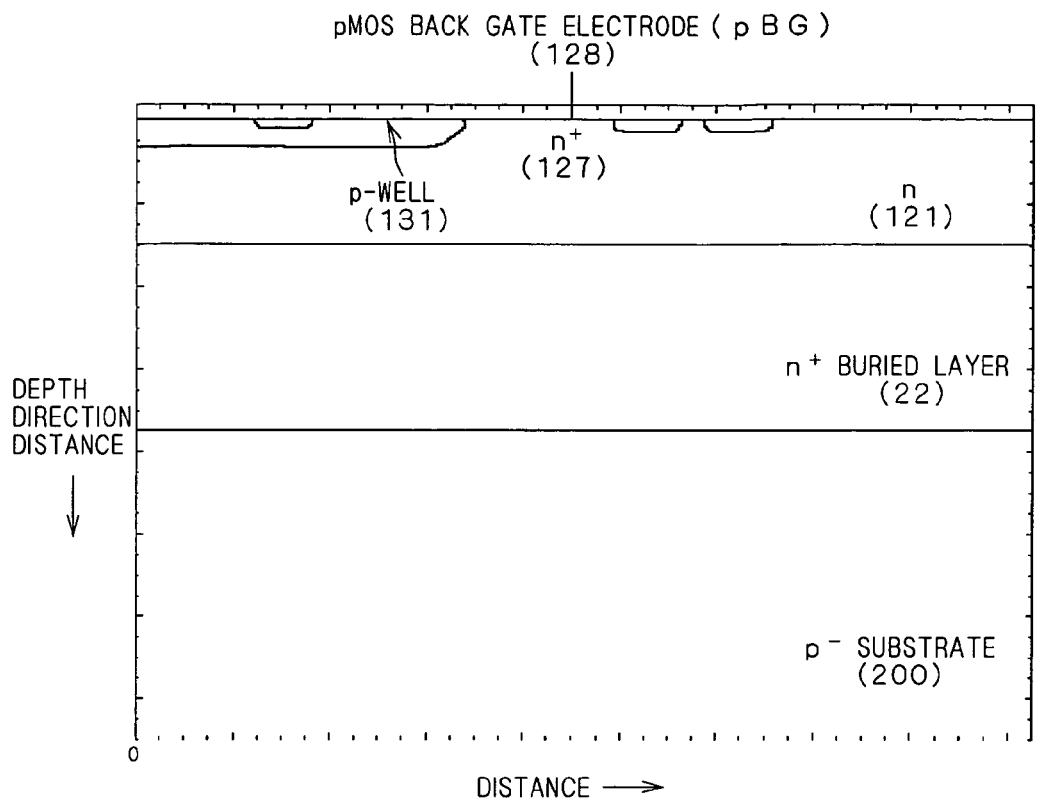
F I G. 9 B
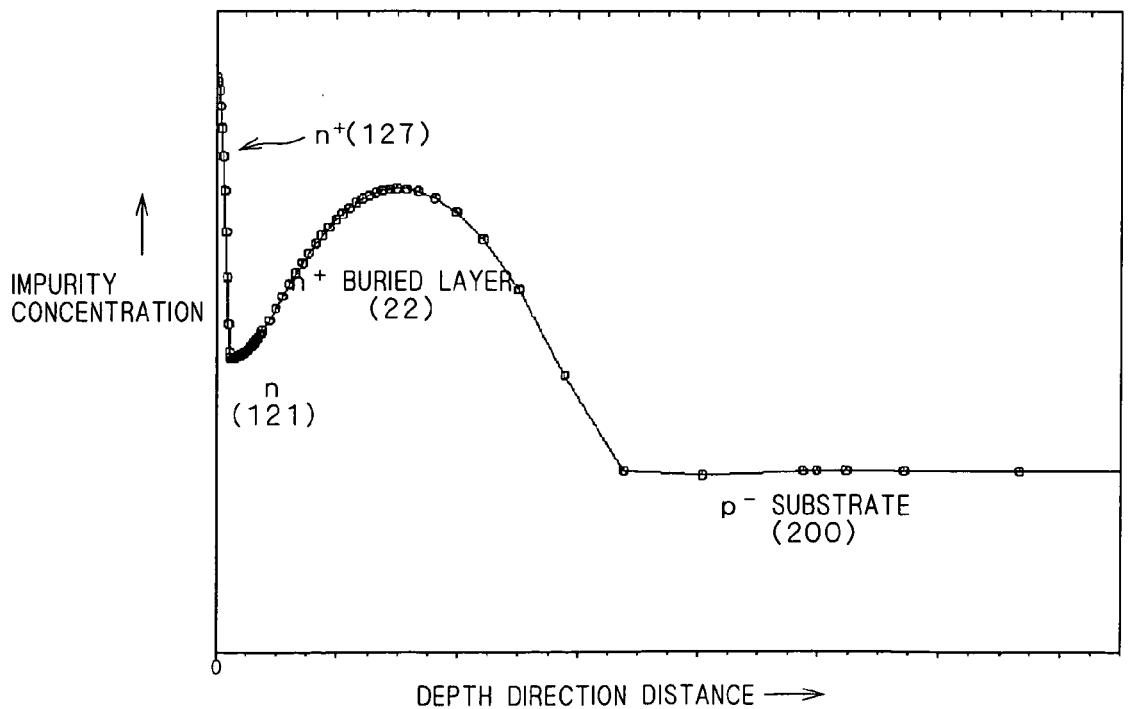

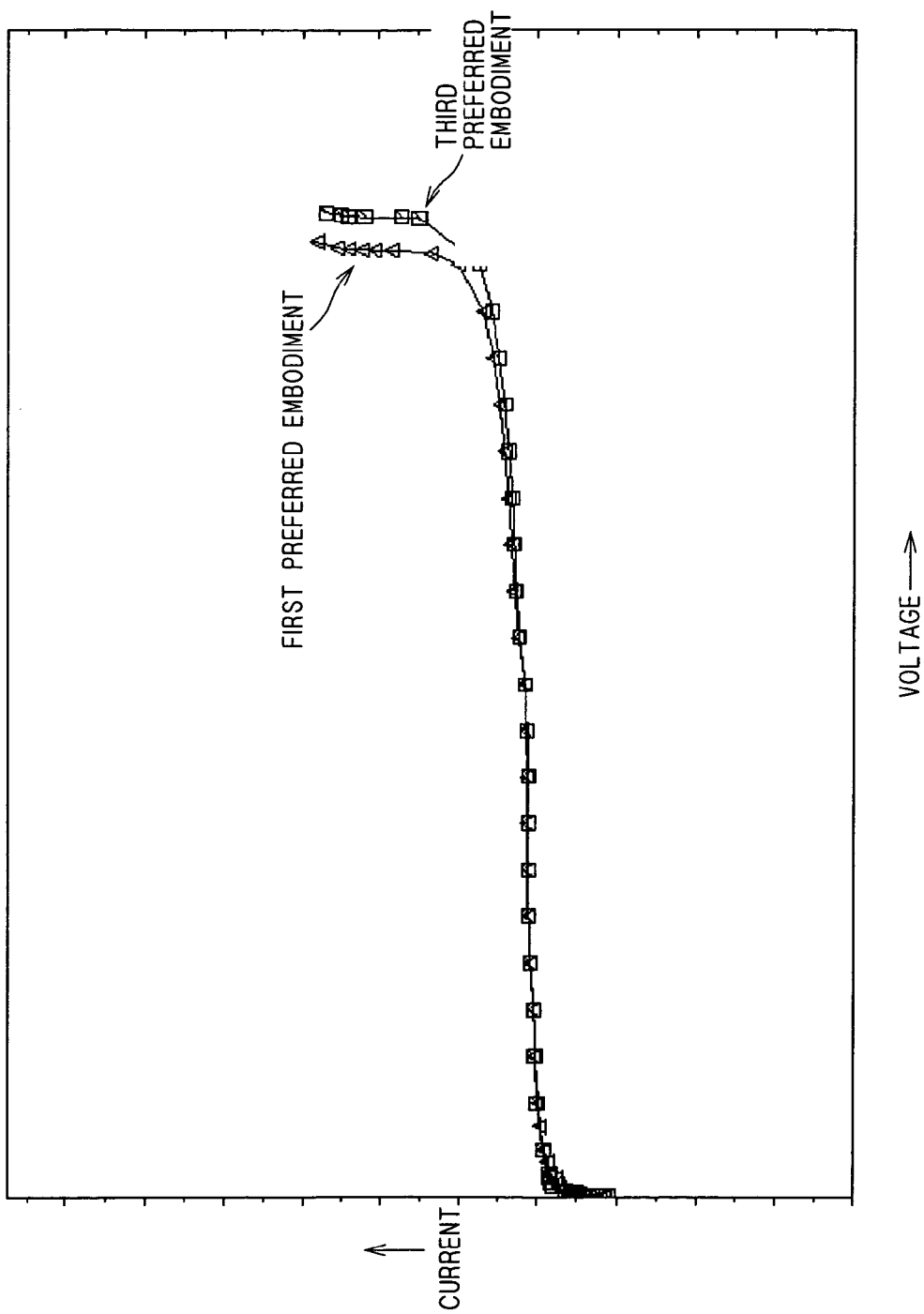

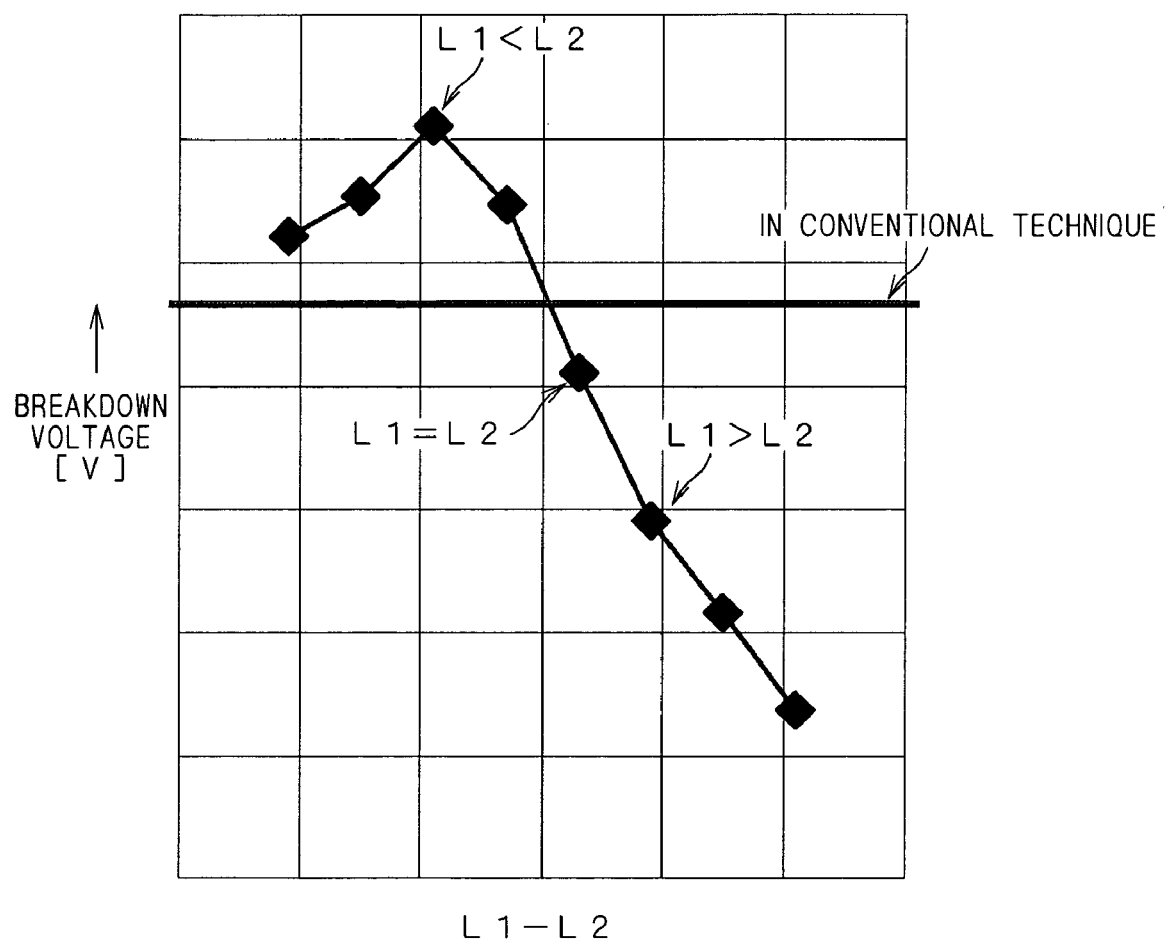

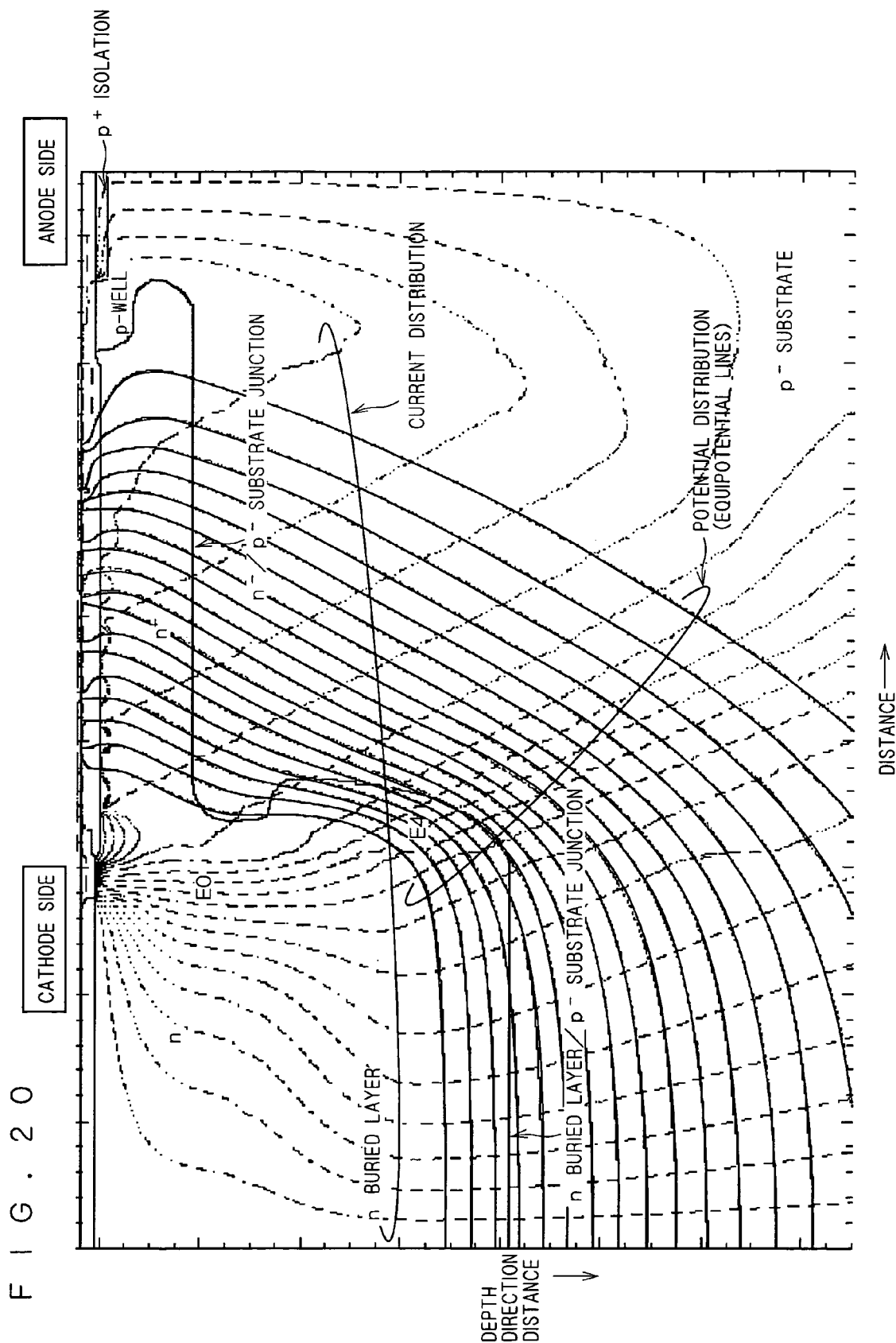

F I G. 21A
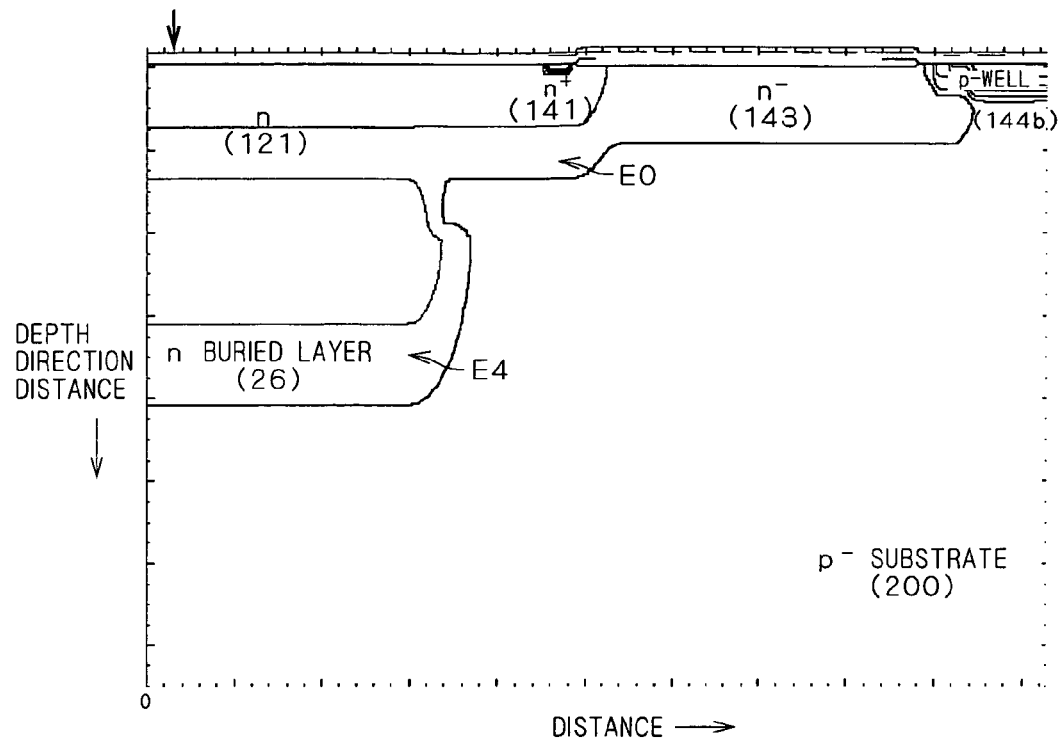
F I G. 21B
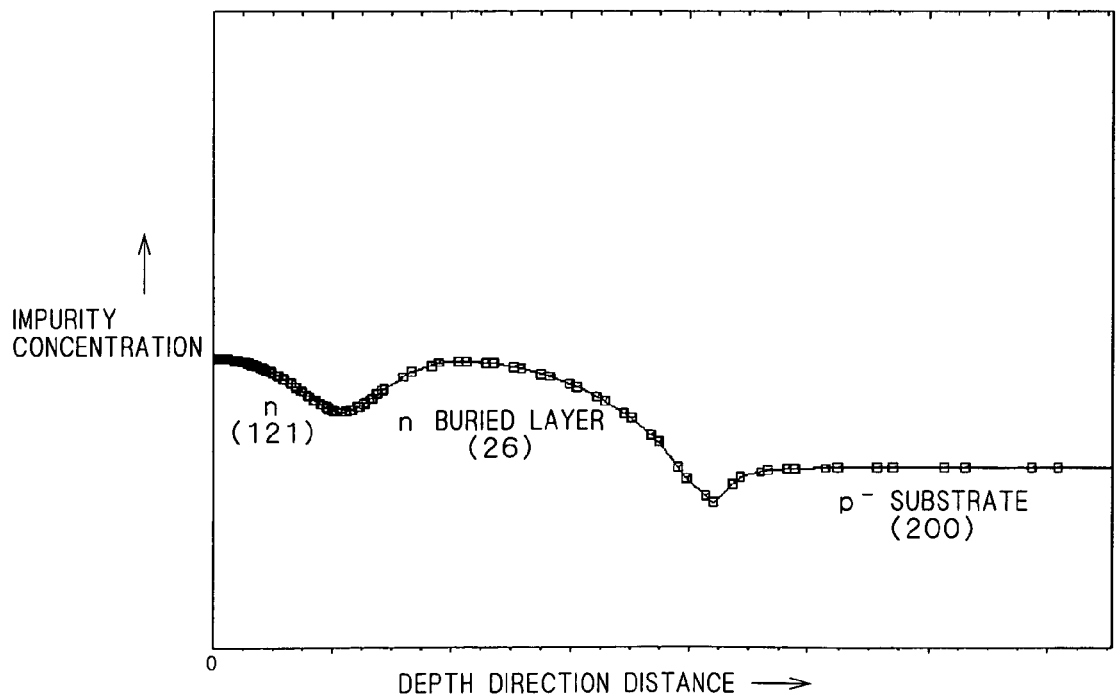

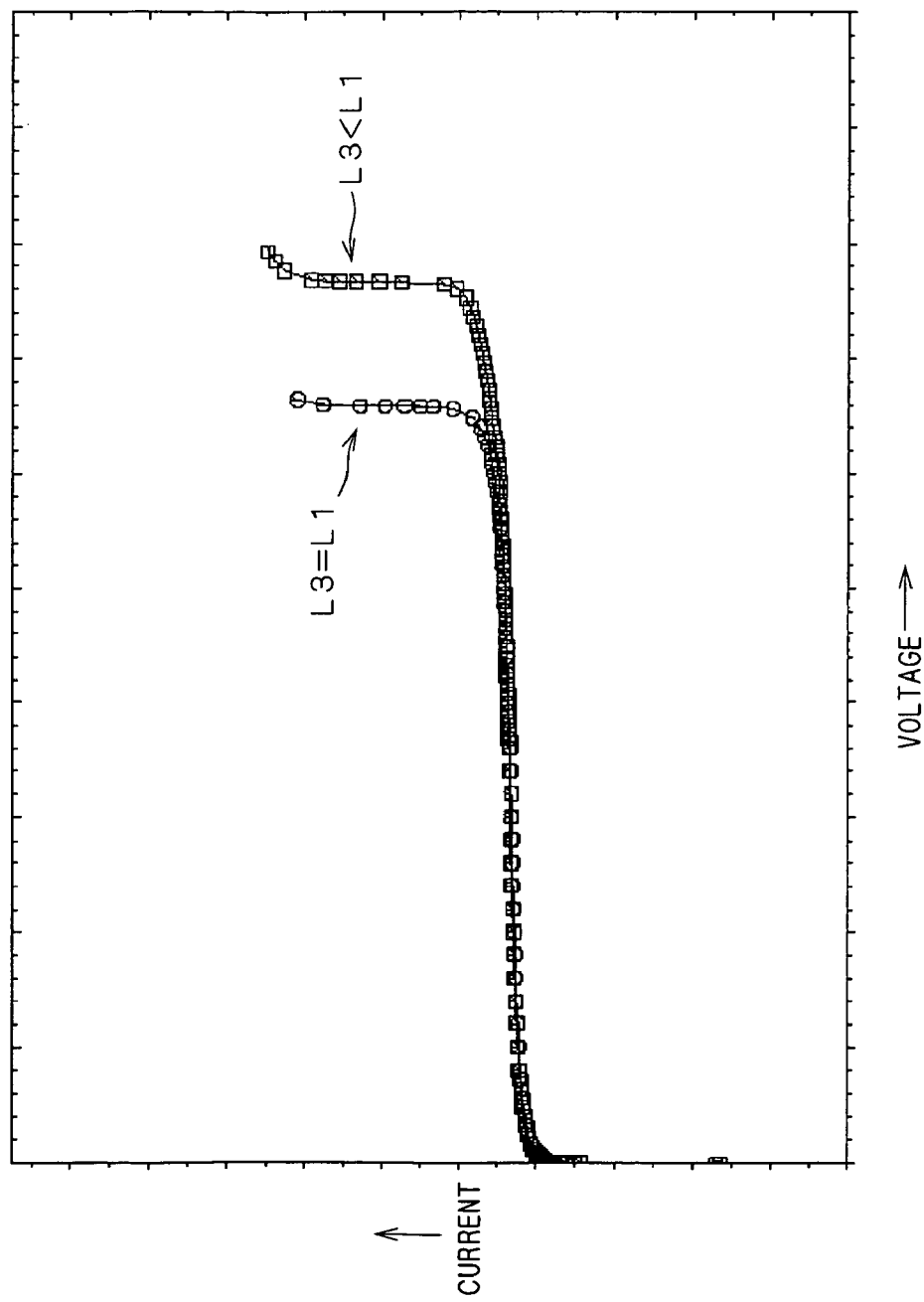

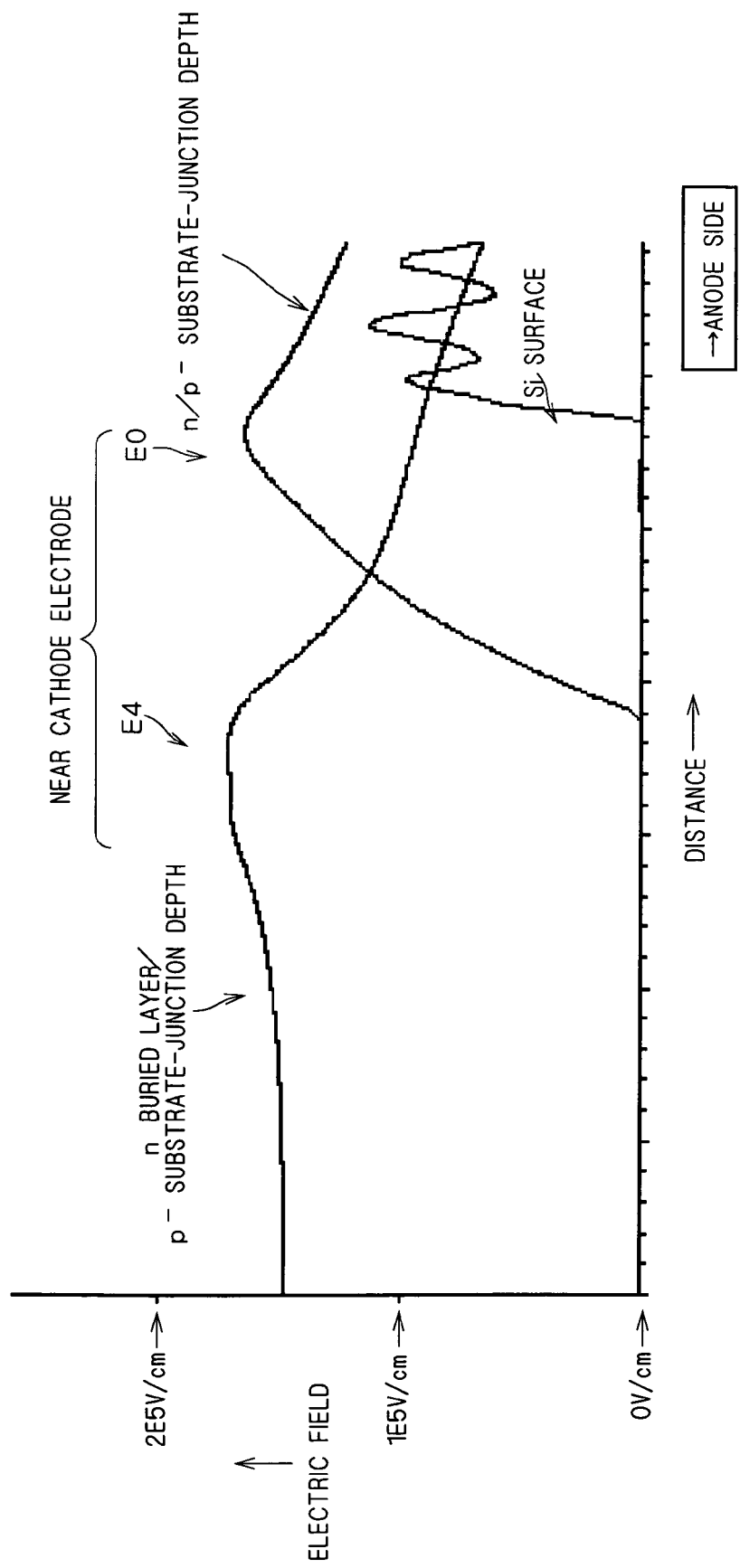

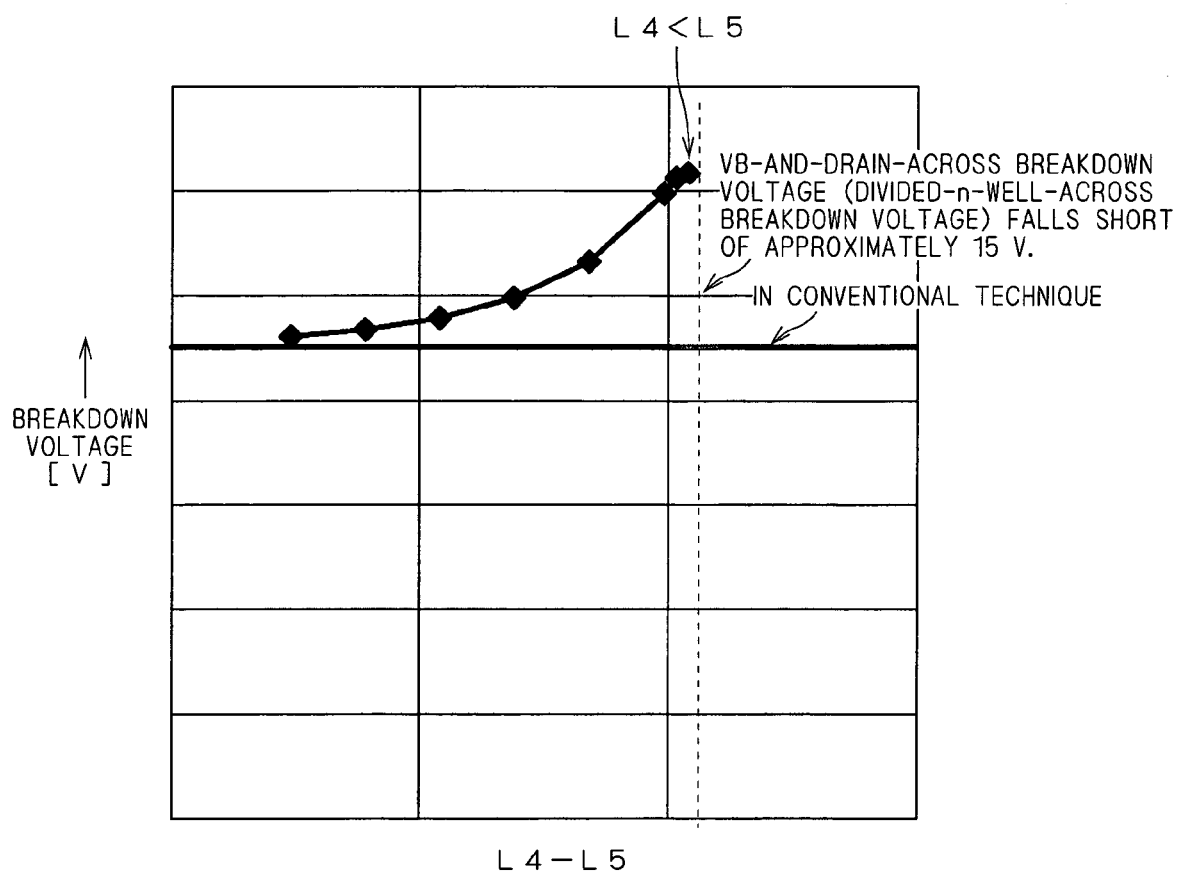

F I G . 3 5 A
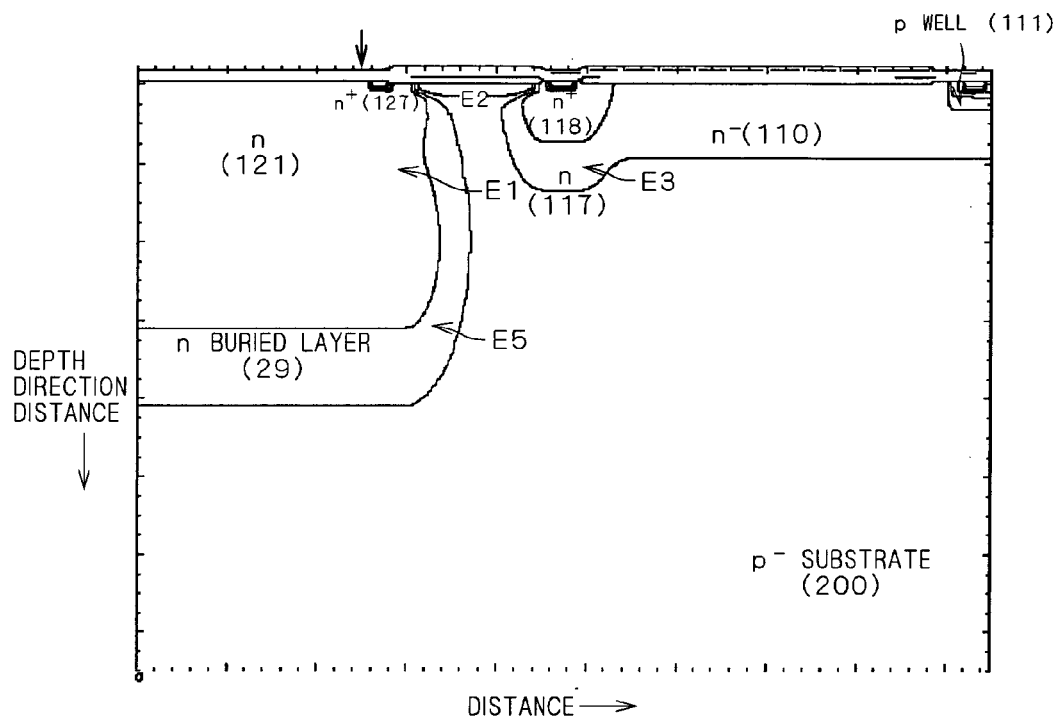
F I G . 3 5 B
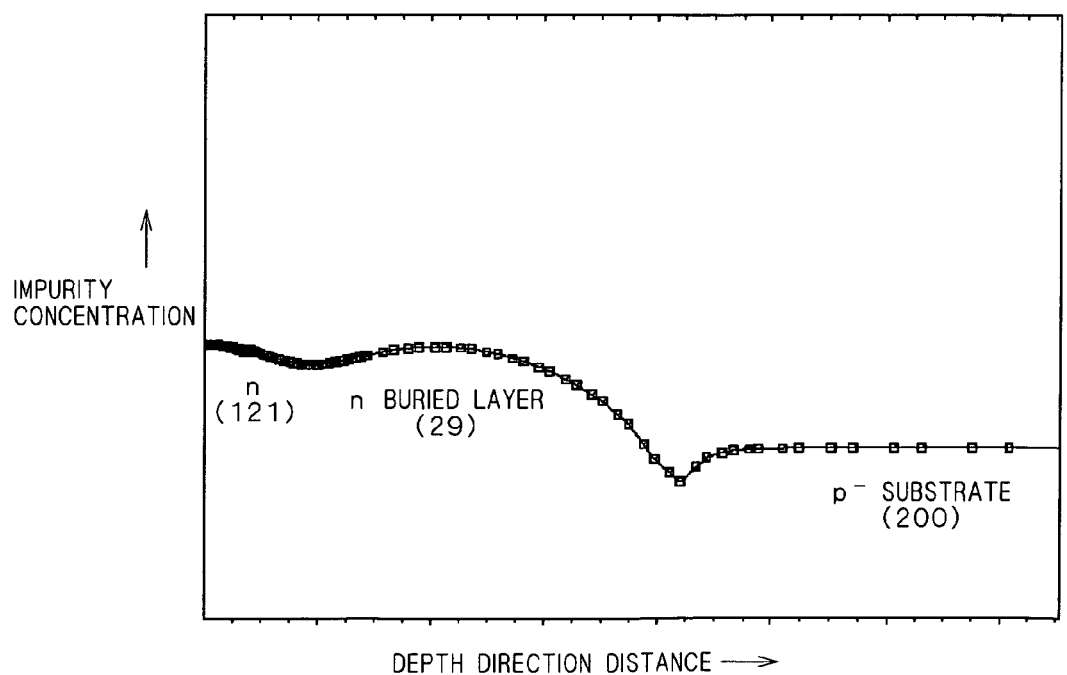

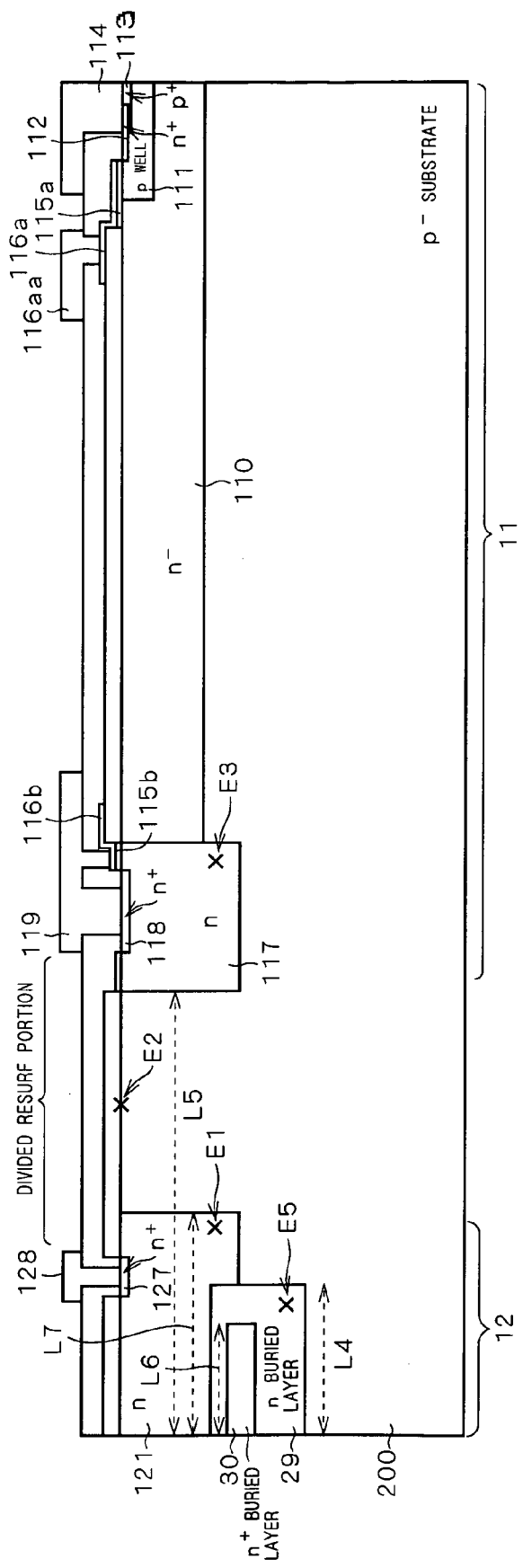
F I G . 3 8

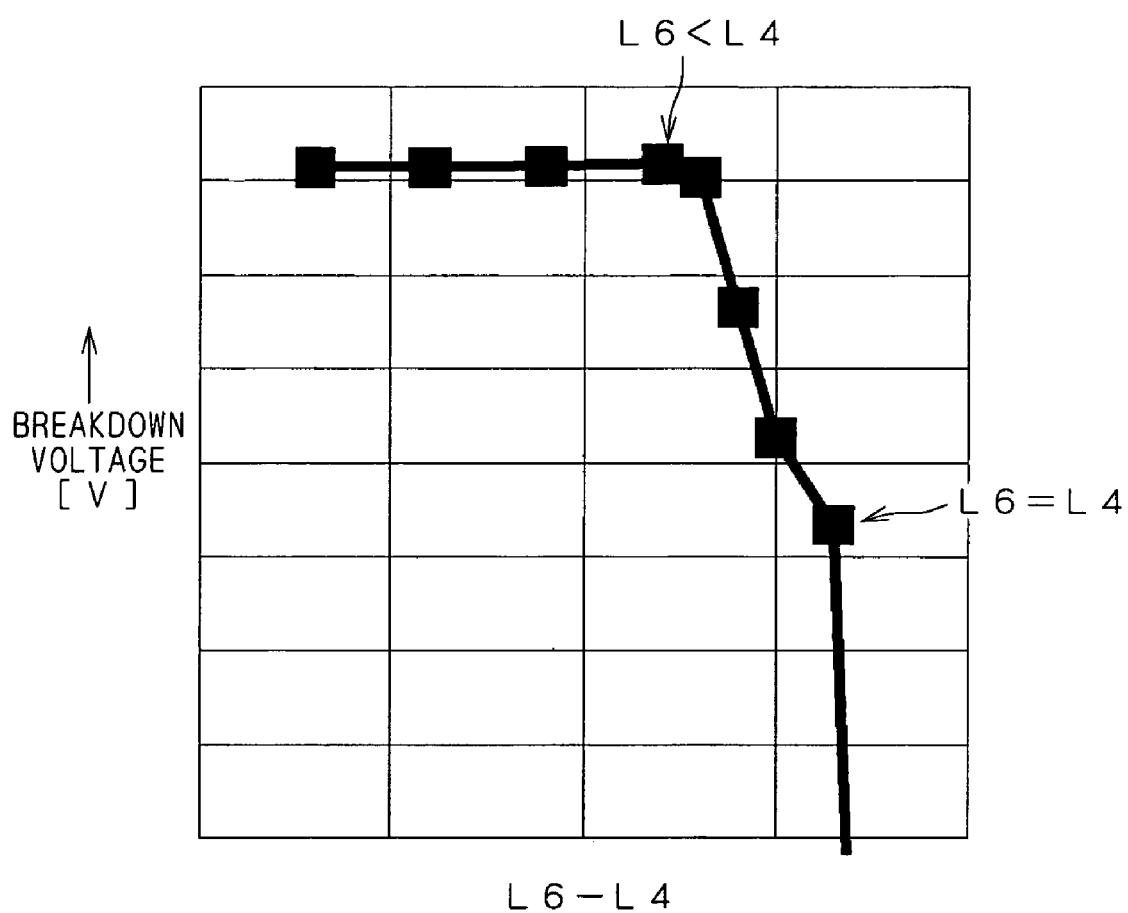

F I G . 4 0 A
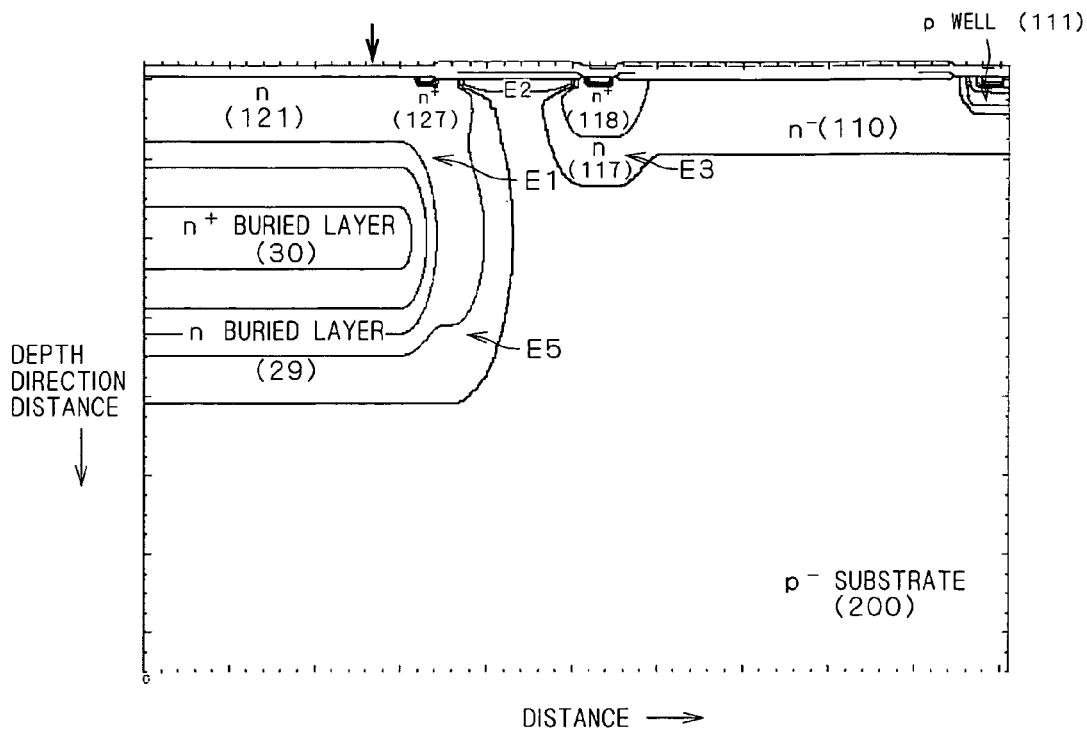
F I G . 4 0 B
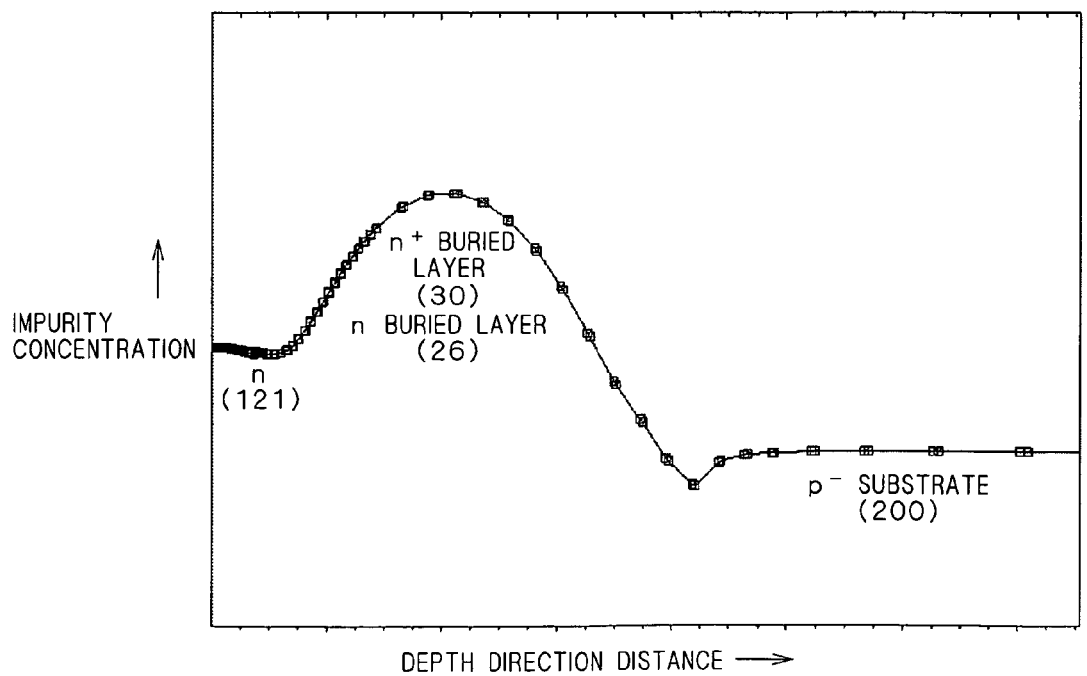

F I G . 4 4
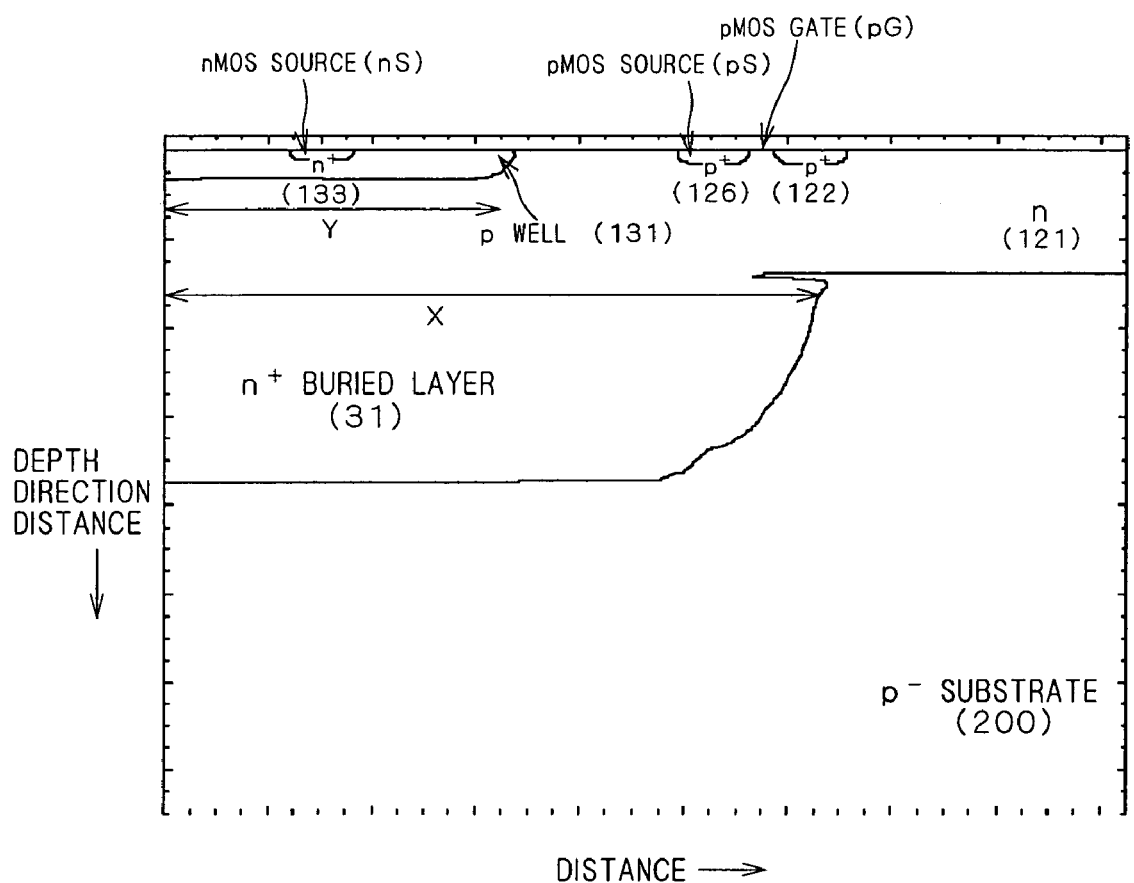

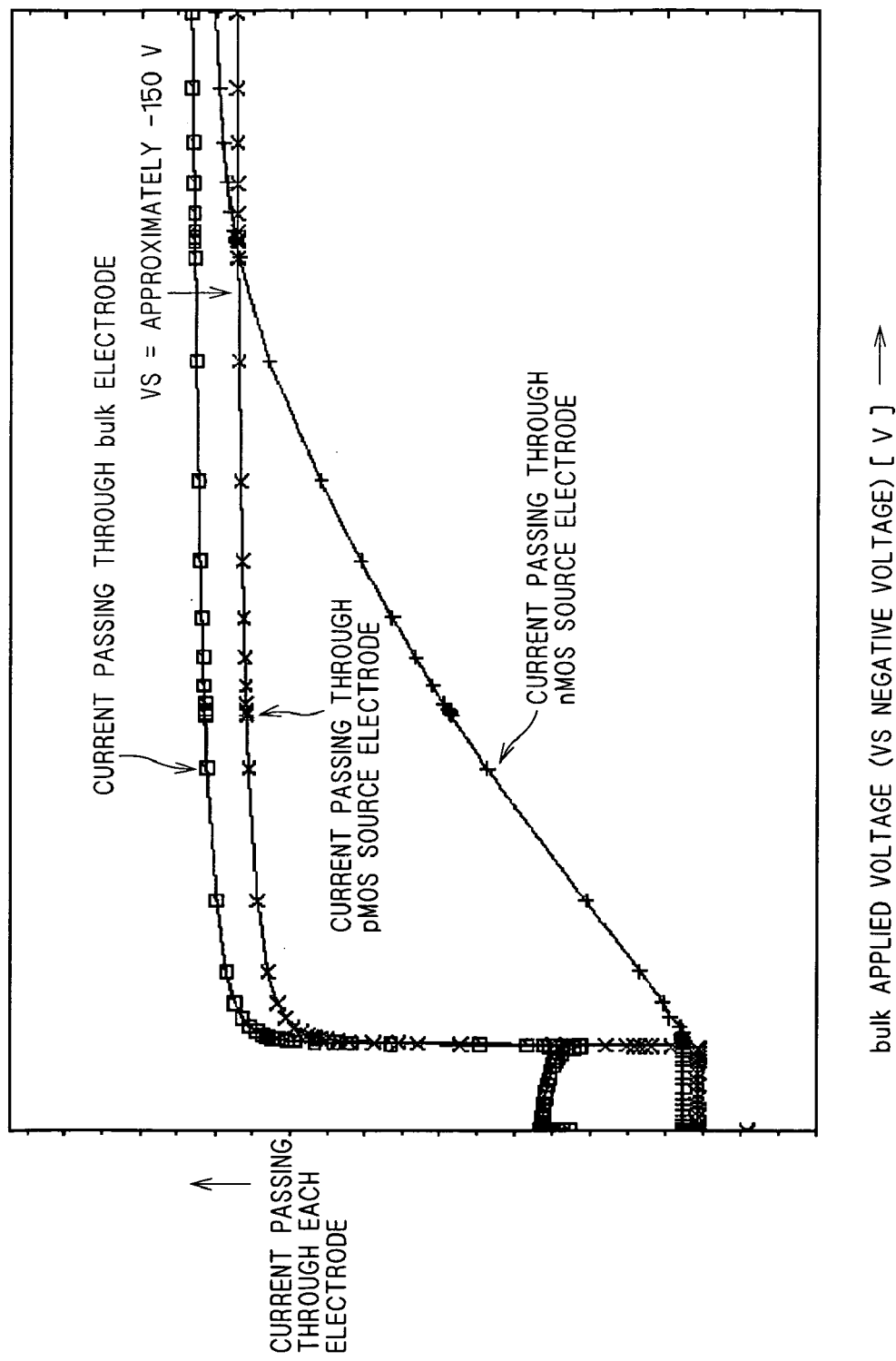
F I G . 4 6

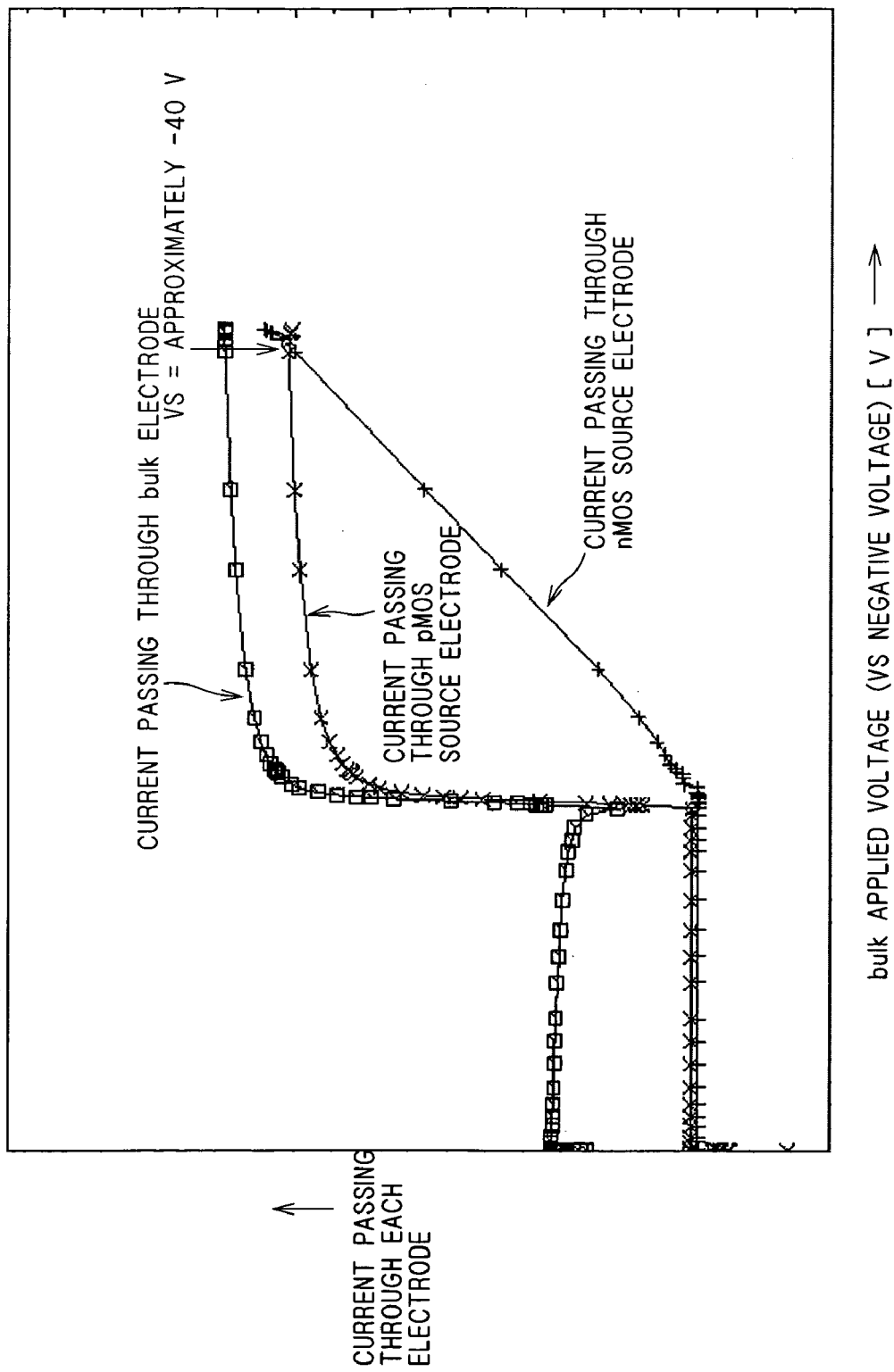

F I G . 5 3
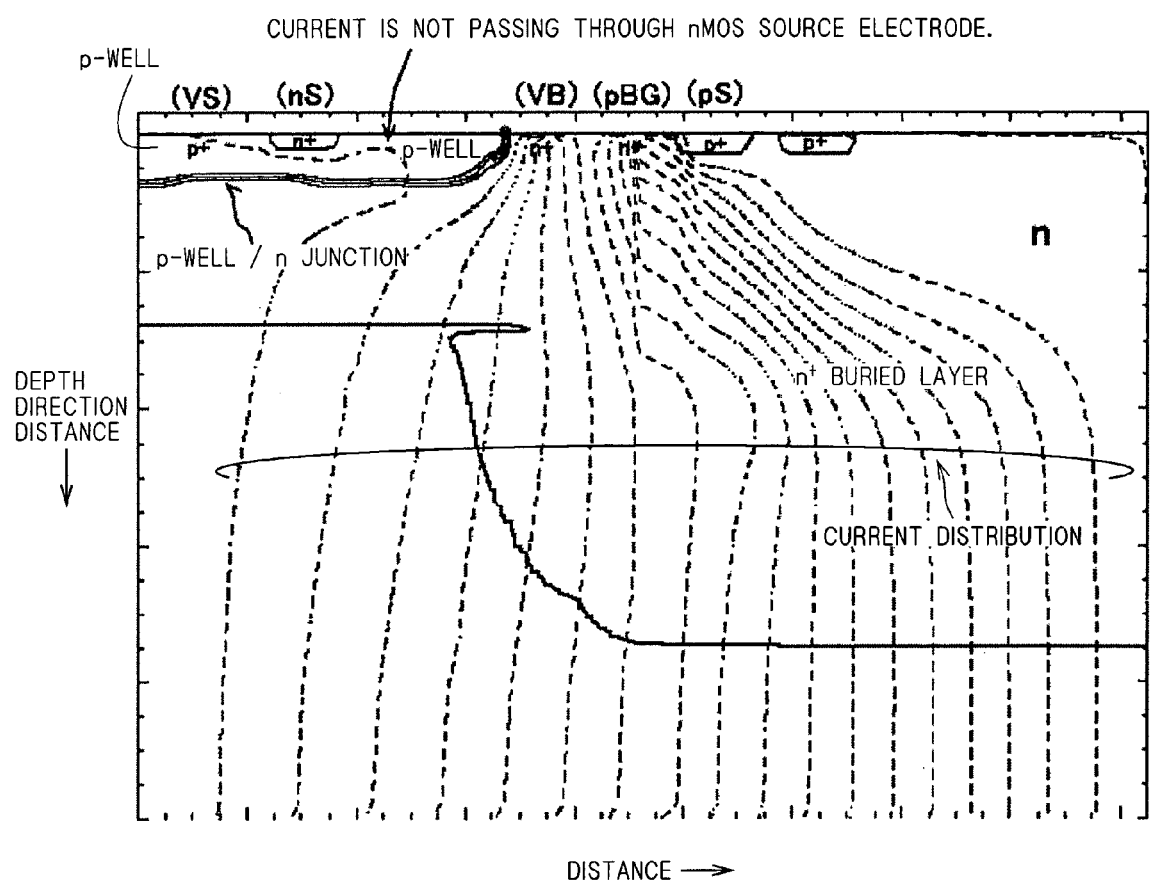

F I G . 6 1 A  PRIOR ART
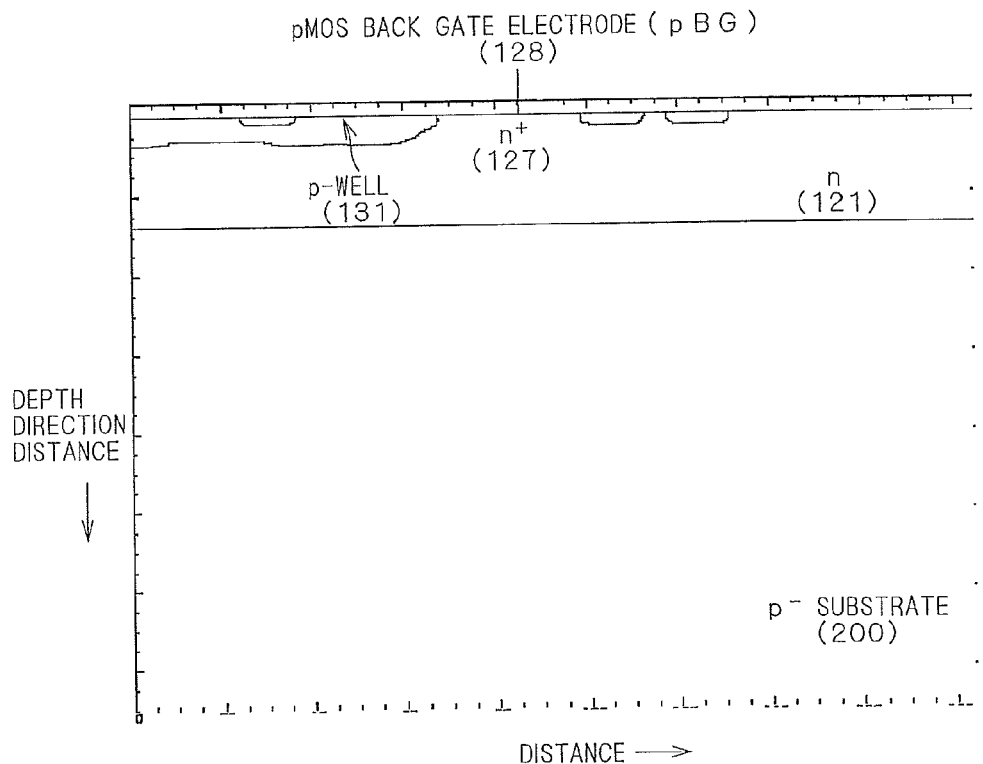
F I G . 6 1 B  PRIOR ART
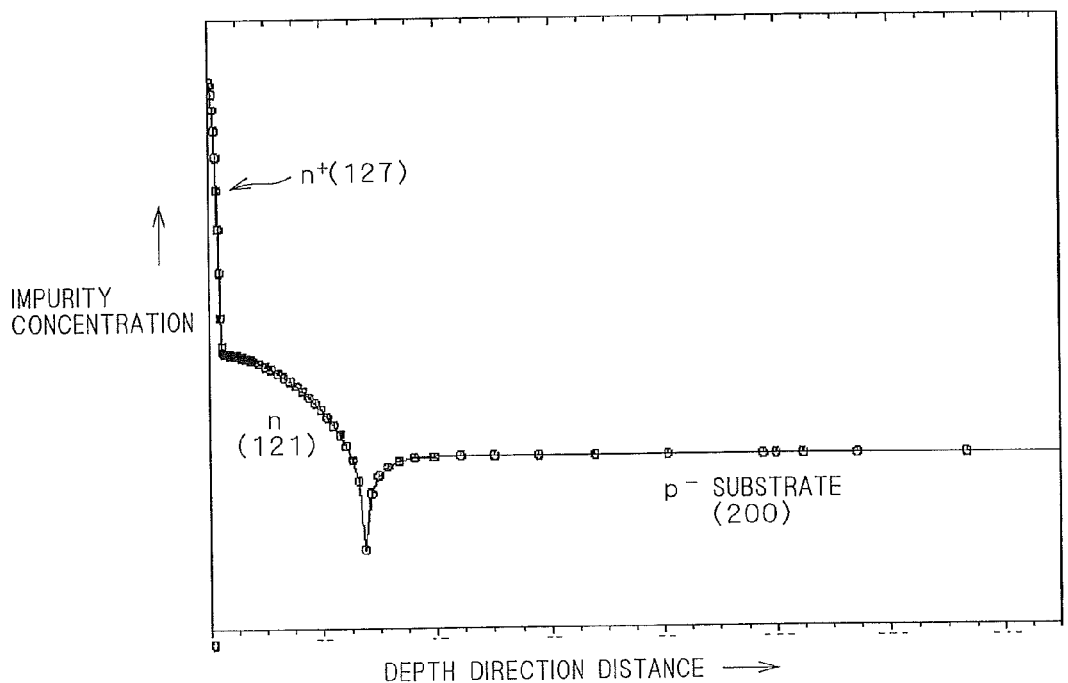

SEMICONDUCTOR DEVICE

BACKGROUND OF THE INVENTION

1. Field of the Invention

This invention relates to semiconductor devices, and especially to a power device-driving device driving a power device such as an inverter.

2. Description of the Background Art

FIG. 55 is a block diagram schematically showing a configuration of a power device and a power device-driving device. FIG. 56 is a circuit diagram of a configuration of a principal part in a high-voltage-side driving section 101 shown in FIG. 55. FIG. 57 is a top view schematically showing the layout of the high-voltage-side driving section 101.

FIGS. 58 and 59 are cross-sectional views of a conventional structure of the high-voltage-side driving section 101, taken along the lines B-B and A-A in FIG. 57, respectively.

A technique for a high breakdown voltage IC including a bootstrap diode is disclosed, for instance, in Japanese Patent Application Laid-Open No. 2002-324848. A technique for a high breakdown voltage semiconductor device with improved latchup resistance is disclosed, for instance, in Japanese Patent Application Laid-Open No. 11-214530 (1999). A technique for a high breakdown voltage semiconductor device that employs RESURF structure is disclosed, for instance, in U.S. Pat. No. 4,292,642. A technique for a high breakdown voltage semiconductor device that employs divided RESURF structure is disclosed, for instance, in Japanese Patent Application Laid-Open No. 9-283716 (1997). A technique for a CMOS semiconductor device that reduces the occurrence of latchups resulting from a parasitic thyristor is disclosed, for instance, in Japanese Patent Application Laid-Open No. 5-152523 (1993).

In the power device and the power device-driving device shown in FIG. 55, a high-voltage-side floating offset voltage VS may fluctuate to a negative potential lower than a common ground COM during a regenerative period (namely, while a freewheel diode D2 is ON by back electromotive voltage from a load connected to a node N30). The negative fluctuations of the high-voltage-side floating offset voltage VS are transferred to a high-voltage-side floating supply absolute voltage VB via a capacitor C1, causing negative fluctuations in potential of the high-voltage-side floating supply absolute voltage VB as well.

The negative fluctuations of the high-voltage-side floating supply absolute voltage VB are transferred to n-type impurity regions 117 and 121, and n⁻-type impurity regions 110 and 143 in FIGS. 58 and 59. Consequently, with reference to FIG. 58, a parasitic diode PD1 between a p-type well (hereafter called "p-well") 111 and the n⁻-type impurity region 110, a parasitic diode PD2 between a p⁻-type silicon substrate (hereafter called "p⁻ substrate") 200 and the n-type impurity region 117, and a parasitic diode PD3 between the p⁻ substrate 200 and the n-type impurity region 121, all of which are reverse-biased under normal conditions, get turned on. In addition, with reference to FIG. 59, a parasitic diode PD4 between a p⁺-type isolation region (hereafter called "p⁺ isolation") 144 and the n⁻-type impurity region 143, a parasitic diode PD5 between the p⁻ substrate 200 and the n-type impurity region 143, and a parasitic diode PD6 between the p⁻ substrate 200 and the n-type impurity region 121, all of which are reverse-biased under normal conditions, get turned on.

With reference to FIG. 59, the turn-on of the parasitic diodes PD4 to PD6 causes current to pass into the n-type impurity region 121. A CMOS 12 for outputting a high-voltage-side driving signal has a parasitic bipolar transistor PB (see FIG. 60) resulting from an n-p-n structure composed of the n-type impurity region 121, a p-well 131, and an n⁺-type source region 133, a parasitic thyristor PS1 resulting from a p-n-p-n structure composed of a p⁺-type source region 126, the n-type impurity region 121, the p-well 131, and the n⁺-type source region 133, and a parasitic thyristor PS2 resulting from a p-n-p-n structure composed of the p⁻ substrate 200, the n-type impurity region 121, the p-well 131, and the n⁺-type source region 133. Accordingly, the current that passes into the n-type impurity region 121 resulting from the turn-on of the parasitic diodes PD4 to PD6 acts as a trigger current that causes the parasitic bipolar transistor PB to operate, or causes latchups in the parasitic thyristors PS1 and PS2. The operation of the parasitic bipolar transistor PB or latch-ups in the parasitic thyristors PS1 and PS2 causes an excessive current to pass through the CMOS 12, resulting in damage to circuits and components (hereafter called "latchup breakdown") under certain circumstances.

FIG. 60 is a cross-sectional view of a simplified structure of the CMOS part, which was prepared to analyze the state of operations of the parasitic bipolar transistor PB and the parasitic thyristor PS2 resulting from the turn-on of the parasitic diode PD6. For convenience' sake, the positional relationship of an nMOSFET and a pMOSFET in FIG. 59 is reversed in FIG. 60. A VS electrode and an NMOS source electrode (nS) in FIG. 60 both correspond to an electrode 134 in FIG. 59, while a VB electrode, a pMOS back gate electrode (pBG), and a pMOS source electrode (pS) in FIG. 60 all correspond to an electrode 128 in FIG. 59. FIG. 61A shows a simplified FIG. 60 structure, and FIG. 61B shows an impurity concentration profile from the upper surface of an n⁺-type impurity region 127 toward a depth direction of the p⁻ substrate 200, with respect to a position where the pMOS back gate electrode is formed in FIG. 61A.

FIG. 62 is a graph showing, upon application of a voltage to a bulk electrode in FIG. 60, namely upon application of a negative voltage (hereafter called "VS negative voltage") to the VS electrode, the value of current passing through each of the bulk electrode, the pMOS source electrode, and the nMOS source electrode. It is shown that the current passing through the nMOS source electrode increases with an increase in negative application of the VS negative voltage, and becomes almost the same as the current passing through the pMOS source electrode when the VS negative voltage is approximately −40 V.

FIG. 63 shows current distribution when the VS negative voltage in FIG. 62 is −17 V. It is shown that current does not pass through the nMOS source electrode when the VS negative voltage is −17 V, not causing the parasitic thyristor PS2 is FIG. 60 to operate.

FIG. 64 shows current distribution when the VS negative voltage in FIG. 62 is −43 V. It is shown that current passes through the nMOS source electrode when the VS negative voltage is −43 V, causing the parasitic thyristor PS2 is FIG. 60 to operate.

FIG. 65 is a cross-sectional view of the conventional high breakdown voltage semiconductor device that employs RESURF structure (see U.S. Pat. No. 4,292,642 mentioned above), showing an extracted region where a high breakdown voltage MOS 11 is formed from the FIG. 58 structure. For convenience' sake, the positional relationship of a drain region 118 and a source region 112 in FIG. 58 is reversed in FIG. 65.

FIG. 66 is a graph showing electric fields upon application of a high voltage across a drain electrode 119 and a source electrode 114 by short-circuiting the source electrode 114 and an electrode 116aa connected to a gate electrode 116a, with respect to the FIG. 65 structure. FIG. 66 shows an electric field on the upper surface of the n⁻-type impurity region 110 (Si surface), and an electric field at the interface between the n⁻-type impurity region 110 and the p⁻ substrate 200 (n⁻/p⁻ substrate-junction depth).

It is shown in FIGS. 65 and 66 that electric field peaks on the Si surface are a peak P1 located in a position that corresponds to the right edge lower part of the drain electrode 119, a peak P2 located in a position that corresponds to the left edge lower part of the electrode 116aa, and a peak P3 located in a position that corresponds to the left edge lower part of the gate electrode 116a. Thus, a plurality of electric field peaks appear on the Si surface when RESURF structure is employed.

It is also shown in FIGS. 65 and 66 that an electric field peak in the n⁻/p⁻ substrate-junction depth is a peak P4 located in the right lower edge part of the n-type impurity region 117. Since the electric field value at the peak P4 is higher than the respective electric field values at the peaks P1 to P3, a position that corresponds to the peak P4 reaches most quickly a breakdown critical electric field upon application of a voltage across the drain electrode 119 and the source electrode 114. Accordingly, the breakdown voltage of semiconductor device is determined by the peak P4 in the n⁻/p⁻ substrate-junction depth when RESURF structure is employed.

FIG. 67 is a cross-sectional view showing an extracted region where a high breakdown voltage diode 14 is formed from the FIG. 59 structure. For convenience' sake, the positional relationship of an anode and a cathode in FIG. 59 is reversed in FIG. 67.

FIG. 68 is a graph showing electric fields upon application of a high voltage across an anode electrode 145 and a cathode electrode 142 with respect to the FIG. 67 structure. FIG. 68 shows an electric field on the upper surface of the n⁻-type impurity region 143 (Si surface), and an electric field at the interface between the n-type impurity region 121 and the p⁻ substrate 200 (n/p⁻ substrate-junction depth). It is shown in FIGS. 67 and 68 that an electric field peak is a peak E0 located in the right lower edge part of the n-type impurity region 121.

FIG. 69 shows potential distribution (equipotential lines) and current distribution upon application of a high voltage across the anode electrode 145 and the cathode electrode 142 with respect to the FIG. 67 structure. It is shown that the curvature of equipotential lines is great and the space between adjacent equipotential lines is narrow at a position that corresponds to the peak E0.

FIG. 70 is a cross-sectional view of the conventional high breakdown voltage semiconductor device that employs divided RESURF structure (see Japanese Patent Application Laid-Open No. 9-283716 (1997) mentioned above), showing an extracted region where the high breakdown voltage MOS 11 is formed from the FIG. 58 structure. For convenience' sake, the positional relationship of the drain region 118 and the source region 112 in FIG. 58 is reversed in FIG. 70. Divided RESURF structure is sometimes employed due to the easy fabrication thereof for a high breakdown voltage MOS of which a breakdown voltage of 600 V or higher is required.

FIG. 71 is a graph showing electric fields upon application of a high voltage across the VB electrode (which corresponds to the electrode 128 in FIG. 58) connected to the n⁺-type impurity region 127 and the source electrode 114 by short-circuiting the source electrode 114 and the electrode 116aa through the application of a voltage of approximately 15 V across the VB electrode and the drain electrode 119, with respect to the FIG. 70 structure. FIG. 71 shows an electric field on the upper surface of the p⁻substrate 200 (Si surface), and an electric field at the interface between each bottom surface of the n-type impurity regions 121 and 117, and the p substrate 200 (n/p³¹ substrate-junction depth).

It is shown in FIGS. 70 and 71 that an electric field peak on the Si surface is a peak E2 almost at the center of the p⁻ substrate 200 in a divided RESURF portion, and electric field peaks in the n/p⁻ substrate-junction depth are a peak E1 located in the right lower edge part of the n-type impurity region 121, and a peak E3 located in the right lower edge part of the n-type impurity region 117.

FIG. 72 shows potential distribution (equipotential lines) and current distribution upon application of a high voltage across the VB electrode and the source electrode 114 by short-circuiting the source electrode 114 and the electrode 116aa through the application of a voltage of approximately 15 V across the VB electrode and the drain electrode 119, with respect to the FIG. 70 structure. It is shown that the curvature of equipotential lines is great and the space between adjacent equipotential lines is narrow at positions that correspond to the peaks E1 to E3.

SUMMARY OF THE INVENTION

It is a first object of this invention to provide a semiconductor device with high resistance to latchup breakdown resulting from negative fluctuations of the high-voltage-side floating offset voltage VS.

It is a second object of this invention to increase breakdown voltage of a semiconductor device by relieving the electric fields at the peaks E0 to E3 mentioned above.

In a first aspect of this invention, a semiconductor device for driving a switching device that includes a first electrode, a second electrode, and a control electrode includes: a first terminal; a second terminal; a semiconductor substrate of a first conductivity type; a first impurity region of a second conductivity type; a second impurity region of the first conductivity type; a first transistor; a second transistor; and a third impurity region of the second conductivity type. The first terminal is connected to the first electrode. The second terminal is connected to the first electrode via a capacitive element. The first impurity region is formed in a main surface of the semiconductor substrate. The second impurity region is formed in a main surface of the first impurity region. The first transistor includes a source/drain region of the second conductivity type which is formed in a main surface of the second impurity region and connected to the first terminal. The second transistor includes a source/drain region of the first conductivity type which is formed in the main surface of the first impurity region and connected to the second terminal. The third impurity region is formed in the semiconductor substrate while being in contact with a bottom surface of the first impurity region.

The latchup breakdown resistance of the semiconductor device can be increased.

In a second aspect of this invention, a semiconductor device includes: a semiconductor substrate of a first conductivity type; a first electrode; a second electrode; a first impurity region of the first conductivity type; a second impurity region of a second conductivity type; a third impurity region of the second conductivity type; and a fourth impurity region of the second conductivity type. The first and second electrodes are formed on a main surface of the semiconductor substrate. The first impurity region is formed in the main surface of the semiconductor substrate, and connected to the first electrode. The second impurity region is formed in the main surface of the semiconductor substrate, and connected to the second electrode. The third impurity region is formed in the main surface of the semiconductor substrate, and includes a portion sandwiched between a side surface of the first impurity region and a side surface of the second impurity region. The fourth impurity region is formed in contact with a bottom surface of the second impurity region while being formed in the semiconductor substrate in such a manner as not to protrude from the side surface of the second impurity region toward the first impurity region side.

The breakdown voltage of the semiconductor device can be increased.

In a third aspect of this invention, a semiconductor device includes: a semiconductor substrate of a first conductivity type; a first electrode; a second electrode; a first impurity region of a second conductivity type; a second impurity region of the second conductivity type; and a third impurity region of the second conductivity type. The first and second electrodes are formed on a main surface of the semiconductor substrate. The first impurity region is formed in the main surface of the semiconductor substrate, and connected to the first electrode. The second impurity region is formed in the main surface of the semiconductor substrate while being apart from the first impurity region, being connected to the second electrode, and having a side surface opposed to a side surface of the first impurity region. The third impurity region is formed in the semiconductor substrate while being in contact with a bottom surface of the second impurity region in the semiconductor substrate, and having a side surface not in contact with the side surface of the first impurity region.

The breakdown voltage of the semiconductor device can be increased.

In a fourth aspect of this invention, a semiconductor device for driving a switching device that includes a first electrode, a second electrode, and a control electrode includes: a first terminal; a second terminal; a first impurity region of a first conductivity type; a second impurity region of a second conductivity type; a first transistor; a second transistor; and a third impurity region of the first conductivity type. The first terminal is connected to the first electrode. The second terminal is connected to the first electrode via a capacitive element. The second impurity region is formed in a main surface of the first impurity region. The first transistor includes a source/drain region of the first conductivity type which is formed in a main surface of the second impurity region and connected to the first terminal. The second transistor includes a source/drain region of the second conductivity type which is formed in the main surface of the first impurity region and connected to the second terminal. The third impurity region is formed in contact with a bottom surface of the first impurity region.

The latchup breakdown resistance of the semiconductor device can be increased.

In a fifth aspect of this invention, a semiconductor device for driving a switching device that includes a first electrode, a second electrode, and a control electrode includes: a first terminal; a second terminal; a semiconductor substrate of a first conductivity type; a first impurity region of a second conductivity type; a second impurity region of the first conductivity type; a first transistor; a second transistor; and a third impurity region of the second conductivity type. The first terminal is connected to the first electrode. The second terminal is connected to the first electrode via a capacitive element. The first impurity region is formed in a main surface of the semiconductor substrate. The second impurity region is formed in a main surface of the first impurity region. The first transistor includes a source/drain region of the second conductivity type which is formed in a main surface of the second impurity region and connected to the first terminal. The second transistor includes a source/drain region of the first conductivity type which is formed in the main surface of the first impurity region and connected to the second terminal. The third impurity region is formed in the semiconductor substrate, and includes at least a region below the source/drain region of the first transistor while being in contact with a bottom surface of the first impurity region, and having a first impurity concentration higher than a second impurity concentration of the first impurity region.

The latchup breakdown resistance of the semiconductor device can be increased.

These and other objects, features, aspects and advantages of this invention will become more apparent from the following detailed description of this invention when taken in conjunction with the accompanying drawings.

BRIEF DESCRIPTION OF THE DRAWINGS

FIGS. 2A and 2B show the structure of a CMOS part and an impurity concentration profile in the semiconductor device according to the first preferred embodiment;

FIG. 3 is a graph showing the values of currents passing through electrodes upon application of a VS negative voltage in the semiconductor device according to the first preferred embodiment;

FIG. 5 shows current distribution when the VS negative voltage is −109 V in the semiconductor device according to the first preferred embodiment;

FIGS. 9A and 9B show the structure of a CMOS part and an impurity concentration profile in the semiconductor device according to the second preferred embodiment;

FIG. 15 is a graph showing comparison results of a junction breakdown voltage of the semiconductor device according to the third preferred embodiment, and a junction breakdown voltage of the semiconductor device according to the first preferred embodiment;

FIG. 17 is a graph showing the correlation between the width of an n-buried layer and the breakdown voltage in the semiconductor device according to the fourth preferred embodiment;

FIG. 20 shows potential distribution and current distribution upon application of a high voltage across the anode and the cathode in the semiconductor device according to the fourth preferred embodiment;

FIGS. 21A and 21B show the structure of the high breakdown voltage diode part and an impurity concentration profile in the semiconductor device according to the fourth preferred embodiment;

FIG. 26 is a graph showing breakdown voltage waveforms in the semiconductor device according to the fifth preferred embodiment;

FIG. 28 is a graph showing electric fields upon application of a high voltage across an anode and a cathode in the semiconductor device according to the fifth preferred embodiment;

FIG. 34 is a graph showing the correlation between the width of an n-buried layer and the breakdown voltage in the semiconductor device according to the sixth preferred embodiment;

FIGS. 35A and 35B show the structure of the high breakdown voltage MOS part and an impurity concentration profile in the semiconductor device according to the sixth preferred embodiment;

FIG. 38 is a cross-sectional view of the structure of a high breakdown voltage MOS part in a semiconductor device according to a seventh preferred embodiment of this invention;

FIG. 39 is a graph showing the correlation between the width of an $n^+$-buried layer and the breakdown voltage in the semiconductor device according to the seventh preferred embodiment;

FIGS. 40A and 40B show the structure of the high breakdown voltage MOS part and an impurity concentration profile in the semiconductor device according to the seventh preferred embodiment;

FIG. 44 is a cross-sectional view of the structure of a CMOS part in a semiconductor device according to a ninth preferred embodiment of this invention;

FIG. 46 is a graph showing the values of currents passing through electrodes upon application of the VS negative voltage in the semiconductor device according to the ninth preferred embodiment;

FIG. 52 is a graph showing the values of currents passing through the electrodes upon application of the VS negative voltage in the semiconductor device according to the ninth preferred embodiment;

FIG. 53 shows current distribution when the VS negative voltage is −17 V in the semiconductor device according to the ninth preferred embodiment;

FIGS. 61A and 61B show the structure of the CMOS part and an impurity concentration profile in the conventional semiconductor device;

DESCRIPTION OF THE PREFERRED EMBODIMENTS

Figure 55:
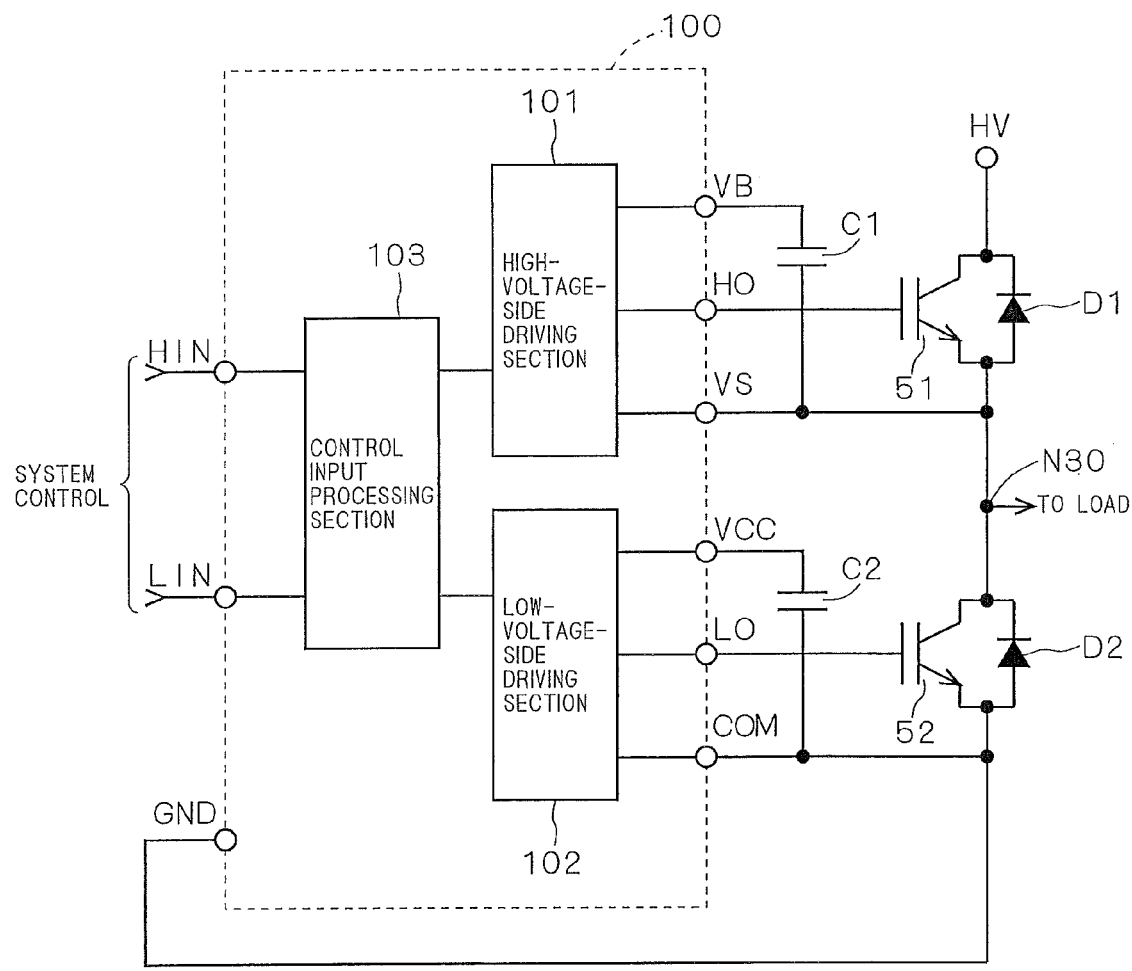
FIG. 55 is a block diagram schematically showing a configuration of a power device and a power device-driving device.
Figure 56:
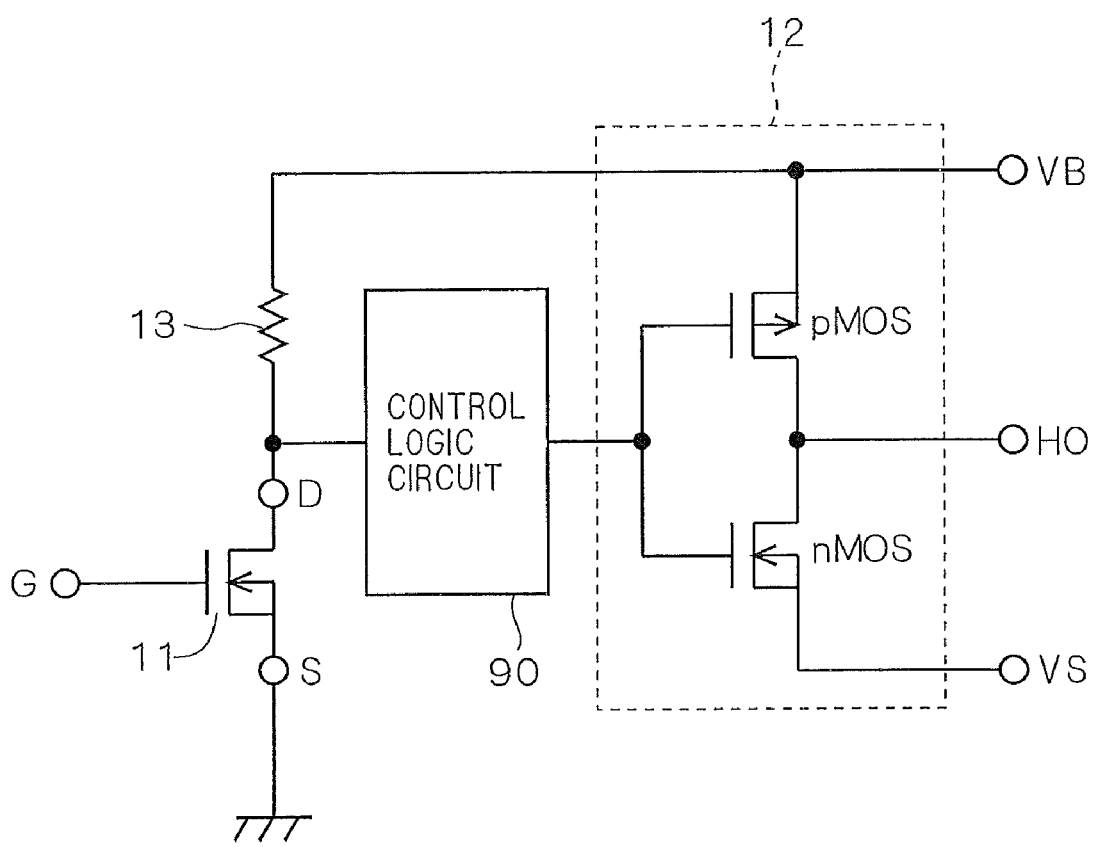
FIG. 56 is a circuit diagram of a configuration of a principal part in a high-voltage-side driving section.
Figure 57:
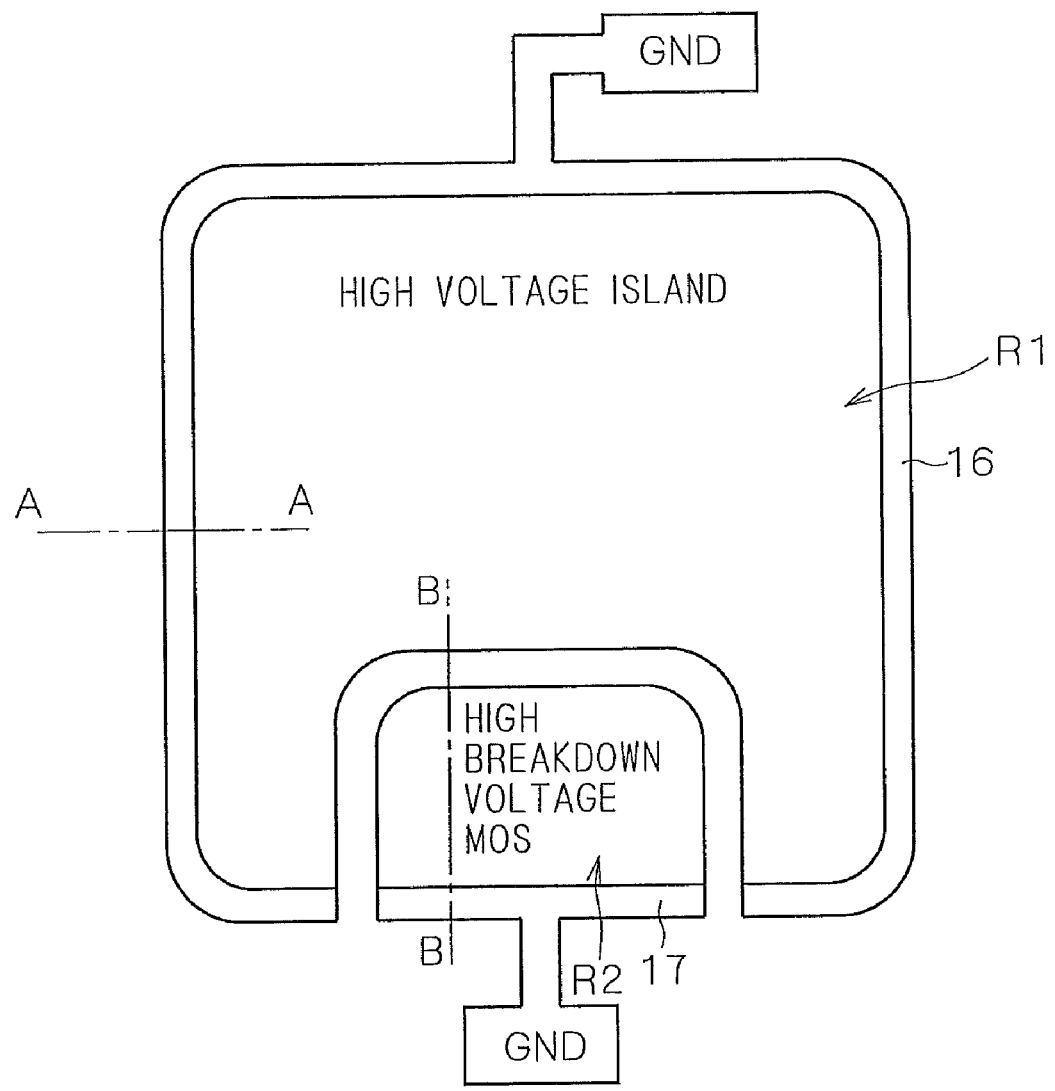
FIG. 57 is a top view schematically showing the layout of the high-voltage-side driving section.

A schematic configuration of a power device and a power device-driving device according to this invention is the same as shown in FIG. 55. A configuration of a principal part in the high-voltage-side driving section 101 according to this invention is the same as shown in FIG. 56. The schematic layout of the high-voltage-side driving section 101 according to this invention is the same as shown in FIG. 57.

With reference to FIG. 55, N-channel insulated gate bipolar transistors (hereafter called "IGBT") 51 and 52 which are power switching devices perform switching of a high voltage HV which is a main power supply. A load is connected to the node N30. Freewheel diodes D1 and D2 protect the IGBTs 51 and 52 against back electromotive voltage from the load connected to the node N30.

A power device-driving device 100 drives the IGBTs 51 and 52, and operates in accordance with a high-voltage-side control input HIN controlling the IGBT 51 and a low-voltage-side control input LIN controlling the IGBT 52. The power device-driving device 100 has the high-voltage-side driving section 101 driving the IGBT 51, a low-voltage-side driving section 102 driving the IGBT 52, and a control input processing section 103.

When the IGBTs 51 and 52 simultaneously enter the ON state, for instance, an undesirable situation occurs in which flow-through current passes through the IGBTs 51 and 52 thus preventing current passage through the load. The control input processing section 103 processes the high-voltage-side driving section 101 and the low-voltage-side driving section 102 based on the control inputs HIN and LIN in order to prevent the occurrence of such situation.

The power device-driving device 100 also includes a VS terminal connected to an emitter electrode of the IGBT 51, a VB terminal connected to the emitter electrode of the IGBT 51 via a capacitor C1, an HO terminal connected to a control electrode of the IGBT 51, a COM terminal connected to an emitter electrode of the IGBT 52, a VCC terminal connected to the emitter electrode of the IGBT 52 via a capacitor C2, an LO terminal connected to a control electrode of the IGBT 52, and a GND terminal. VS is a high-voltage-side floating offset voltage which is a standard potential of the high-voltage-side driving section 101. VB is a high-voltage-side floating supply absolute voltage which is a power supply of the high-voltage-side driving section 101, and is supplied from a high-voltage-side floating power supply not shown. HO is a high-voltage-side driving signal output from the high-voltage-side driving section 101. COM is a common ground. VCC is a low-voltage-side fixed supply voltage which is a power supply of the low-voltage-side driving section 102, and is supplied from a low-voltage-side fixed supply power supply not shown. LO is a low-voltage-side driving signal output from the low-voltage-side driving section 102. GND is a ground potential.

The capacitors C1 and C2 are provided for causing power supply voltages supplied to the high-voltage-side driving section 101 and the low-voltage-side driving section 102 to follow potential fluctuations associated with the operations of the power device.

With such configuration as described above, the power device performs switching of the main power supply based on the control inputs HIN and LIN.

The high-voltage-side driving section 101, which operates in a state of potentially floating with respect to the circuit's ground potential GND, has a level shift circuit for transferring a driving signal to a high-voltage-side circuit.

With reference to FIG. 56, the high breakdown voltage MOS 11 which is a switching element functions as the level shift circuit mentioned above. The CMOS circuit (hereafter called "CMOS") 12 which is a switching element for outputting a high-voltage-side driving signal is composed of the pMOSFET and the nMOSFET, and outputs the high-voltage-side driving signal HO. A level shift resistor 13 sets a gate potential of the CMOS 12, and functions as a pull-up resistor. A control logic circuit 90 is composed of a resistor, an inverter, an interlock, and so on.

The high breakdown voltage MOS 11 performs switching of the CMOS 12 in accordance with the high-voltage-side control input HIN. The CMOS 12 performs switching of a voltage between the high-voltage-side floating supply absolute voltage VB and the high-voltage-side floating offset voltage VS to output a driving signal to the high-voltage-side driving signal output HO, thereby driving the high-voltage-side switching element (IGBT 51) of the externally connected power device.

In the description that follows, the CMOS 12 and the level shift resistor 13 are together called a "high-voltage-side driving circuit".

With reference to FIG. 57, the high-voltage-side driving circuit composed of the CMOS 12 and the level shift resistor 13 in FIG. 56 is formed in a region R1 termed a high voltage island. The high breakdown voltage MOS 11 in FIG. 56 is formed in a region R2. The regions R1 and R2 are shielded by having the respective outer edges thereof surrounded by aluminum wirings 16 and 17 connected to the ground potential GND, respectively.

Preferred embodiments for the semiconductor device according to this invention will be described in detail.

First Preferred Embodiment

Figure 1:
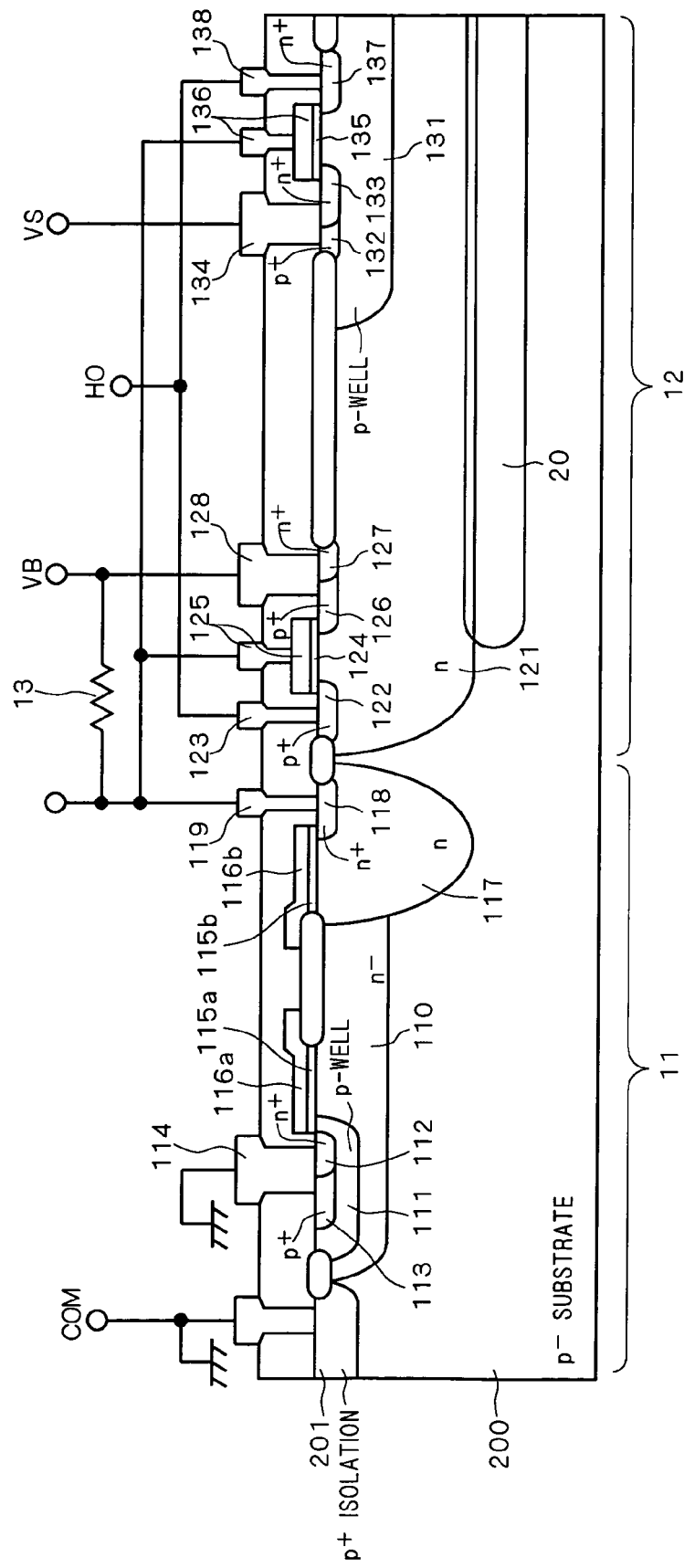
FIG. 1 is a cross-sectional view of the structure of a high-voltage-side driving section in a semiconductor device according to a first preferred embodiment of this invention.

FIG. 1 is a cross-sectional view of the structure of the high-voltage-side driving section 101 according to a first preferred embodiment of this invention, taken along the line B-B in FIG. 57. As shown, in the upper surface of the p⁻ substrate 200, a p⁺ isolation 201, the n⁻-type impurity region 110, and the n-type impurity regions 117 and 121 are formed. In the upper surface of the n-type impurity region 121, the p-well 131 is formed. The p⁺ isolation 201 reaches the p⁻ substrate 200 having the lowest potential (GND potential or COM potential) in circuit. The p-well 111 is formed under the n⁺-type source region 112 of the high breakdown voltage MOS 11 to reach the bottom of the gate electrode 116a via a gate insulating film 115a, to form a channel region of the high breakdown voltage MOS 11. In the upper surface of the p-well 111, a p⁺-type impurity region 113 and the n⁺-type source region 112 are formed in contact with the source electrode 114. In the upper surface of the n-type impurity region 117, the n⁺-type drain region 118 is formed in contact with the drain electrode 119 of the high breakdown voltage MOS 11.

The drain electrode 119 of the high breakdown voltage MOS 11 is connected to gate electrodes 125 and 136 of the pMOSFET and the nMOSFET, respectively, that form the CMOS 12, and also connected to the source electrode 128 of the pMOSFET and the VB terminal via the level shift resistor 13.

In the upper surface of the n-type impurity region 121 where the CMOS 12 is formed, a p⁺-type source region 126 and an n⁺-type impurity region 127 are formed in contact with the source electrode 128 of the pMOSFET, and a p⁺-type drain region 122 is formed in contact with a drain electrode 123. The drain electrode 123 is connected to the HO terminal. On the upper surface of the n-type impurity region 121, the gate electrode 125 of the pMOSFET is formed via a gate insulating film 124.

In the upper surface of the p-well 131 where the nMOSFET is formed, an n⁺-type drain region 137 is formed in contact with a drain electrode 138 of the nMOSFET, and an n⁺-type source region 133 and a p⁺-type impurity region 132 are formed in contact with a source electrode 134. The source electrode 134 is connected to the VS terminal, and the drain electrode 138 is connected to the HO terminal. On the upper surface of the p-well 131, the gate electrode 136 of the nMOSFET is formed via a gate insulating film 135.

In the p⁻ substrate 200, an n⁺-type impurity region (hereafter called "n⁺ buried layer") 20 having an impurity concentration higher than that of the n-type impurity region 121 is formed. The n⁺ buried layer 20 is formed in contact with the bottom surface of the n-type impurity region 121 at a greater depth than the n-type impurity region 121. By way of example, the peak value of impurity concentration of the n⁺ buried layer 20 is of the order of $10^{17}$ cm⁻³.

FIG. 2A shows a simplified structure of the CMOS part according to the first preferred embodiment, correspondingly to FIG. 61A regarding the conventional semiconductor device. For convenience' sake, the positional relationship of the nMOSFET and the pMOSFET in FIG. 1 is reversed in FIG. 2A. A pMOS back gate electrode (pBG) in FIG. 2A corresponds to the source electrode 128 in FIG. 1. FIG. 2B shows an impurity concentration profile from the upper surface of the n⁺-type impurity region 127 toward the depth direction of the p⁻ substrate 200 with respect to a position where the pMOS back gate electrode is formed in FIG. 2A. It is clear from a comparison of FIG. 2B and FIG. 61B that the n-type impurity concentration is higher in the region where the n⁺ buried layer 20 is formed in FIG. 2B than in the region where the n-type impurity region 121 is formed in FIG. 61B, and the n-type impurity is introduced at a greater depth in the p⁻ substrate 200 when the n⁺ buried layer 20 is formed.

In the semiconductor device according to the first preferred embodiment, the n⁺ buried layer 20 is formed in contact with the bottom surface of the n-type impurity region 121. Accordingly, the base resistance of a parasitic p-n-p bipolar transistor resulting from a p-n-p structure composed of the p⁻ substrate 200, the n-type impurity region 121, the n⁺ buried layer 20, and the p-well 131 is reduced lower than that in the conventional semiconductor device (see FIG. 58) in which the n⁺ buried layer 20 is not formed. Thus, the operation of the parasitic p-n-p bipolar transistor is suppressed even in the event of negative fluctuations of the high-voltage-side floating offset voltage VS during the regenerative period. This allows an increase from the conventional semiconductor device in absolute value of operation-starting voltage of a parasitic thyristor resulting from a p-n-p-n structure composed of the p⁻ substrate 200, the n-type impurity region 121, the n⁺ buried layer 20, the p-well 131, and the n⁺-type source region 133, which in turn allows an increase in latchup breakdown resistance of the CMOS 12.

This effect will be described in detail. The simplified structure of the CMOS part in the conventional semiconductor device shown in FIG. 60 in which the n⁺ buried layer 20 is additionally formed under the n-type impurity region 121 is the structure of the semiconductor device according to the first preferred embodiment. FIG. 3 is a graph showing, upon application of the VS negative voltage to the VS electrode with respect to the FIG. 60 structure in which the n⁺ buried layer 20 is additionally formed, the value of current passing through each of the bulk electrode, the pMOS source electrode, and the nMOS source electrode. It is shown in FIG. 3 that the current passing through the NMOS source electrode becomes almost the same as the current passing through the pMOS source electrode when the VS negative voltage is approximately −80 V.

Figure 4:
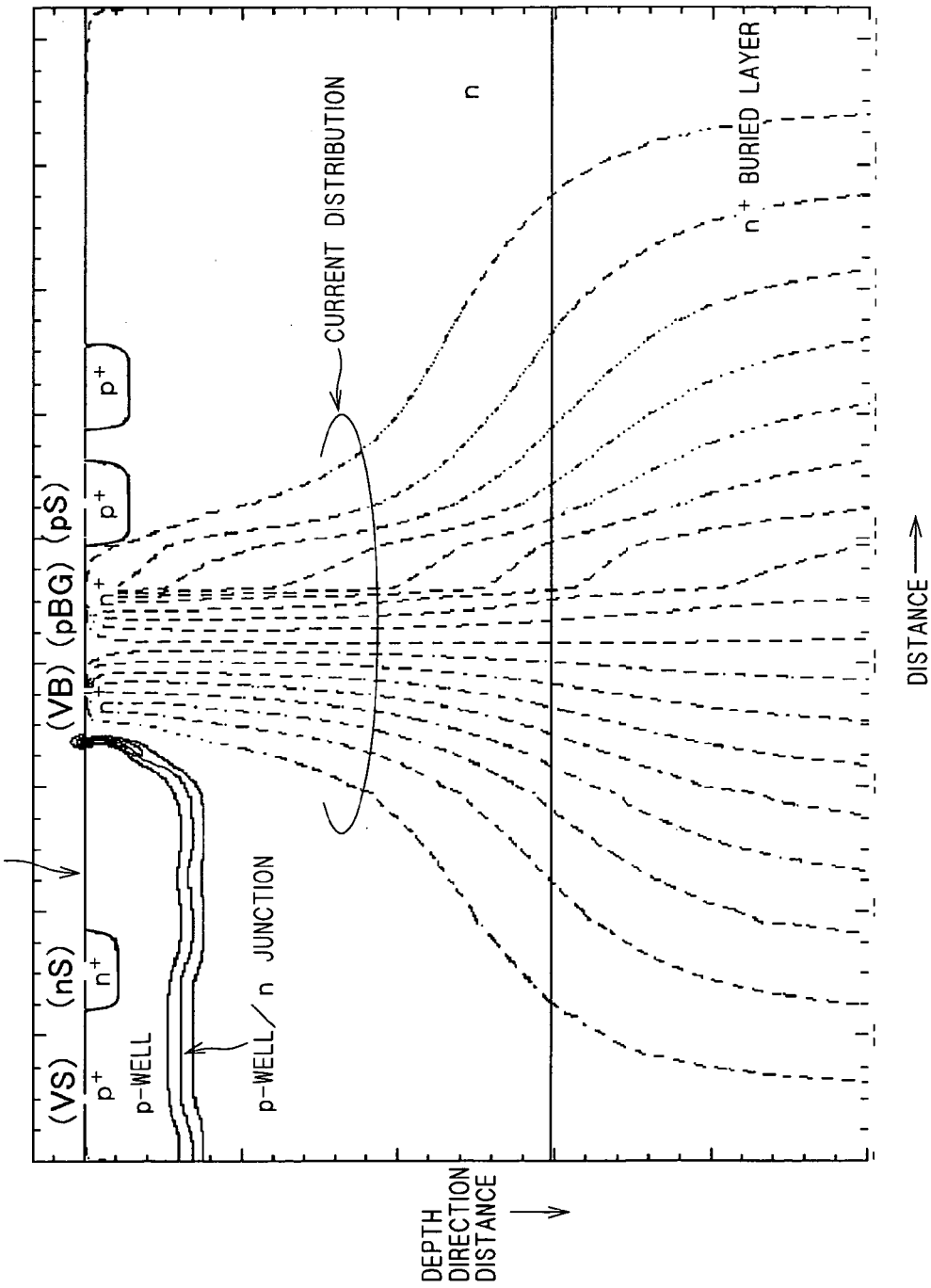
FIG. 4 shows current distribution when the VS negative voltage is −52 V in the semiconductor device according to the first preferred embodiment.

FIG. 4 shows current distribution when the VS negative voltage in FIG. 3 is −52 V. It is shown that current does not pass through the nMOS source electrode when the VS negative voltage is −52 V, not causing the above parasitic thyristor resulting from a p-n-p-n structure composed of the p⁻ substrate 200, the n-type impurity region 121, the n⁺ buried layer 20, the p-well 131, and the n⁺-type source region 133 to operate.

FIG. 5 shows current distribution when the VS negative voltage in FIG. 3 is −109 V. It is shown that current passes through the nMOS source electrode when the VS negative voltage is −109 V, causing the above parasitic thyristor to operate.

Figure 64:
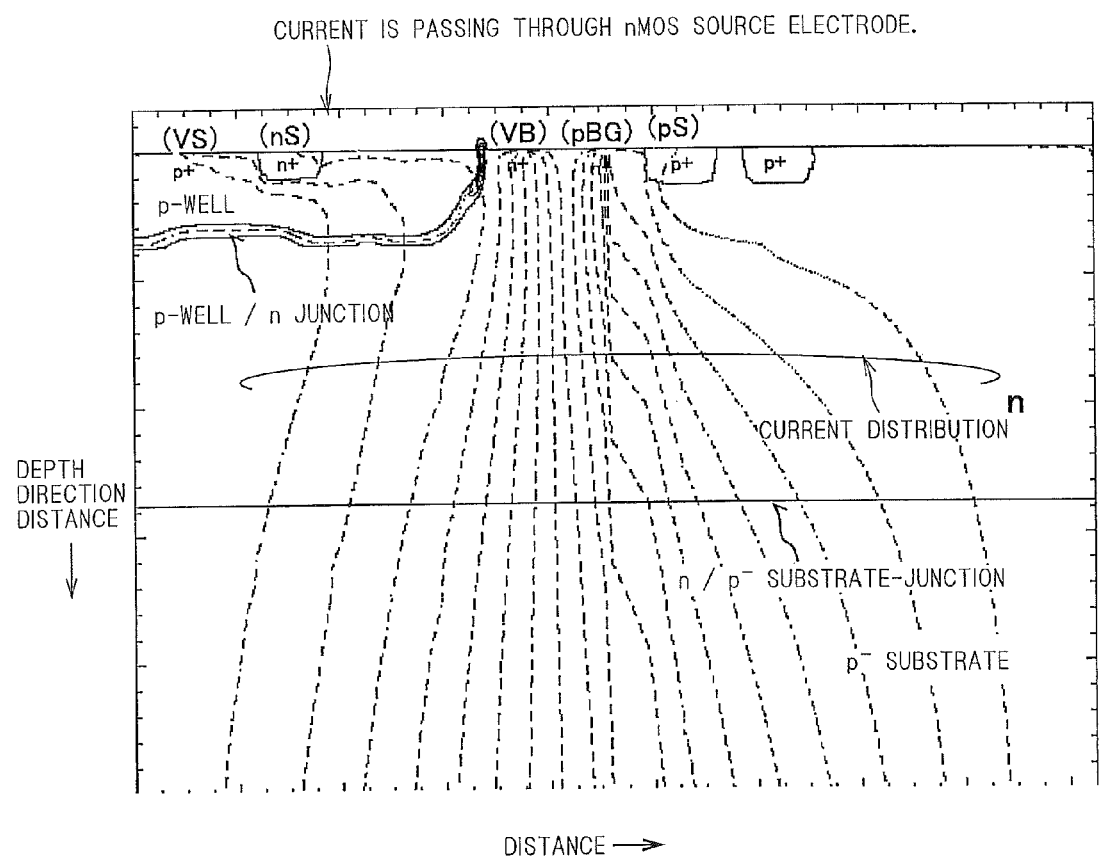
FIG. 64 shows current distribution when the VS negative voltage is −43 V in the conventional semiconductor device.
Figure 65:
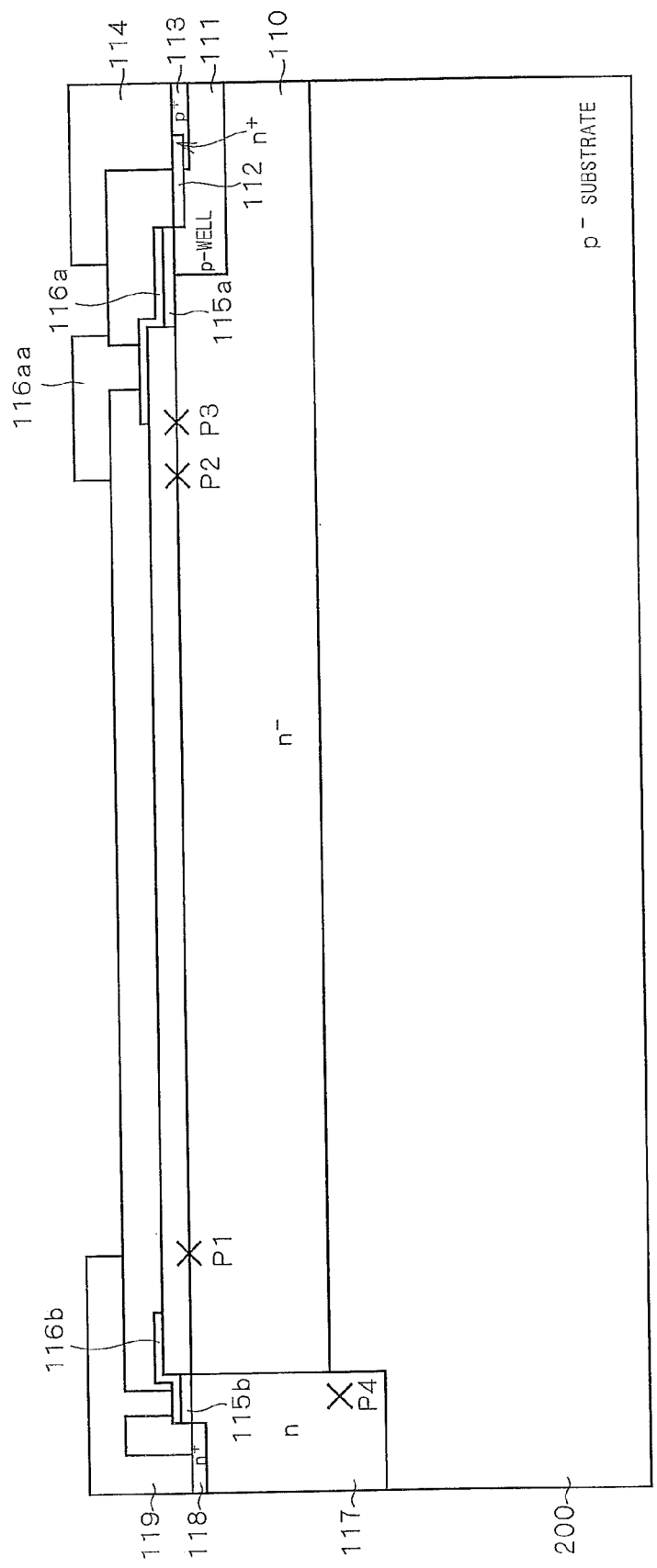
FIG. 65 is a cross-sectional view of the structure of a high breakdown voltage MOS part in the conventional semiconductor device.
Figure 66:
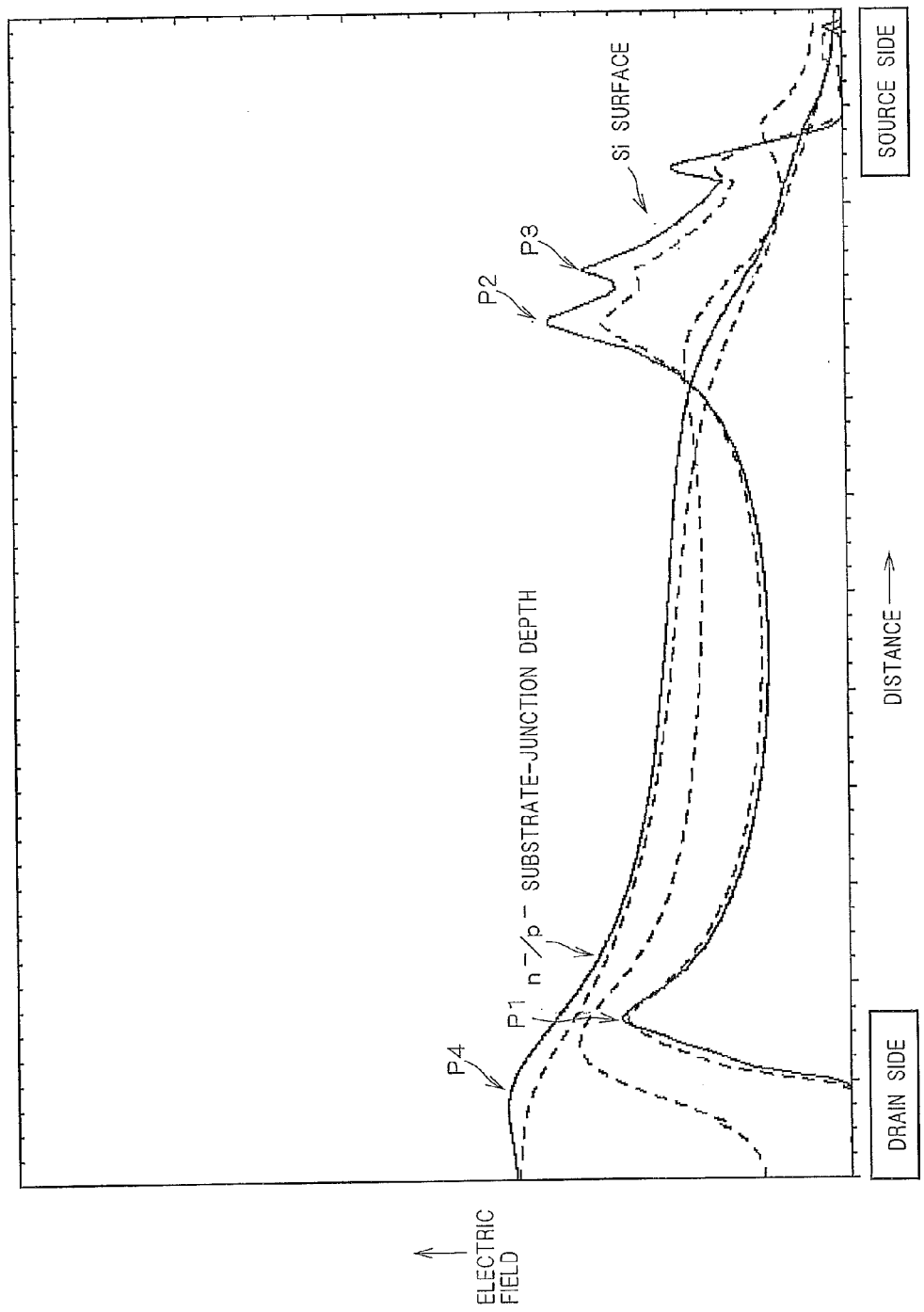
FIG. 66 is a graph showing electric fields upon application of a high voltage across a drain and a source in the conventional semiconductor device.

Whereas the parasitic thyristor operates when the VS negative voltage is −40 V in the conventional semiconductor device (see FIG. 64), the parasitic thyristor does not operate even when the VS negative voltage is −52 V in the semiconductor device according to the first preferred embodiment (see FIG. 4). It is therefore shown that the absolute value of operation-starting voltage of the parasitic thyristor in the conventional semiconductor device is enhanced in the semiconductor device according to the first preferred embodiment.

Figure 6:
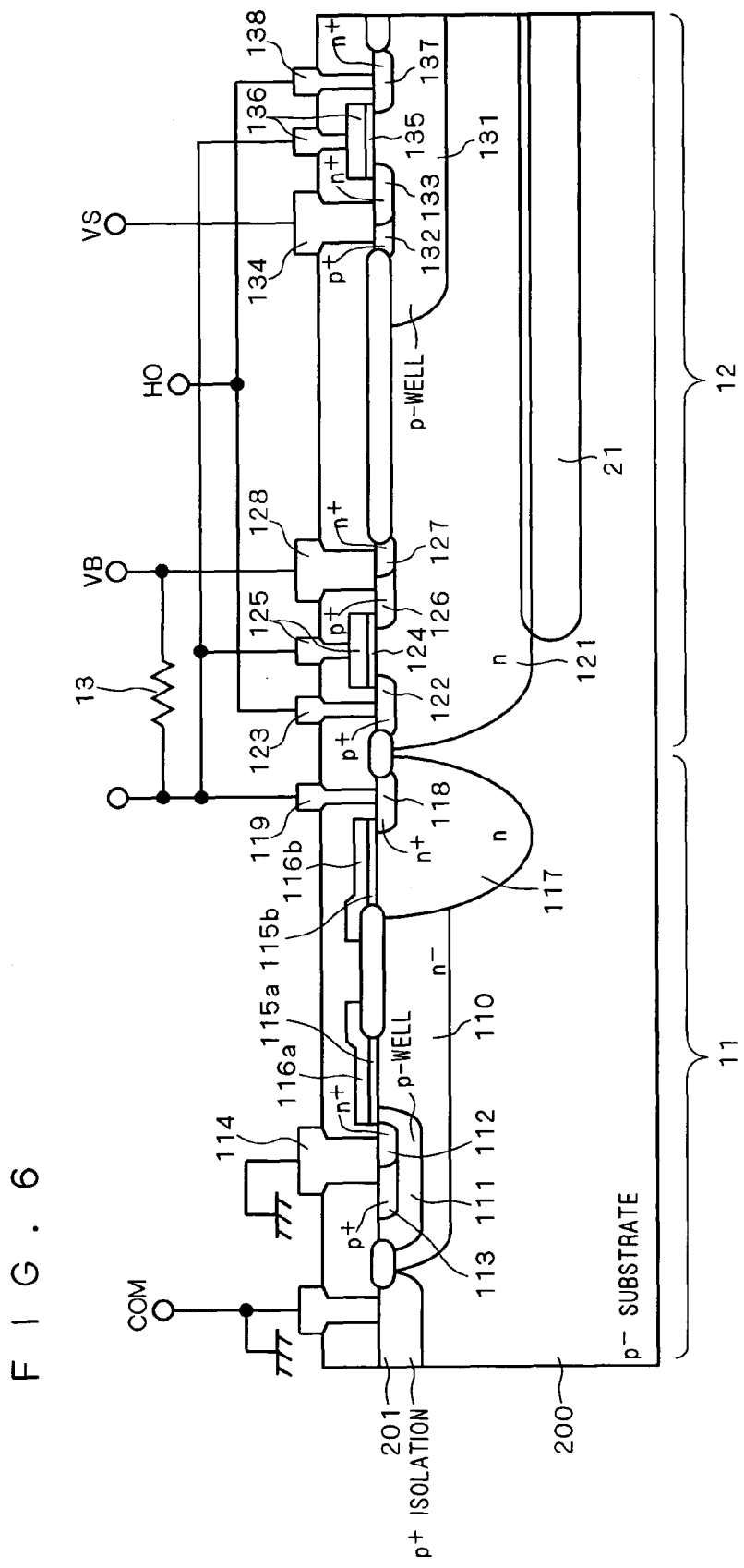
FIG. 6 is a cross-sectional view of the structure of the high-voltage-side driving section in a semiconductor device according to a modification of the first preferred embodiment.

FIG. 6 is a cross-sectional view of the structure of the high-voltage-side driving section 101 according to a modification of the first preferred embodiment of this invention, correspondingly to FIG. 1. Instead of the n$^+$ buried layer 20 in FIG. 1, an n-type impurity region (hereafter called "n-buried layer") 21 having an impurity concentration lower than that of the n$^+$ buried layer 20 is formed. By way of example, the peak value of impurity concentration of the n-buried layer 21 is of the order of $10^{15}$ cm$^{-3}$. As with the n$^+$ buried layer 20, the n-buried layer 21 is formed in contact with the bottom surface of the n-type impurity region 121 in the p$^-$ substrate 200.

Figure 7A:
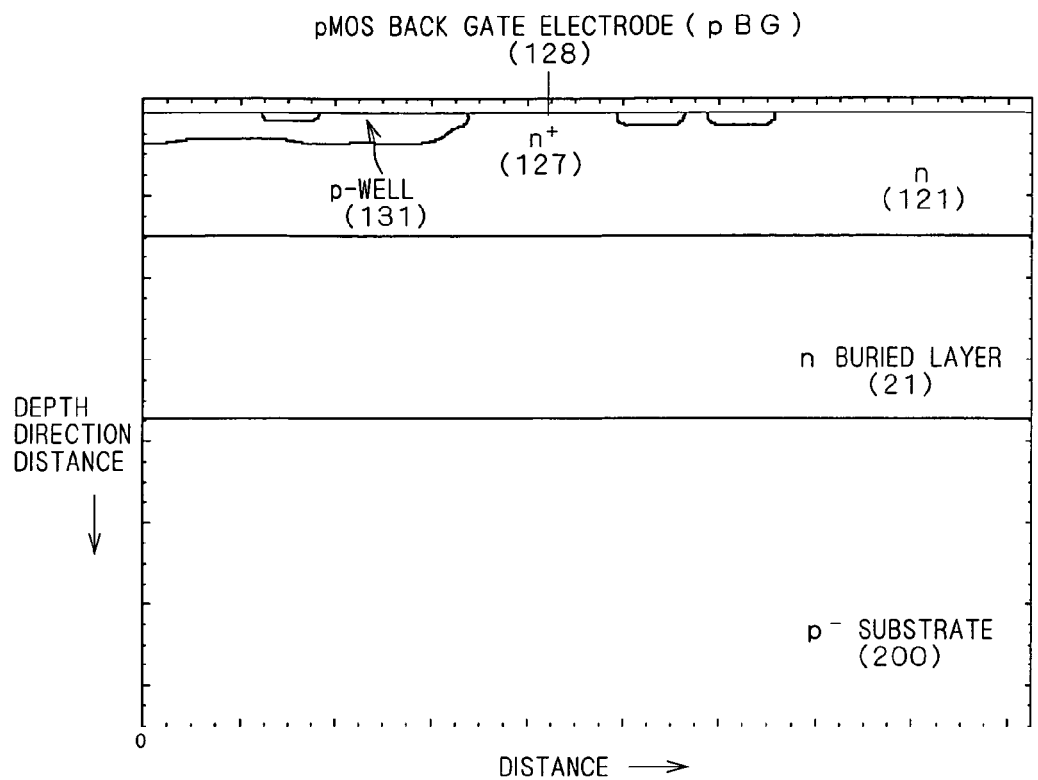
FIGS. 7A and 7B show the structure of the CMOS part and an impurity concentration profile in the semiconductor device according to the modification of the first preferred embodiment.
Figure 7B:
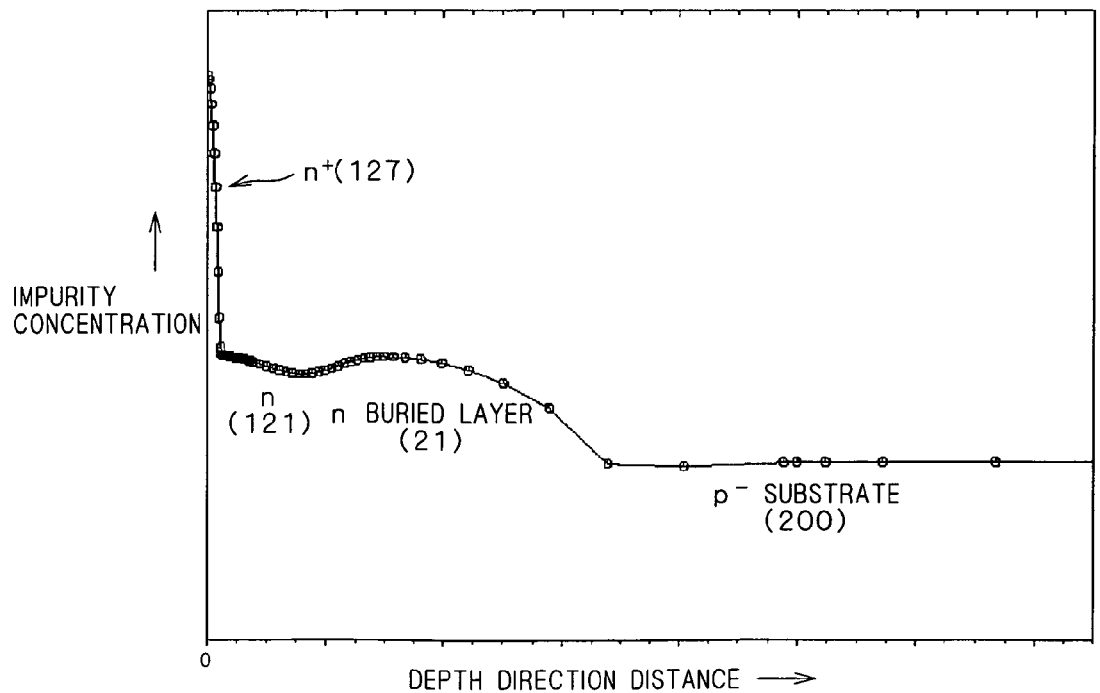

FIG. 7A shows a simplified structure of the CMOS part according to the modification of the first preferred embodiment, correspondingly to FIG. 2A. FIG. 7B shows an impurity concentration profile from the upper surface of the n$^+$-type impurity region 127 toward the depth direction of the p$^-$ substrate 200 with respect to a position where the pMOS back gate electrode is formed in FIG. 7A, correspondingly to FIG. 2B. It is shown from a comparison of FIG. 7B and FIG. 61B that the n-type impurity is introduced at a greater depth in the p$^-$ substrate 200 when the n-buried layer 21 is formed.

In the semiconductor device according to the modification of the first preferred embodiment, the n-buried layer 21 is formed in contact with the bottom surface of the n-type impurity region 121. Accordingly, the base resistance of a parasitic p-n-p bipolar transistor resulting from a p-n-p structure composed of the p$^-$ substrate 200, the n-type impurity region 121, the n-buried layer 21, and the p-well 131 is reduced lower than that in the conventional semiconductor device. This allows an increase in latchup breakdown resistance of the CMOS 12 for the same reasons as described above.

Second Preferred Embodiment

Figure 8:
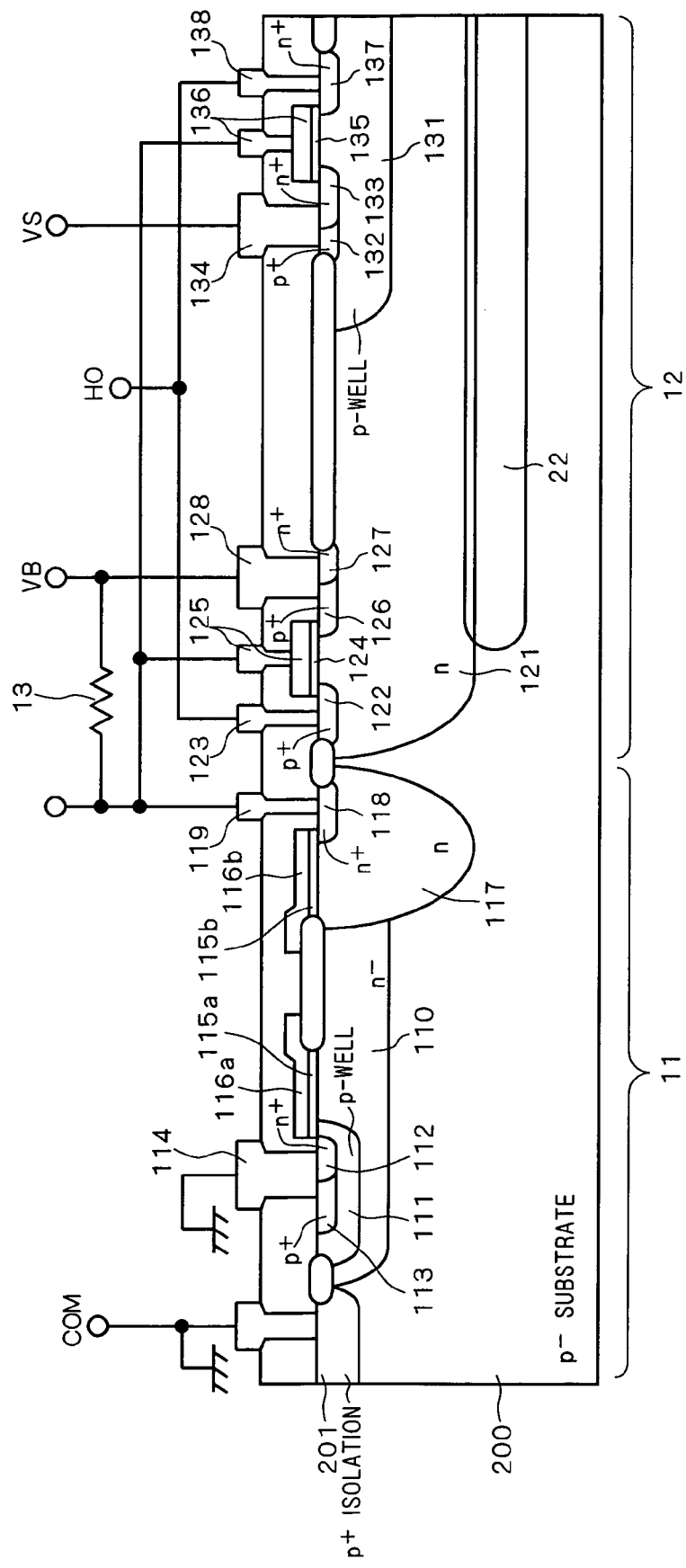
FIG. 8 is a cross-sectional view of the structure of a high-voltage-side driving section in a semiconductor device according to a second preferred embodiment of this invention.

FIG. 8 is a cross-sectional view of the structure of the high-voltage-side driving section 101 according to a second preferred embodiment of this invention, correspondingly to FIG. 1. Instead of the n$^+$ buried layer 20 in FIG. 1, an n$^+$-type impurity region (hereafter called "n$^+$ buried layer") 22 having an impurity concentration higher than that of the n$^+$ buried layer 20 is formed. By way of example, the peak value of impurity concentration of the n$^+$ buried layer 22 is of the order of $10^{18}$ cm$^{-3}$. As with the n$^+$ buried layer 20, the n$^+$ buried layer 22 is formed in contact with the bottom surface of the n-type impurity region 121 in the p$^-$ substrate 200.

FIG. 9A shows a simplified structure of the CMOS part according to the second preferred embodiment, correspondingly to FIG. 2A. FIG. 9B shows an impurity concentration profile from the upper surface of the n$^+$-type impurity region 127 toward the depth direction of the p$^-$ substrate 200 with respect to a position where the pMOS back gate electrode is formed in FIG. 9A, correspondingly to FIG. 2B. It is shown from a comparison of FIG. 9B and FIG. 2B that the peak value of impurity concentration of the n$^+$ buried layer 22 is higher than that of the n$^+$ buried layer 20.

In the semiconductor device according to the second preferred embodiment, the n$^+$ buried layer 22 has a concentration higher than that of the n$^+$ buried layer 20 in the first preferred embodiment. This allows a further increase from the semiconductor device according to the first preferred embodiment in latchup breakdown resistance of the CMOS 12.

Figure 10:
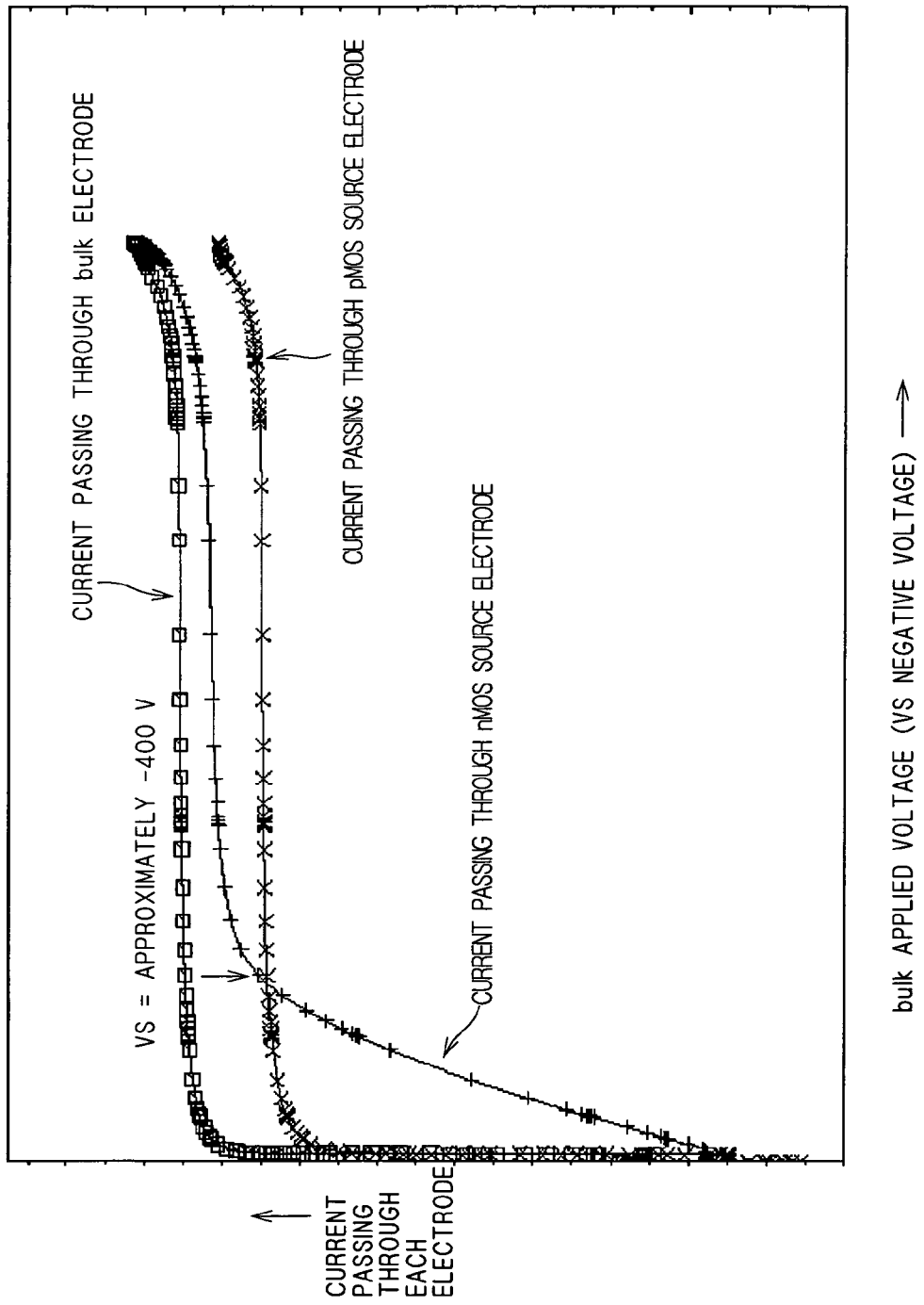
FIG. 10 is a graph showing the values of currents passing through electrodes upon application of the VS negative voltage in the semiconductor device according to the second preferred embodiment.

This effect will be described in detail. FIG. 10 is a graph showing, upon application of the VS negative voltage to the VS electrode with respect to the FIG. 60 structure in which the n$^+$ buried layer 22 is additionally formed, the value of current passing through each of the bulk electrode, the pMOS source electrode, and the nMOS source electrode. It is shown in FIG. 10 that the current passing through the nMOS source electrode becomes almost the same as the current passing through the pMOS source electrode when the VS negative voltage is approximately −400 V.

Figure 11:
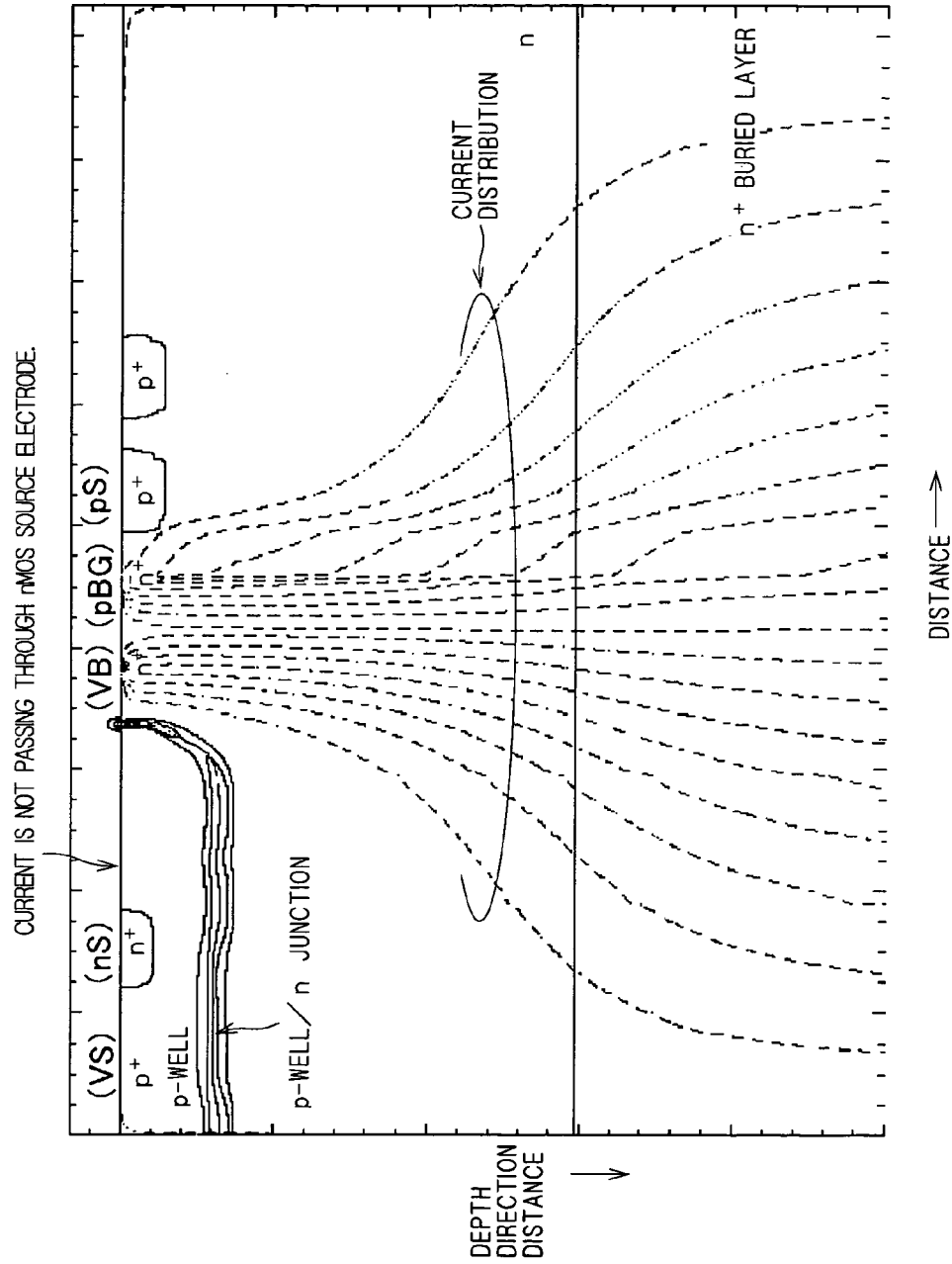
FIG. 11 shows current distribution when the VS negative voltage is −269 V in the semiconductor device according to the second preferred embodiment.

FIG. 11 shows current distribution when the VS negative voltage in FIG. 10 is V. It is shown that current does not pass through the nMOS source electrode when the VS negative voltage is −269 V, not causing a parasitic thyristor resulting from a p-n-p-n structure composed of the p$^-$ substrate 200, the n-type impurity region 121, the n$^+$ buried layer 22, the p-well 131, and the n$^+$-type source region 133 to operate.

Figure 12:
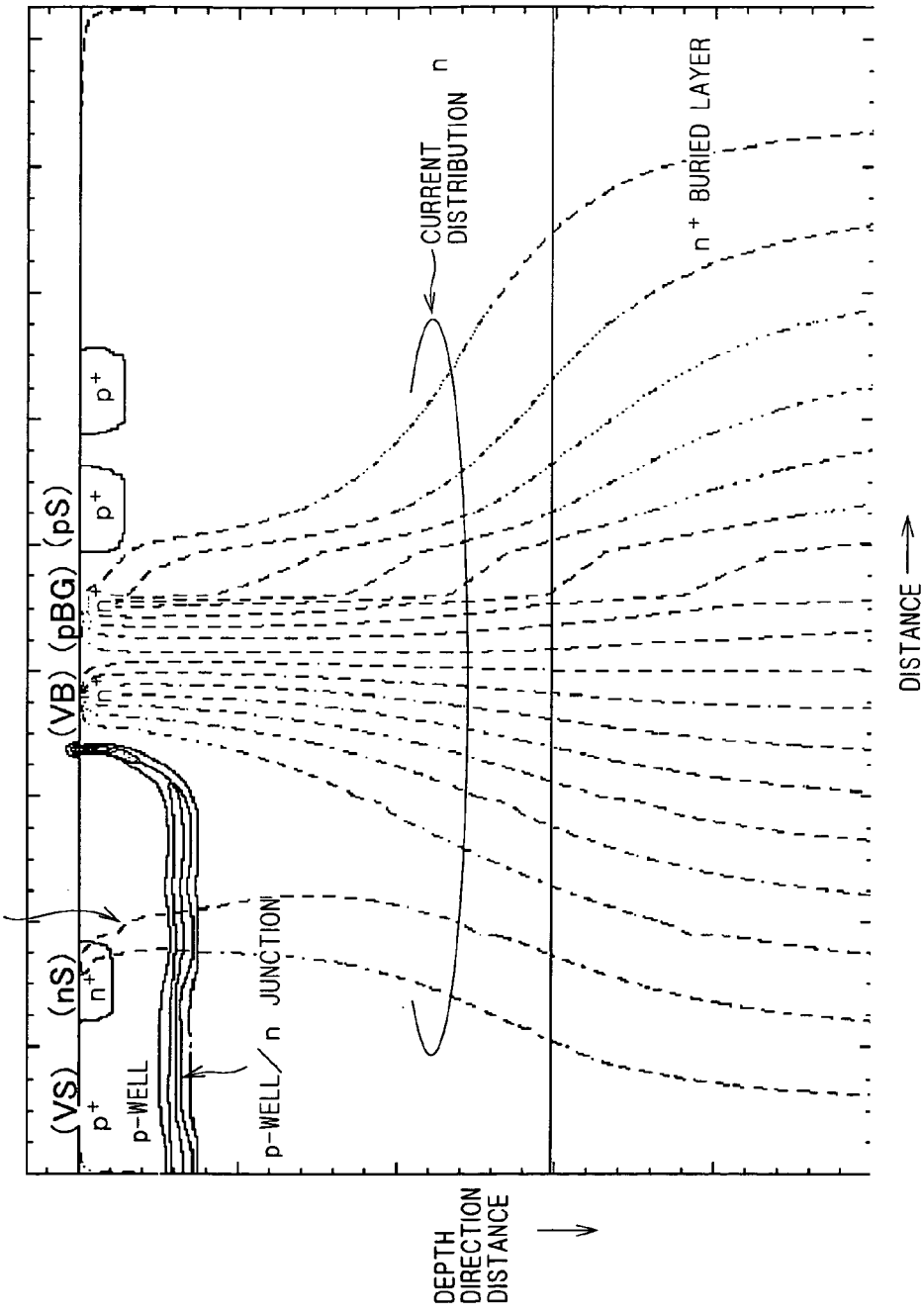
FIG. 12 shows current distribution when the VS negative voltage is −730 V in the semiconductor device according to the second preferred embodiment.

FIG. 12 shows current distribution when the VS negative voltage in FIG. 10 is −730 V. It is shown that current passes through the nMOS source electrode when the VS negative voltage is −730 V, causing the above parasitic thyristor to operate.

Whereas the parasitic thyristor operates when the VS negative voltage is −109 V in the semiconductor device according to the first preferred embodiment (see FIG. 5), the parasitic thyristor doe not operate even when the VS negative voltage is −269 V in the semiconductor device according to the second preferred embodiment (see FIG. 11). It is therefore shown that the absolute value of operation-starting voltage of the parasitic thyristor in the semiconductor device according to the first preferred embodiment is enhanced in the semiconductor device according to the second preferred embodiment.

Third Preferred Embodiment

Figure 13:
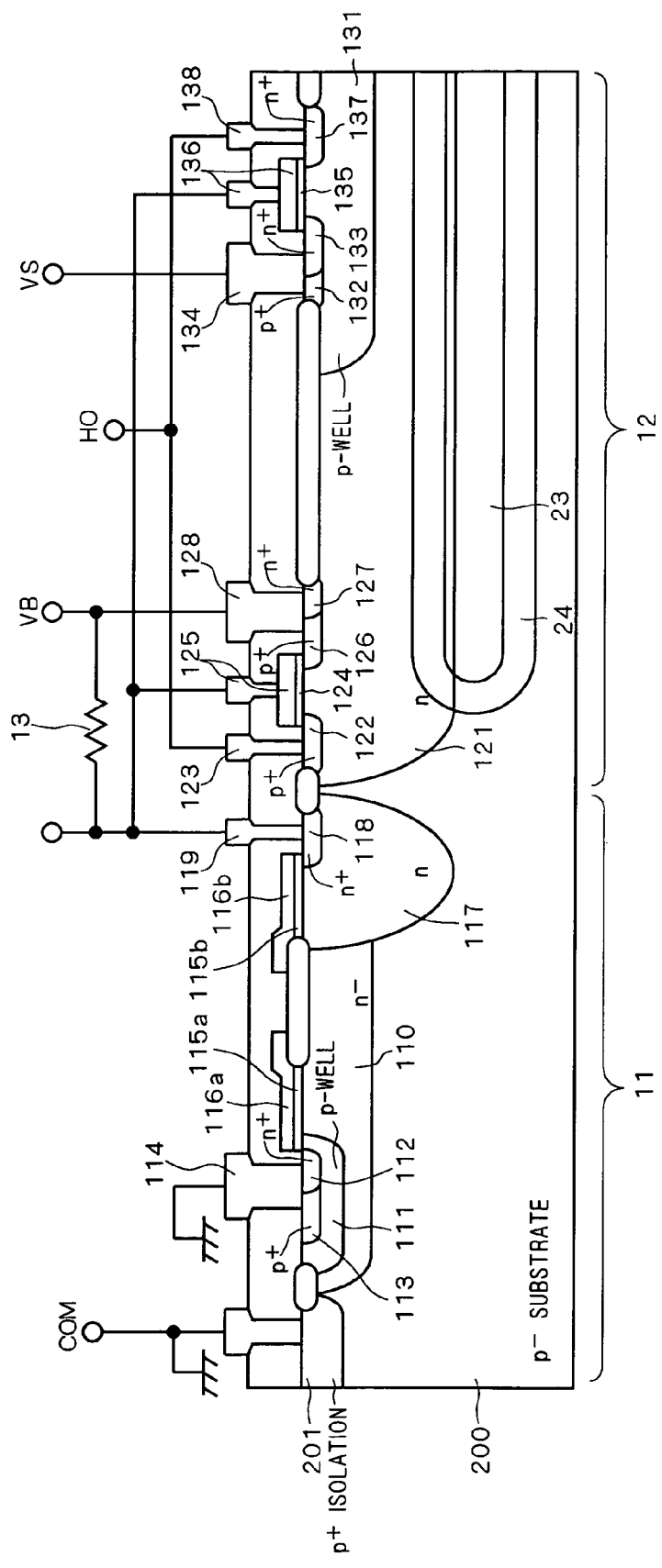
FIG. 13 is a cross-sectional view of the structure of a high-voltage-side driving section in a semiconductor device according to a third preferred embodiment of this invention.

FIG. 13 is a cross-sectional view of the structure of the high-voltage-side driving section 101 according to a third preferred embodiment of this invention, correspondingly to FIG. 1. Instead of the n$^+$ buried layer 20 in FIG. 1, an n$^+$-type impurity region (hereafter called "n$^+$ buried layer") 23 having an impurity concentration higher than that of the n-type impurity region 121, and an n-type impurity region (hereafter called "n-buried layer") 24 having an impurity concentration lower than that of the n$^+$ buried layer 23 are formed. By way of example, the peak value of impurity concentration of the n$^+$ buried layer 23 is of the order of $10^{18}$ cm$^{-3}$, and the peak value of impurity concentration of the n-buried layer 24 is of the order of $10^{15}$ cm$^{-3}$. As with the n$^+$ buried layer 20, the n$^+$ buried layer 23 is formed in contact with the bottom surface of the n-type impurity region 121 in the p$^-$ substrate 200. The n-buried layer 24 is formed to cover the circumference of the n$^+$ buried layer 23 while being in contact with the bottom surface of the n-type impurity region 121 in the p$^-$ substrate 200.

Figure 14A:
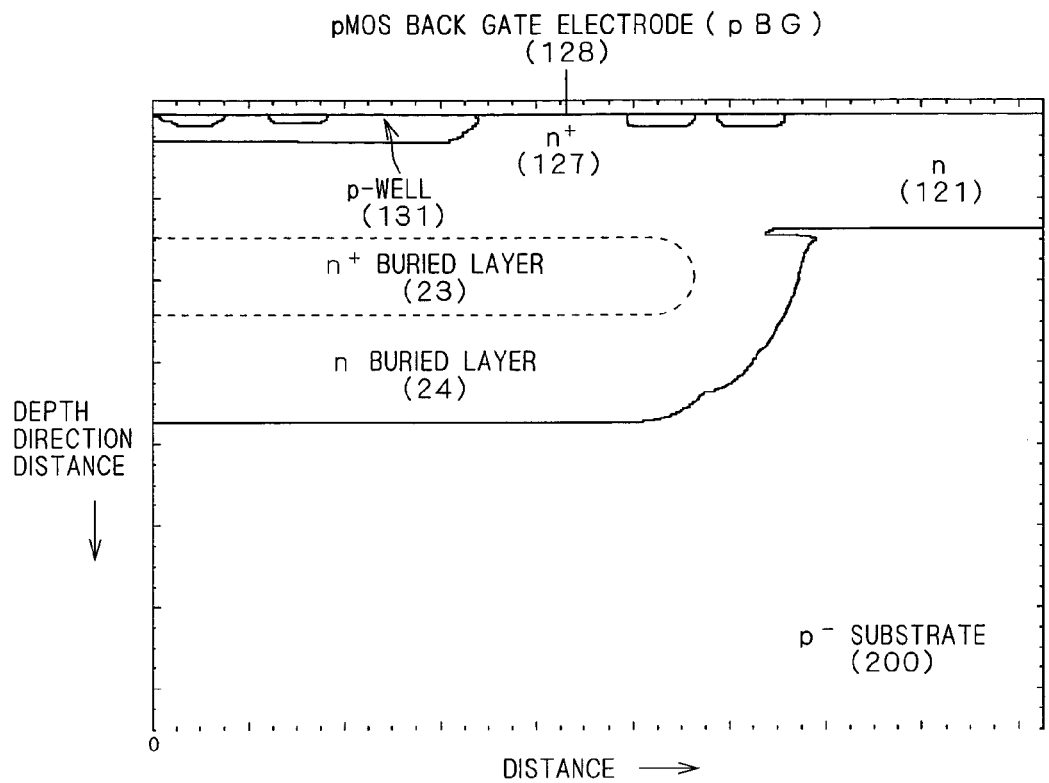
FIGS. 14A and 14B show the structure of a CMOS part and an impurity concentration profile in the semiconductor device according to the third preferred embodiment.
Figure 14B:
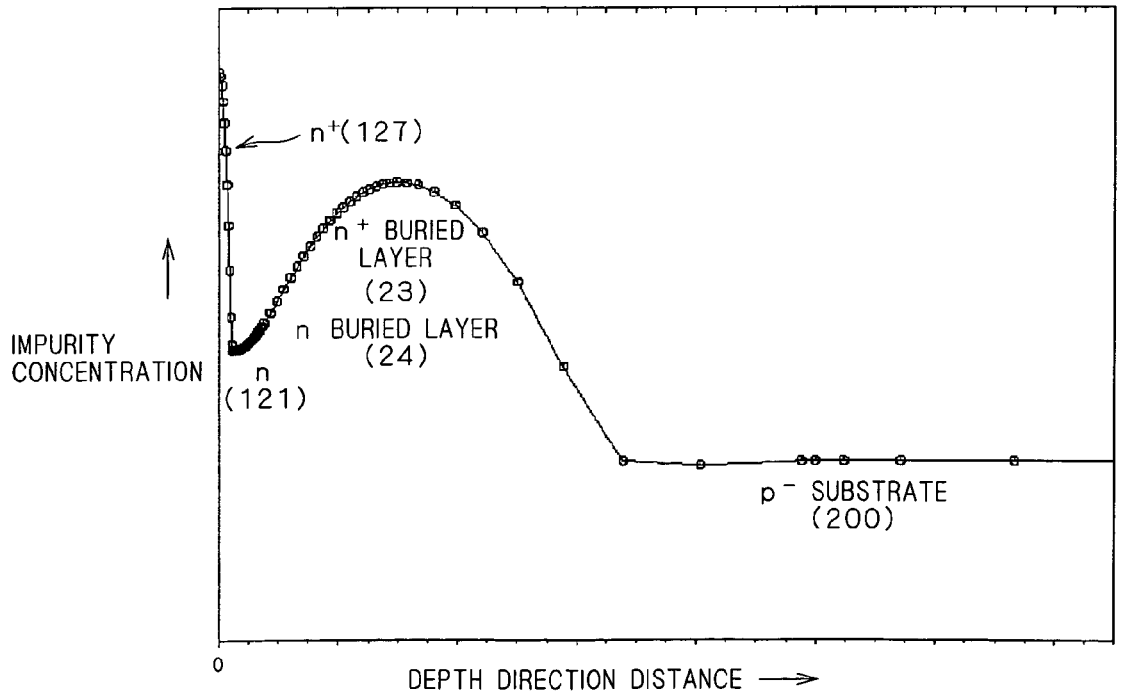

FIG. 14A shows a simplified structure of the CMOS part according to the third preferred embodiment, correspondingly to FIG. 2A. FIG. 14B shows an impurity concentration profile from the upper surface of the n$^+$-type impurity region 127 toward the depth direction of the p$^-$ substrate 200 with respect to a position where the pMOS back gate electrode is formed in FIG. 14A, correspondingly to FIG. 2B. It is shown from a comparison of FIG. 14B and FIG. 9B that the n$^+$ buried layer 23 and the n-buried layer 24 in the third preferred embodiment have a similar impurity concentration profile to that of the n$^+$ buried layer 22 in the second preferred embodiment. Thus, the semiconductor device according to the third preferred embodiment has almost the same latchup breakdown resistance as that of the semiconductor device according to the second preferred embodiment.

In the semiconductor device according to the third preferred embodiment, the low concentration n-buried layer 24 is formed to cover the circumference of the high concentration n$^+$ buried layer 23, the n-buried layer 24 being in contact with the n-type impurity region 121. Also in this semiconductor device, the width of a depletion layer that spreads in the n-buried layer 24 upon application of a reverse-biased voltage across the p$^-$ substrate 200 and the n-buried layer 24 is wider than the width of a depletion layer that spreads in the n$^+$ buried layer 20 upon application of a reverse-biased voltage across the p$^-$ substrate 200 and the n$^+$ buried layer 20 in the first preferred embodiment.

Accordingly, upon application of a reverse-biased voltage across the p$^-$ substrate 200, the n-type impurity region 121, the n$^+$ buried layer 23, and the n-buried layer 24 in the semiconductor device according to the third preferred embodiment, a depletion layer that spreads in the n-type impurity region 121 and the depletion layer that spreads in the n-buried layer 24 get connected to each other at a curved surface of the n-buried layer 24. And the width of the depletion layer that spreads in the n-buried layer 24 is wider than that of the depletion layer that spreads in the n$^+$ buried layer 20. This relieves the electric fields more effectively than the semiconductor device according to the first preferred embodiment, allowing an increase injunction breakdown voltage.

FIG. 15 is a graph showing comparison results of a junction breakdown voltage between the p$^-$ substrate 200 and the n-type impurity region 121 and the n$^+$ buried layer 20 in the semiconductor device according to the first preferred embodiment, and a junction breakdown voltage between the p$^-$ substrate 200 and the n-type impurity region 121 and the n-buried layer 24 in the semiconductor device according to the third preferred embodiment. It is shown that the semiconductor device according to the third preferred embodiment attains a higher junction breakdown voltage than the semiconductor device according to the first preferred embodiment.

Fourth Preferred Embodiment

Figure 16:
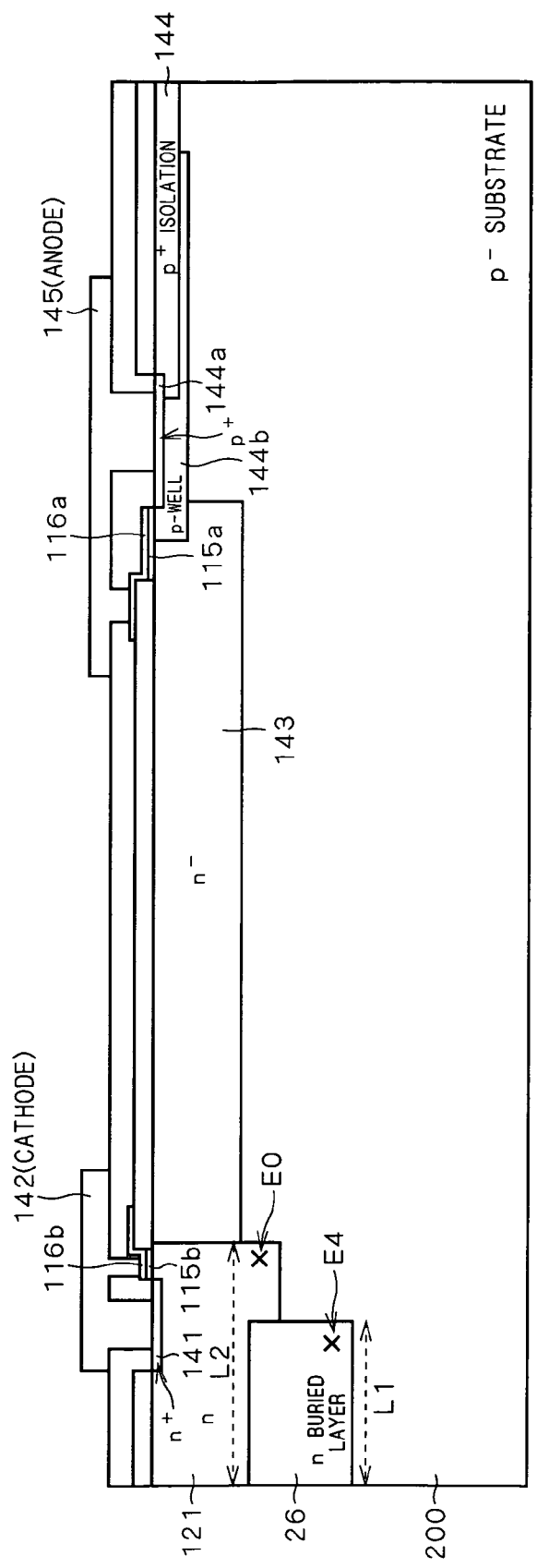
FIG. 16 is a cross-sectional view of the structure of a high breakdown voltage diode part in a semiconductor device according to a fourth preferred embodiment of this invention.
Figure 59:
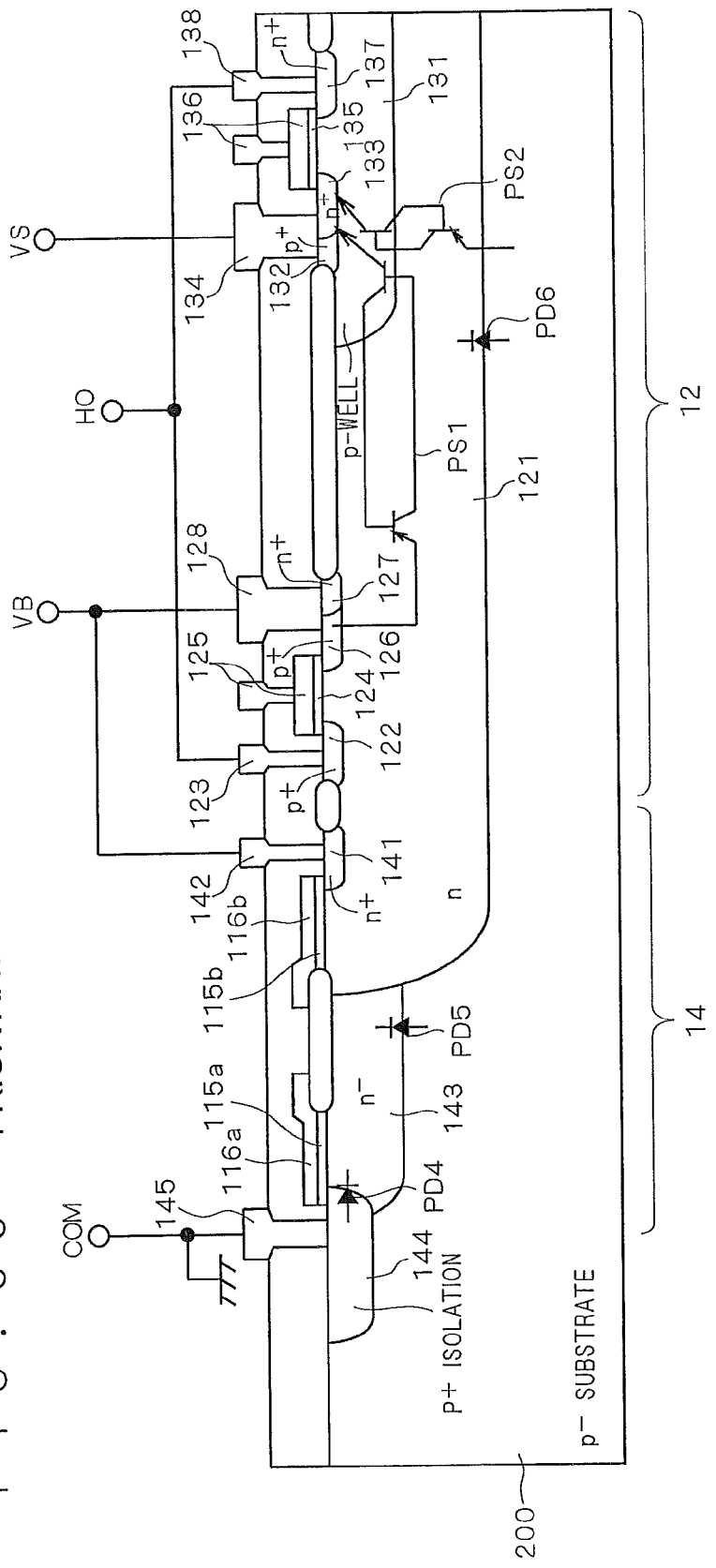
Figure 67:
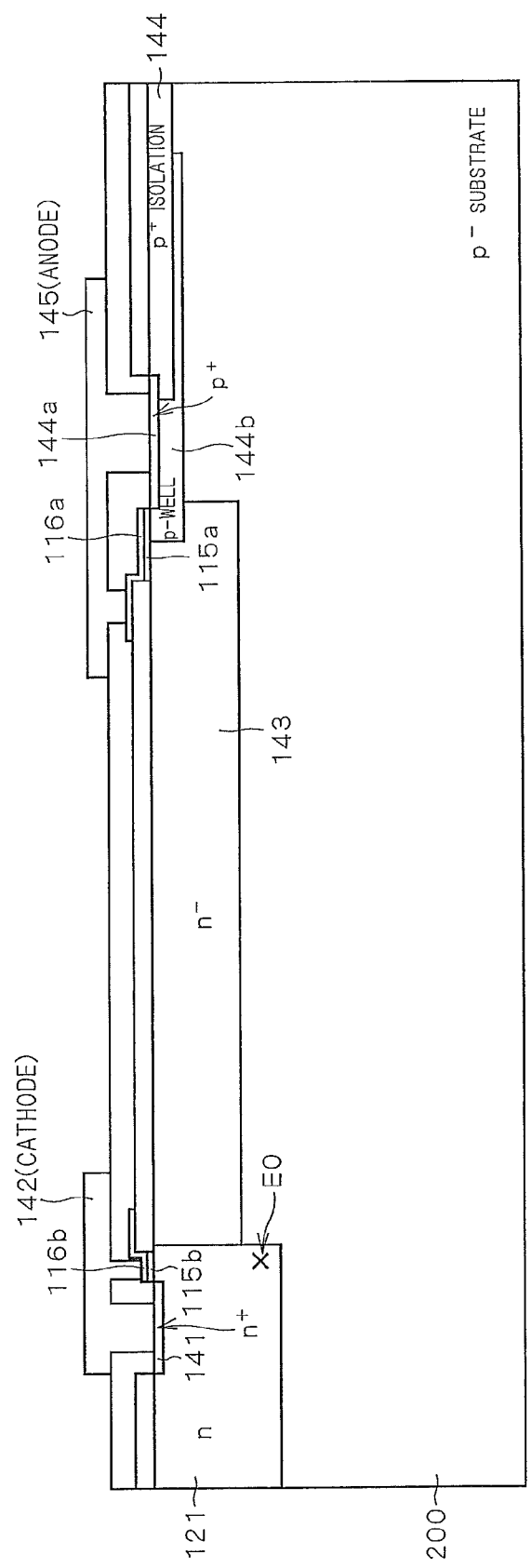
FIG. 67 is a cross-sectional view of the structure of a high breakdown voltage diode part in the conventional semiconductor device.

FIG. 16 is a cross-sectional view of a semiconductor device according to a fourth preferred embodiment of this invention, showing an extracted region where the high breakdown voltage diode 14 is formed from the FIG. 59 structure, correspondingly to FIG. 67 regarding the conventional semiconductor device. For convenience' sake, the positional relationship of the anode and the cathode in FIG. 59 is reversed in FIG. 16.

With reference to FIG. 16, in the upper surface of the p$^-$ substrate 200, the p$^+$ isolation 144, a p-well 144b connected to the p$^+$ isolation 144, the n$^-$-type impurity region 143 connected to the p-well 144b, and the n-type impurity region 121 connected to the n$^-$-type impurity region 143 are formed. A p$^+$-type impurity region 144a is formed in the upper surface of the p-well 144b, and an n$^+$-type impurity region 141 is formed in the upper surface of the n-type impurity region 121. The high breakdown voltage diode 14 includes the anode electrode 145 and the cathode electrode 142, the anode electrode 145 being connected to the p$^+$-type impurity region 144a and the cathode electrode 142 being connected to the n$^+$-type impurity region 141. On the p-well 144b formed via the gate insulating film 115a is the gate electrode 116a, to which the anode electrode 145 is also connected. On the n-type impurity region 121 formed via an insulating film 115b is an electrode 116b, to which the cathode electrode 142 is also connected.

An n-type impurity region (hereafter called "n-buried layer") 26 is formed in contact with the bottom surface of the n-type impurity region 121 in the p$^-$ substrate 200. By way of example, the peak value of impurity concentration of the n-buried layer 26 is of the order of $10^{15}$ cm$^{-3}$. A width L1 of the n-buried layer 26 is narrower than a width L2 of the n-type impurity region 121 so that the n-buried layer 26 is formed not to protrude from a side surface (left side surface in FIG. 16) of the n-type impurity region 143 toward the anode electrode 145 side.

With respect to the FIG. 16 structure, main electric field peaks upon application of a high voltage across the anode electrode 145 and the cathode electrode 142 are the peak E0 located in the right lower edge part of the n-type impurity region 121, and a peak E4 located in the right lower edge part of the n-buried layer 26.

FIG. 17 is a graph showing the correlation between (L1−L2) and the breakdown voltage, the (L1−L2) in the lateral axis indicating the relationship between the width L1 of the n-buried layer 26 and the width L2 of the n-type impurity region 121 in FIG. 16. It is shown that the breakdown voltage decreases lower than that of the conventional semiconductor device when L1=L2 or L1>L2, while a breakdown voltage higher than that of the conventional semiconductor device is attained when L1<L2.

Figure 18A:
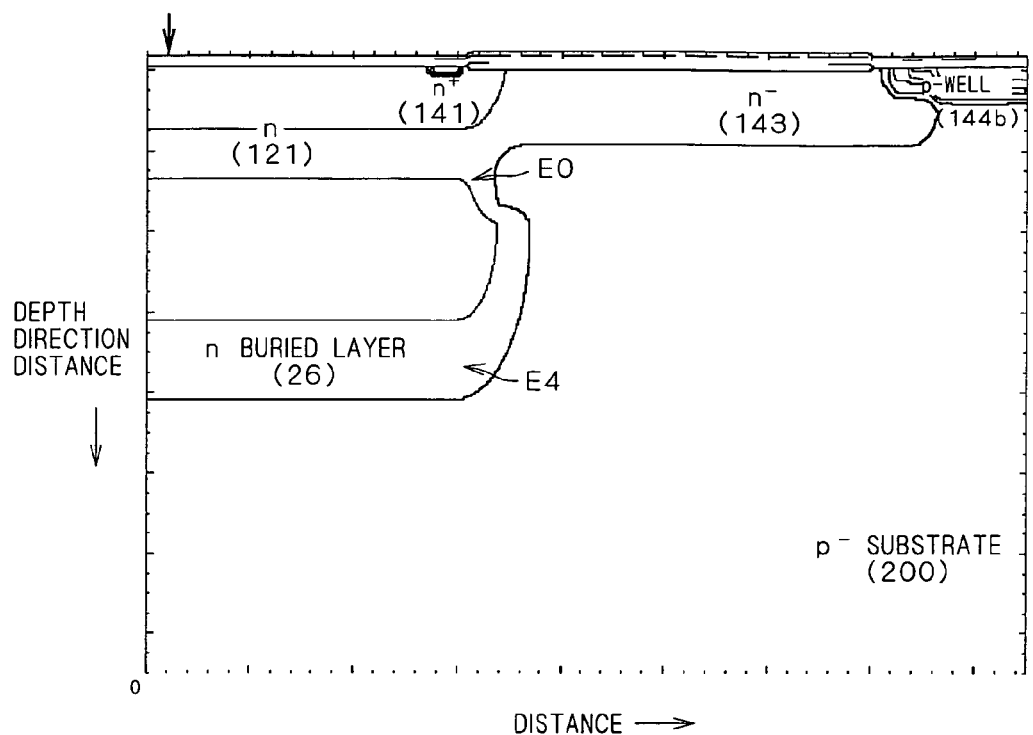
FIGS. 18A and 18B show the structure of the high breakdown voltage diode part and an impurity concentration profile in the semiconductor device according to the fourth preferred embodiment.
Figure 18B:
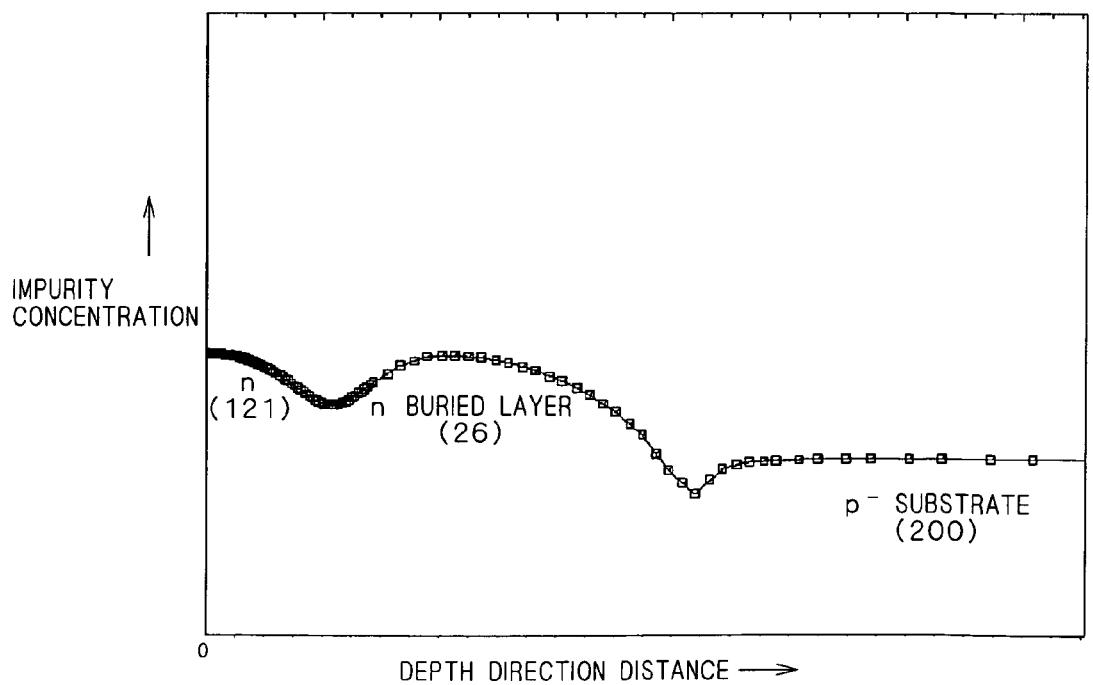

FIG. 18A shows a simplified structure of the high breakdown voltage diode part according to the fourth preferred embodiment on condition of L1>L2. FIG. 18B shows an impurity concentration profile from the upper surface of the n-type impurity region 121 toward the depth direction of the p$^-$ substrate 200 with respect to an arrow-indicated position in FIG. 18A.

Figure 19:
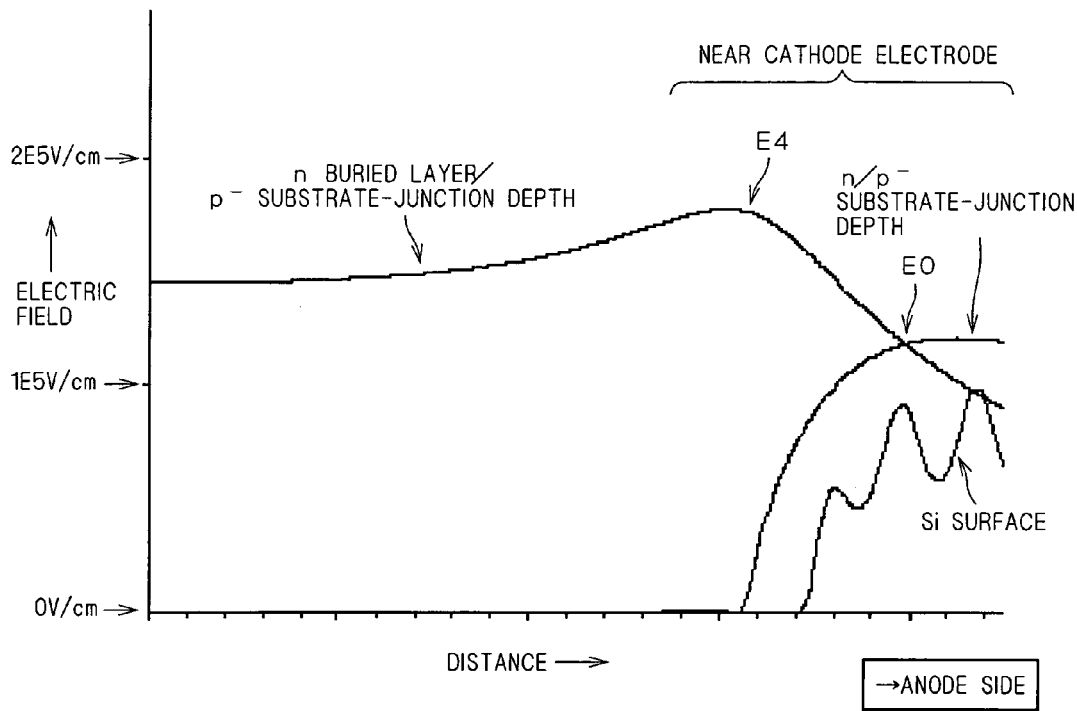
FIG. 19 is a graph showing electric fields upon application of a high voltage across an anode and a cathode in the semiconductor device according to the fourth preferred embodiment.
Figure 68:
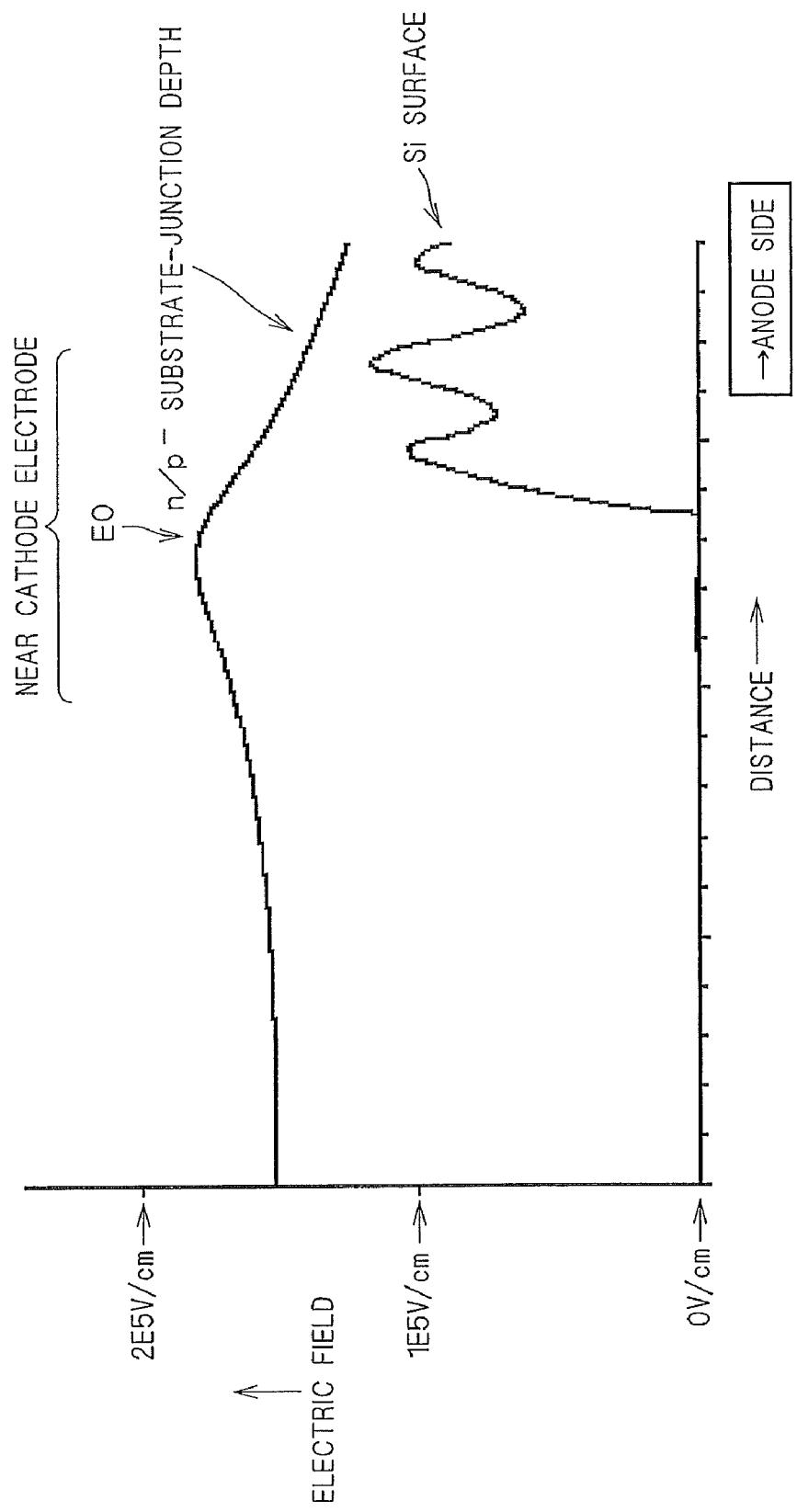
FIG. 68 is a graph showing electric fields upon application of a high voltage across an anode and a cathode in the conventional semiconductor device.

FIG. 19 is a graph showing electric fields upon application of a high voltage across the anode electrode 145 and the cathode electrode 142 with respect to the FIG. 18A structure. FIG. 19 shows an electric field on the upper surface of the n-type impurity region 143 (Si surface), an electric field at the interface between the bottom surface of the n-type impurity region 121 and the p$^-$ substrate 200 (n/p$^-$ substrate-junction depth), and an electric field at the interface between the bottom surface of the n-buried layer 26 and the p$^-$ substrate 200 (n-buried layer/p$^-$ substrate-junction depth). It is shown from a comparison of FIG. 19 and FIG. 68 regarding the conventional semiconductor device that the peak E0 is extremely lower in the FIG. 18A structure than in the conventional semiconductor device. On the other hand, since the electric field value at the peak E4 is much higher than the electric field value at the peak E0, as indicated in the graph shown in FIG. 19, the electric field peak in the FIG. 18A structure is the peak E4 located in the right lower edge part of the n-buried layer 26.

FIG. 20 shows potential distribution (equipotential lines) and current distribution upon application of a high voltage across the anode electrode 145 and the cathode electrode 142 with respect to the FIG. 18A structure. It is shown that the curvature of equipotential lines is great and the space between adjacent equipotential lines is narrow at a position that corresponds to the peak E4. It is also shown from a comparison of FIG. 20 and FIG. 69 regarding the conventional semiconductor device that the space between equipotential lines at the peak E4 portion in FIG. 20 is narrower than that at the peak E0 portion in FIG. 69. Thus the electric field value at the peak E4 portion in FIG. 20 is presumably higher than the electric field value at the peak E0 portion in FIG. 69, which leads to the conclusion that the breakdown voltage of the conventional semiconductor device is not improved in the FIG. 18A structure.

FIG. 21A shows a simplified structure of the high breakdown voltage diode part according to the fourth preferred embodiment on condition of L1<L2. FIG. 21B shows an impurity concentration profile from the upper surface of the n-type impurity region 121 toward the depth direction of the p⁻ substrate 200 with respect to an arrow-indicated position in FIG. 21A.

Figure 22:
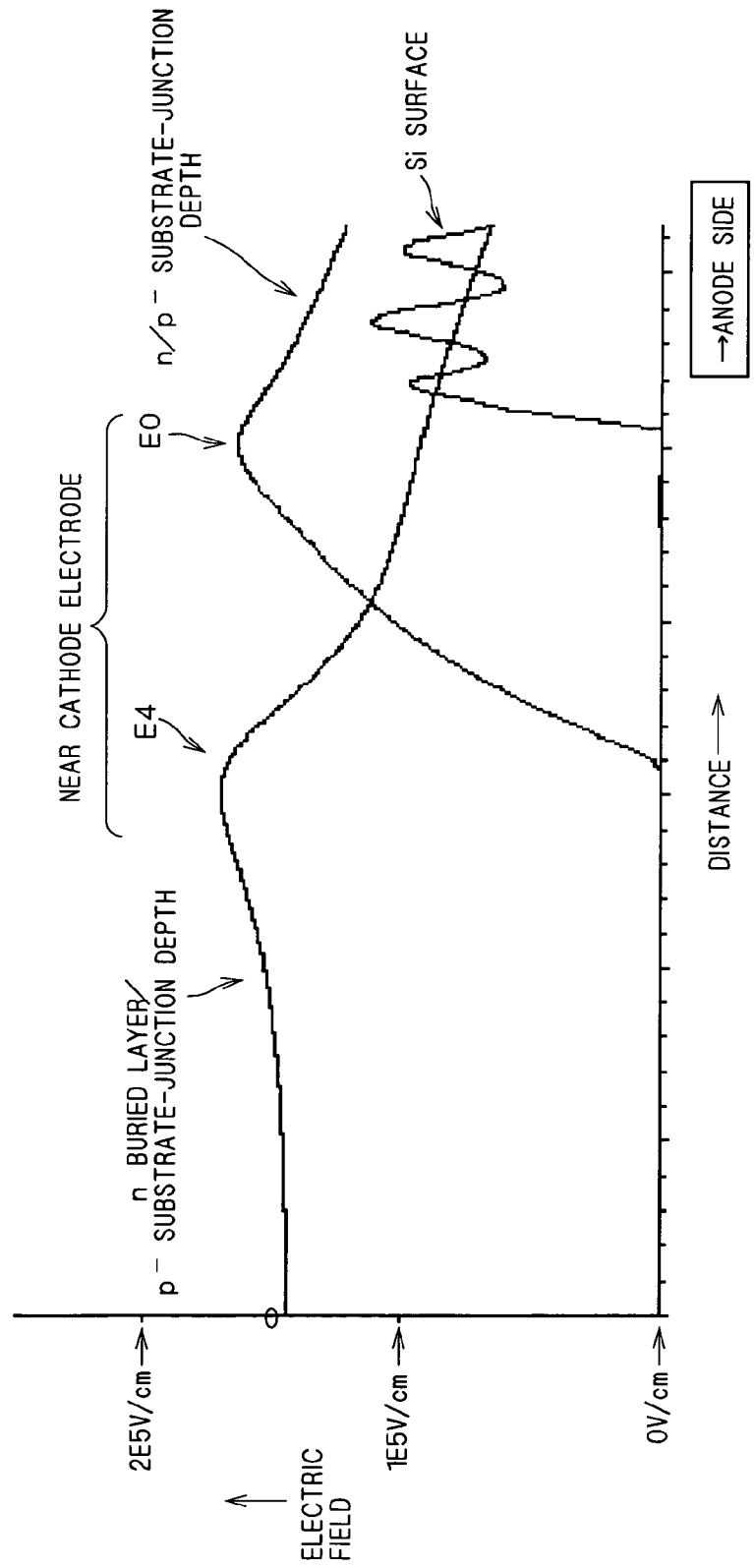
FIG. 22 is a graph showing electric fields upon application of a high voltage across the anode and the cathode in the semiconductor device according to the fourth preferred embodiment.

FIG. 22 is a graph showing electric fields upon application of a high voltage across the anode electrode 145 and the cathode electrode 142 with respect to the FIG. 21A structure. As with FIG. 19, FIG. 22 shows an electric field on the Si surface, an electric field in the n/p⁻ substrate-junction depth, and an electric field in the n-buried layer/p⁻ substrate-junction depth. It is shown from a comparison of FIG. 22 and FIG. 68 that the peak E0 is slightly lower in the FIG. 21A structure than in the conventional semiconductor device. It is also clear from the graph shown in FIG. 22 that the electric field value at the peak E4 is almost the same as the electric field value at the peak E0.

Figure 23:
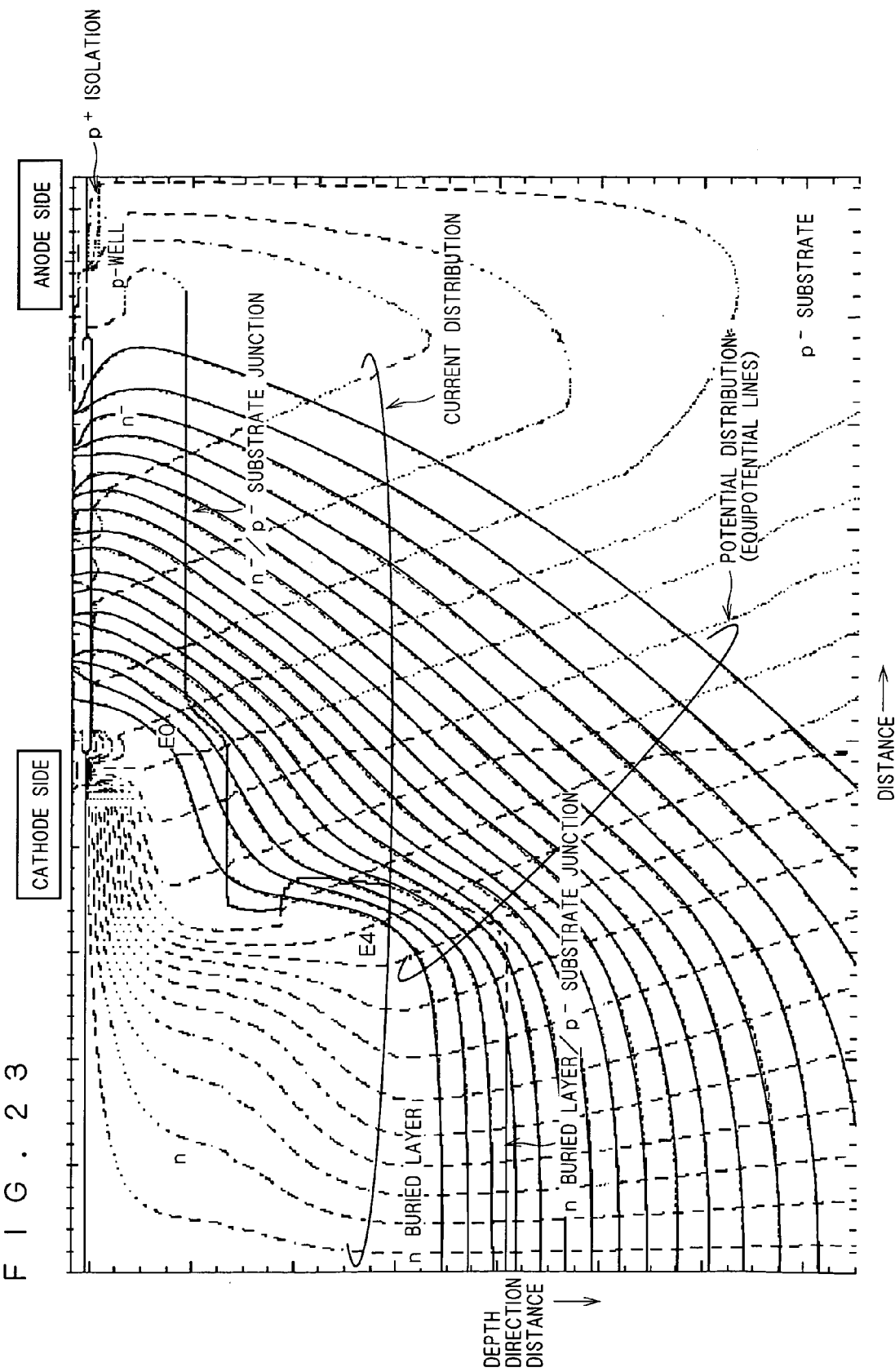
FIG. 23 shows potential distribution and current distribution upon application of a high voltage across the anode and the cathode in the semiconductor device according to the fourth preferred embodiment.

FIG. 23 shows potential distribution (equipotential lines) and current distribution upon application of a high voltage across the anode electrode 145 and the cathode electrode 142 with respect to the FIG. 21A structure. It is shown from a comparison of FIG. 23 and FIG. 69 that the curvature of equipotential lines at the peak E0 portion is much smaller in the FIG. 21A structure than in the conventional semiconductor device. Thus the electric field value at the peak E0 portion is presumably smaller. It is also shown from a comparison of FIG. 23 and FIG. 20 that the curvature of equipotential lines at the peak E4 portion is much smaller in the FIG. 21A structure than in the FIG. 18A structure. Thus the electric field value at the peak E4 portion is presumably smaller.

Figure 69:
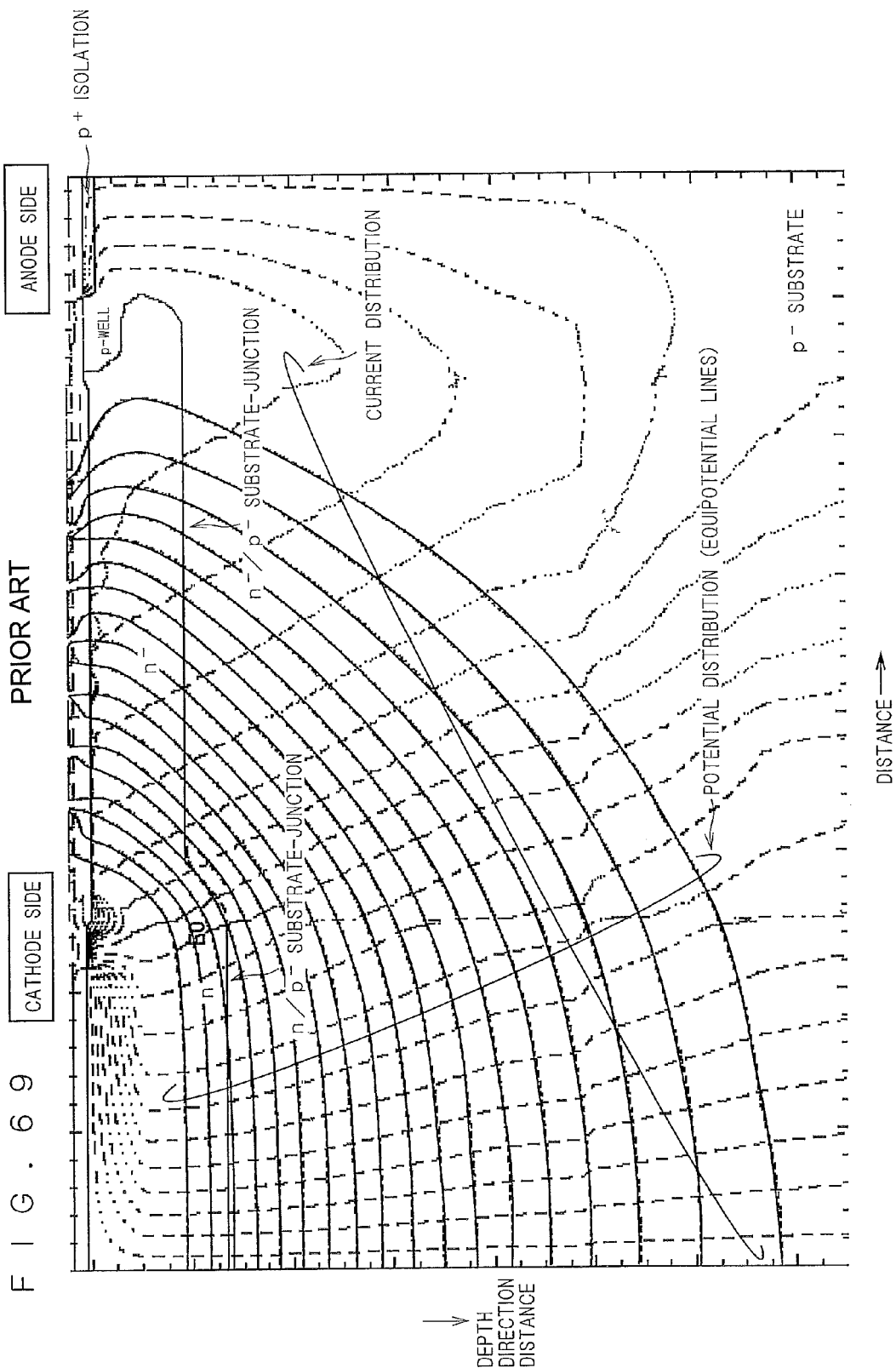
FIG. 69 shows potential distribution and current distribution upon application of a high voltage across the anode and the cathode in the conventional semiconductor device.

In this manner, in the semiconductor device according to the fourth preferred embodiment (FIG. 21A structure), the electric field values at the peak E0 portion and the peak E4 portion in FIG. 23 are smaller than the electric field value at the peak E0 portion in FIG. 69. Therefore, the anode-and-cathode-across voltage that leads to critical electric field strength can be increased higher than that of the conventional semiconductor device, attaining an increase in breakdown voltage of the semiconductor device.

Whereas the invention according to the fourth preferred embodiment has been described with a high breakdown voltage diode as an example, the invention is applicable also to an n-channel high breakdown voltage MOSFET, a p-channel high breakdown voltage MOSFET, an n-channel IGBT, or a p-channel IGBT.

Moreover, the invention according to the fourth preferred embodiment is also applicable by combination with the inventions according to the first to third preferred embodiments. When combined with the invention according to the first preferred embodiment, for instance, the n⁺ buried layer 20 in FIG. 1 or the n-buried layer 21 in FIG. 6, and the n-buried layer 26 in FIG. 16 are connected to each other at the bottom surface of the n-type impurity region 121.

Fifth Preferred Embodiment

Figure 24:
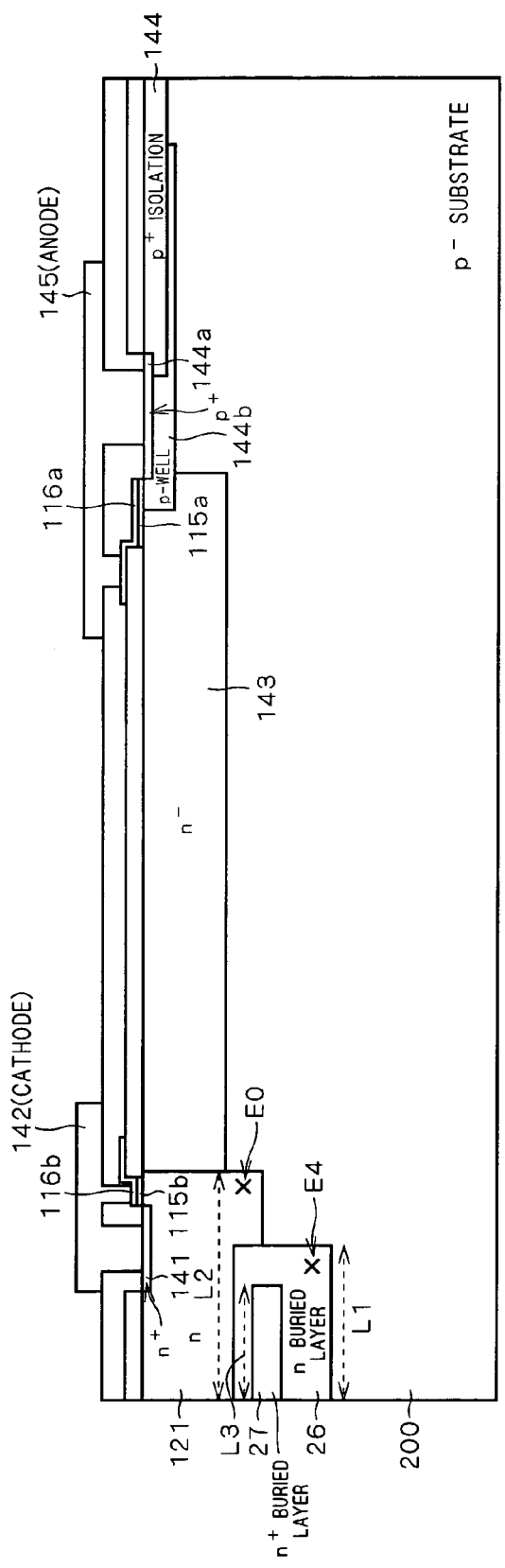
FIG. 24 is a cross-sectional view of the structure of a high breakdown voltage diode part in a semiconductor device according to a fifth preferred embodiment of this invention.

FIG. 24 is a cross-sectional view of the structure of a semiconductor device according to a fifth preferred embodiment of this invention, correspondingly to FIG. 16. An n⁺-type impurity region (hereafter called "n⁺ buried layer") 27 having an impurity concentration higher than that of the n-buried layer 26 is formed in the n-buried layer 26, on the basis of the FIG. 16 structure. By way of example, the peak value of impurity concentration of the n⁺ buried layer 27 is of the order of $10^{18}$ cm$^{-3}$. A width L3 of the n⁺ buried layer 27 is narrower than the width L1 of the n-buried layer 26 so that the n⁺ buried layer 27 is formed not to protrude from a side surface (right side surface in FIG. 24) of the n-buried layer 26 toward the anode electrode 145 side.

Figure 25:
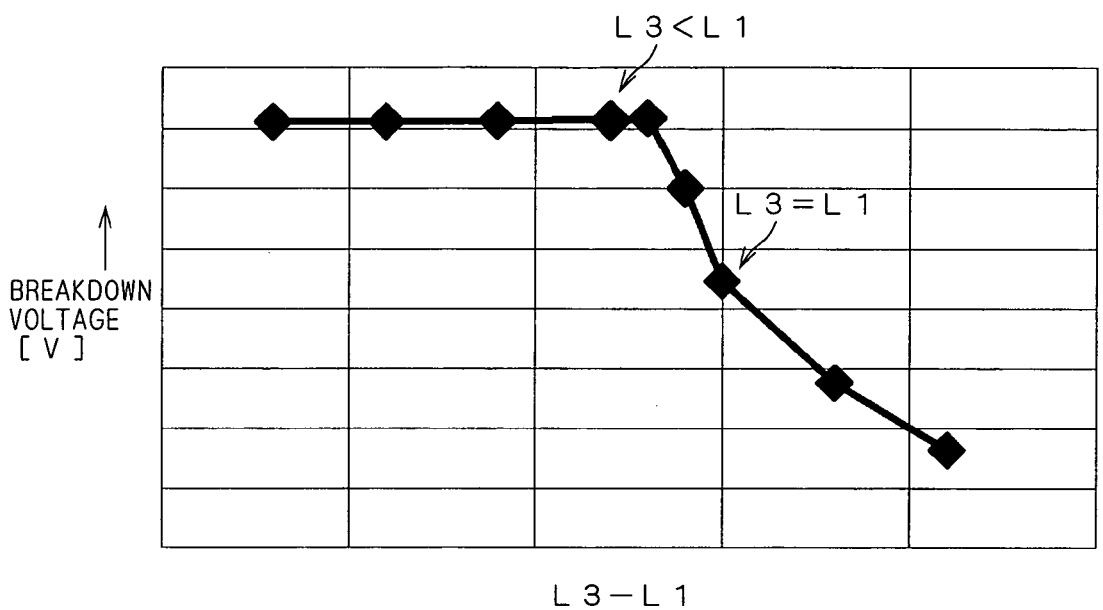
FIG. 25 is a graph showing the correlation between the width of an $n^+$-buried layer and the breakdown voltage in the semiconductor device according to the fifth preferred embodiment.

FIG. 25 is a graph showing the correlation between (L3−L1) and the breakdown voltage, the (L3−L1) in the lateral axis indicating the relationship between the width L1 of the n-buried layer 26 and the width L3 of the n⁺ buried layer 27 in FIG. 24. It is shown that the breakdown voltage is highly ensured when L3<L1, but the breakdown voltage decreases rapidly with an increase in L3 and increasing value of L3−L1.

FIG. 26 is a graph showing comparison results of a breakdown voltage waveform when L3=L1 and a breakdown voltage waveform when L3<L1. It is clear from the graph shown in FIG. 26 that the breakdown voltage is higher when L3<L1 than when L3=L1.

Figure 27A:
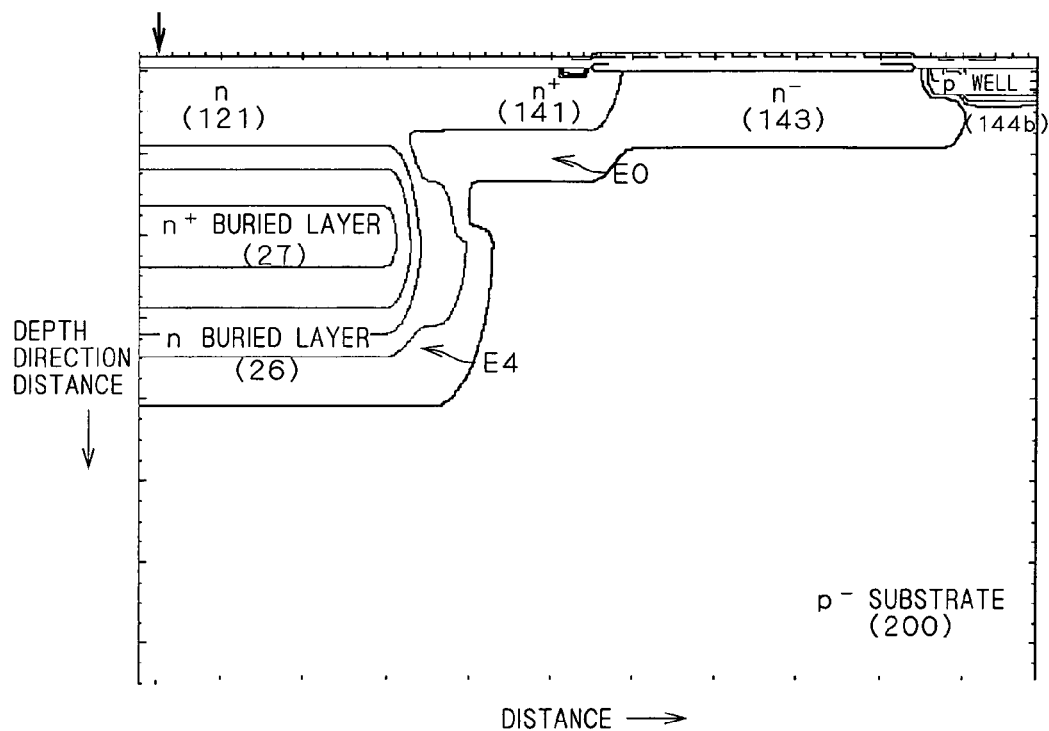
FIGS. 27A and 27B show the structure of the high breakdown voltage diode part and an impurity concentration profile in the semiconductor device according to the fifth preferred embodiment.
Figure 27B:
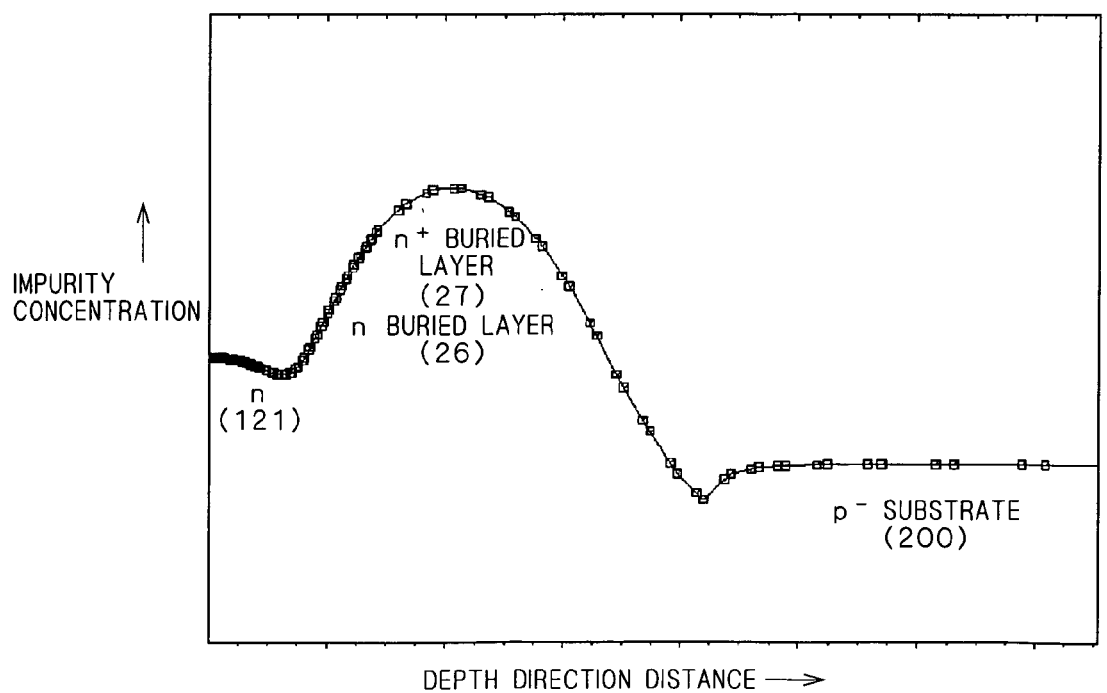

FIG. 27A shows a simplified structure of the high breakdown voltage diode part according to the fifth preferred embodiment on condition of L3=L1. FIG. 27B shows an impurity concentration profile from the upper surface of the n-type impurity region 121 toward the depth direction of the p⁻ substrate 200 with respect to an arrow-indicated position in FIG. 27A.

FIG. 28 is a graph showing electric fields upon application of a high voltage across the anode electrode 145 and the cathode electrode 142 with respect to the FIG. 27A structure. As with FIG. 19, FIG. 28 shows an electric field on the Si surface, an electric field in the n/p⁻ substrate-junction depth, and an electric field in the n-buried layer/p⁻ substrate-junction depth. It is shown from a comparison of FIG. 28 and FIG. 68 regarding the conventional semiconductor device that the peak E0 is slightly lower in the FIG. 27A structure than in the conventional semiconductor device. On the other hand, since the electric field value at the peak E4 is higher than the electric field value at the peak E0, as indicated in the graph shown in FIG. 28, the electric field peak in the FIG. 27A structure is the peak E4 located in the right lower edge part of the n-buried layer 26.

Figure 29:
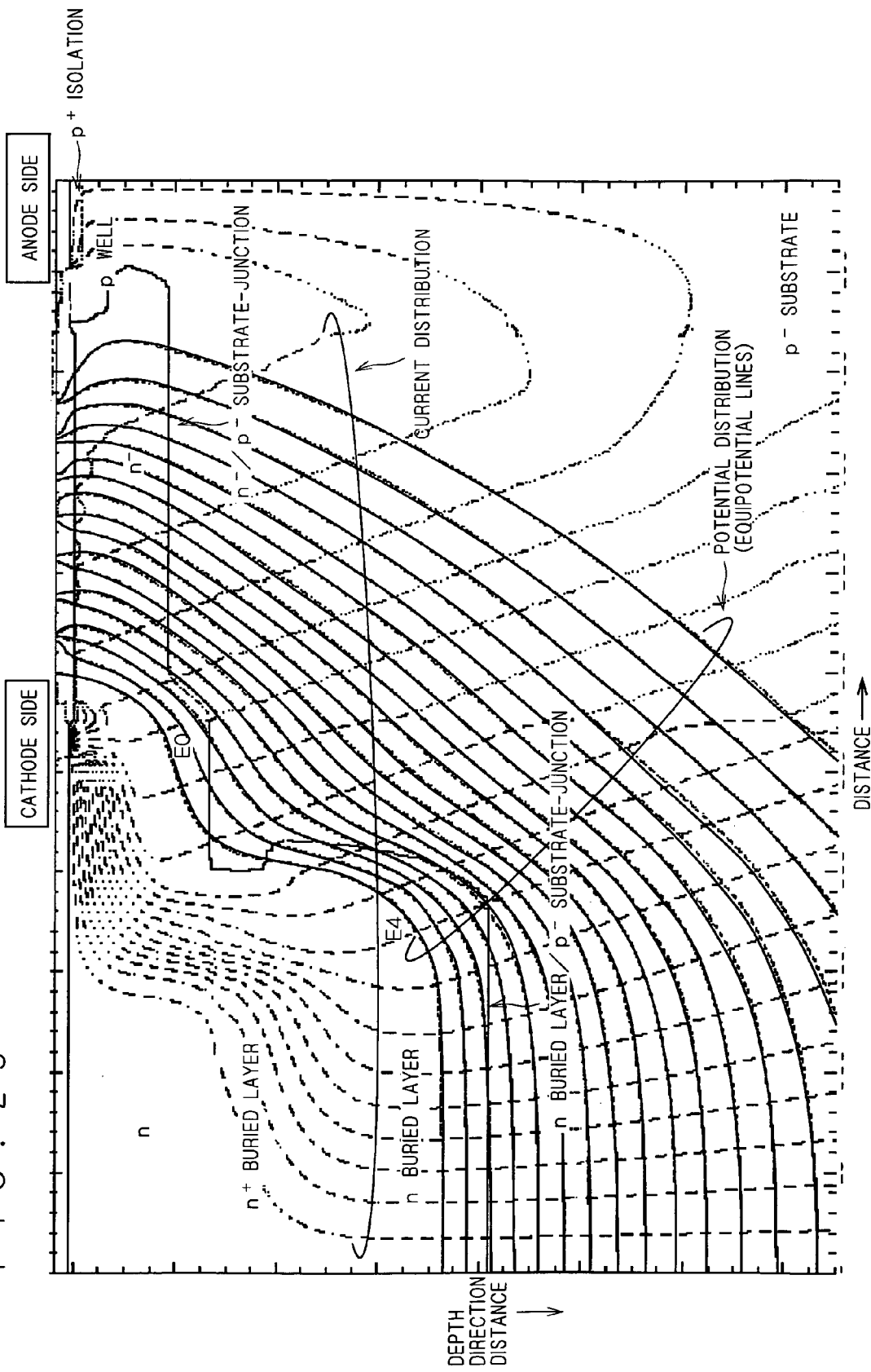
FIG. 29 shows potential distribution and current distribution upon application of a high voltage across the anode and the cathode in the semiconductor device according to the fifth preferred embodiment.

FIG. 29 shows potential distribution (equipotential lines) and current distribution upon application of a high voltage across the anode electrode 145 and the cathode electrode 142 with respect to the FIG. 27A structure. It is shown that the curvature of equipotential lines is great and the space between adjacent equipotential lines is narrow at the position that corresponds to the peak E4. It is also shown from a comparison of FIG. 29 and FIG. 69 regarding the conventional semiconductor device that the space between equipotential lines at the peak E4 portion in FIG. 29 is narrower than that at the peak E0 portion in FIG. 69. Thus the electric field value at the peak E4 portion in FIG. 29 is presumably higher than the electric field value at the peak E0 portion in FIG. 69, which leads to the conclusion that the breakdown voltage of the conventional semiconductor device is not improved in the FIG. 27A structure.

Figure 30A:
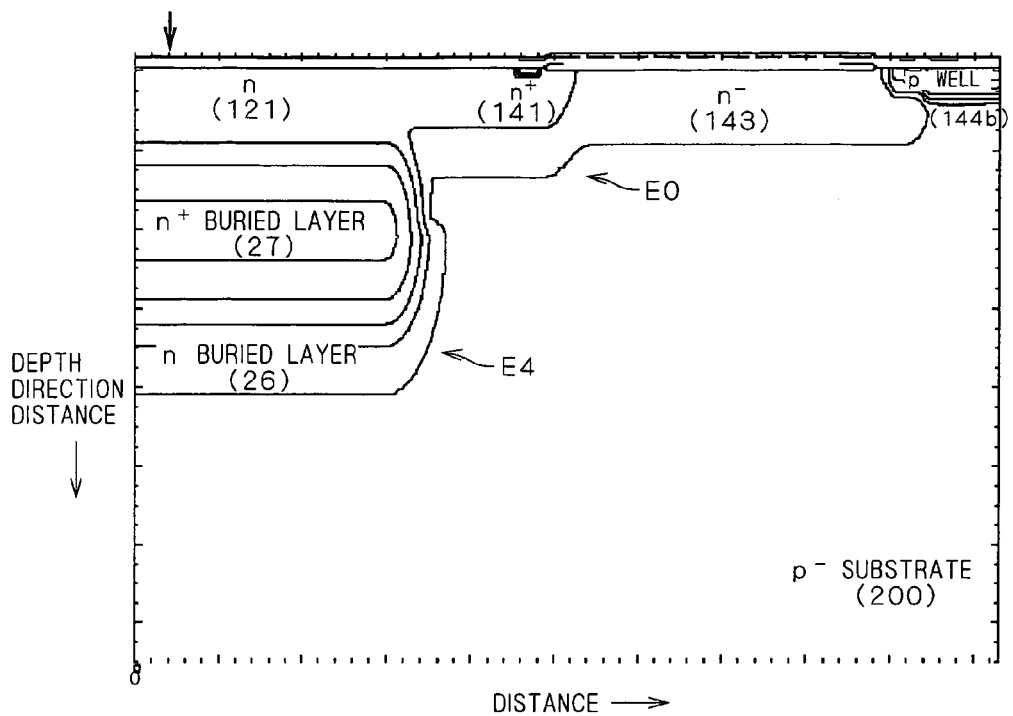
FIGS. 30A and 30B show the structure of the high breakdown voltage diode part and an impurity concentration profile in the semiconductor device according to the fifth preferred embodiment.
Figure 30B:
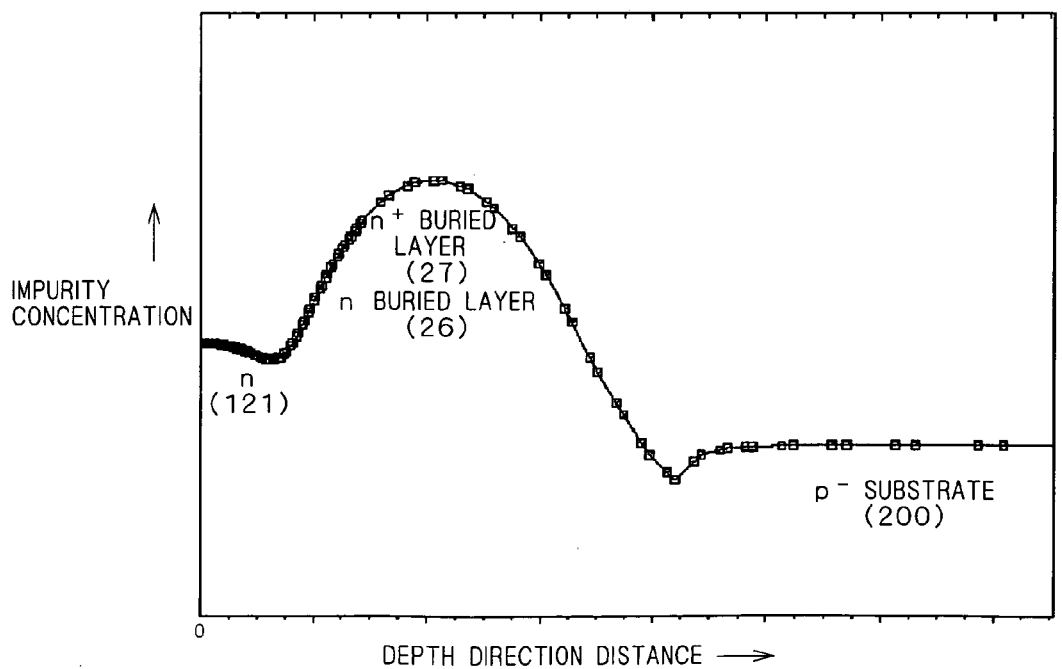

In the meantime, FIG. 30A shows a simplified structure of the high breakdown voltage diode part according to the fifth preferred embodiment on condition of L3<L1. FIG. 30B shows an impurity concentration profile from the upper surface of the n-type impurity region 121 toward the depth direction of the p⁻ substrate 200 with respect to an arrow-indicated position in FIG. 30A.

Figure 31:
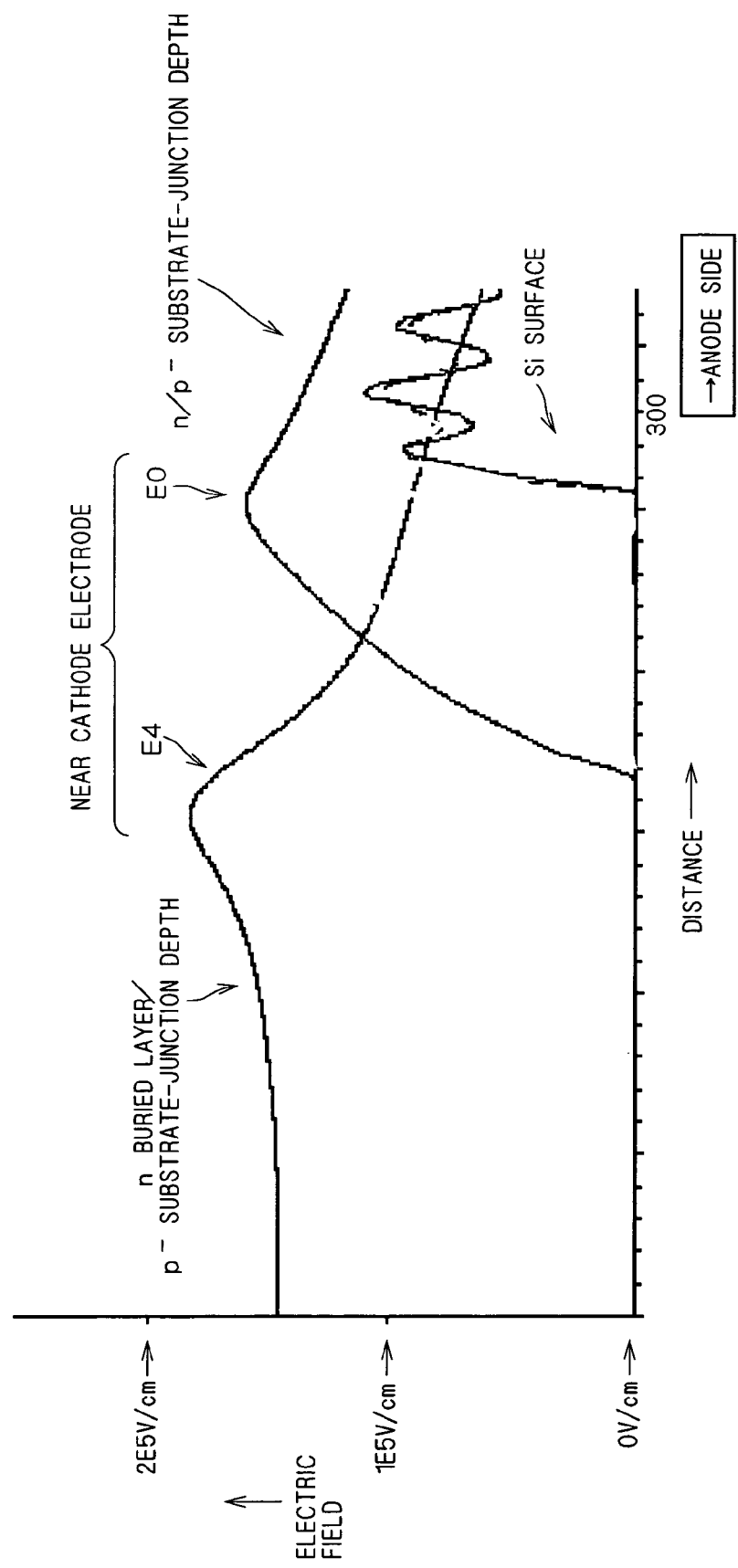
FIG. 31 is a graph showing electric fields upon application of a high voltage across the anode and the cathode in the semiconductor device according to the fifth preferred embodiment.

FIG. 31 is a graph showing electric fields upon application of a high voltage across the anode electrode 145 and the cathode electrode 142 with respect to the FIG. 30A structure. As with FIG. 28, FIG. 31 shows an electric field on the Si surface, an electric field in the n/p⁻ substrate-junction depth, and an electric field in the n-buried layer/p⁻ substrate-junction depth. It is shown from a comparison of FIG. 31 and FIG. 68 that the peak E0 is slightly lower in the FIG. 30A structure than in the conventional semiconductor device. It is also shown from a comparison of FIG. 31 and FIG. 28 that the electric field value at the peak E4 in FIG. 31 is lower than the electric field value at the peak E4 in FIG. 28. In addition, the graph shown in FIG. 31 indicates the electric field value at the peak E4 is almost the same as the electric field value at the peak E0.

Figure 32:
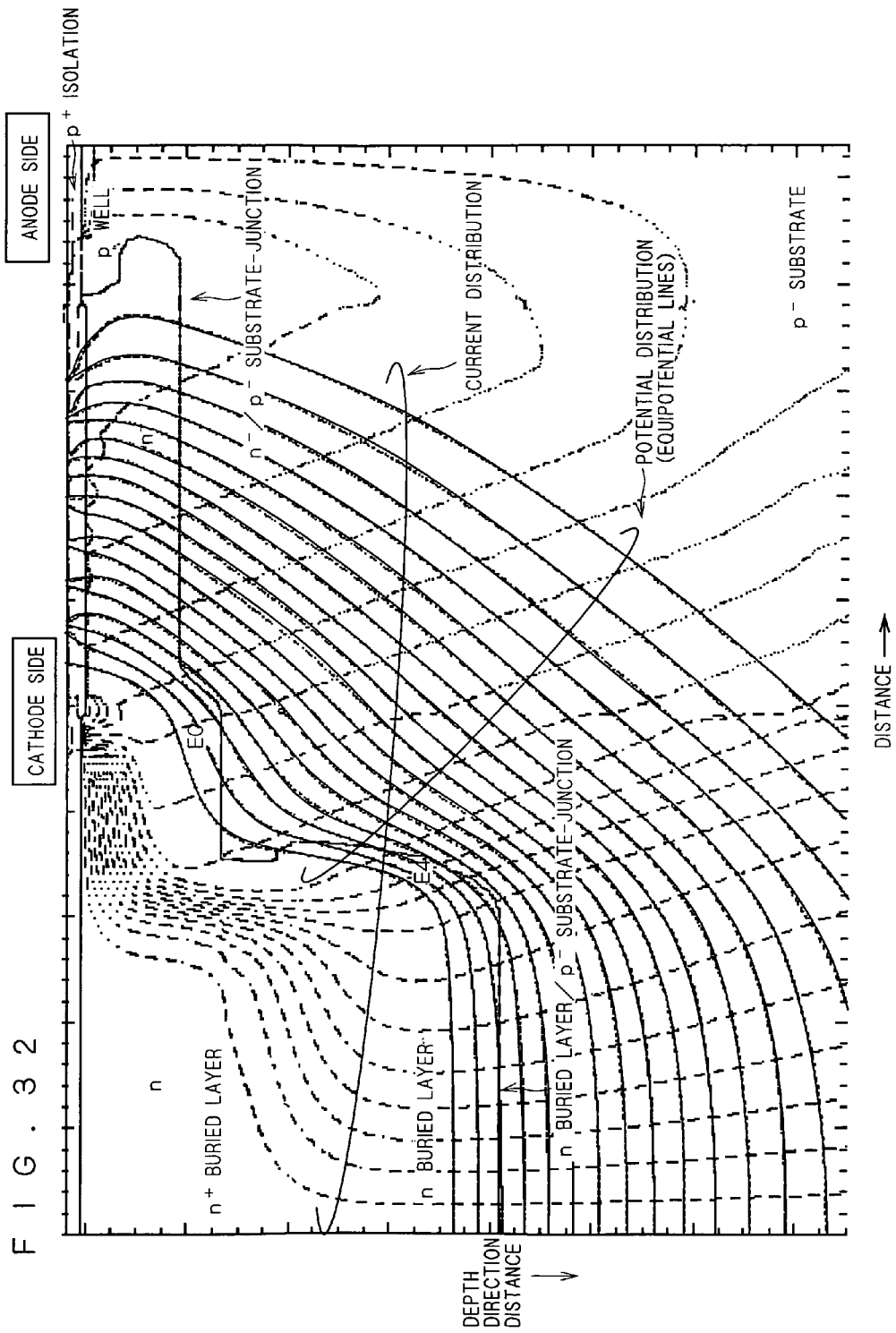
FIG. 32 shows potential distribution and current distribution upon application of a high voltage across the anode and the cathode in the semiconductor device according to the fifth preferred embodiment.

FIG. 32 shows potential distribution (equipotential lines) and current distribution upon application of a high voltage across the anode electrode 145 and the cathode electrode 142 with respect to the FIG. 30A structure. It is shown from a comparison of FIG. 32 and FIG. 69 that the curvature of equipotential lines at the peak E0 portion is much smaller in the FIG. 30A structure than in the conventional semiconductor device. Thus the electric field value at the peak E0 portion is presumably smaller. It is also shown from a comparison of FIG. 32 and FIG. 29 that the curvature of equipotential lines at the peak E4 portion is much smaller in the FIG. 30A structure than in the FIG. 27A structure. Thus the electric field value at the peak E4 portion is presumably smaller.

In this manner, in the semiconductor device according to the fifth preferred embodiment (FIG. 30A structure), the electric field values at the peak E0 portion and the peak E4 portion in FIG. 32 are smaller than the electric field value at the peak E0 portion in FIG. 69. Therefore, the anode-and-cathode-across voltage that leads to critical electric field strength can be increased higher than that of the conventional semiconductor device, attaining an increase in breakdown voltage of the semiconductor device.

In addition, the n⁺ buried layer 27 is formed in the n-buried layer 26 in such a manner as to satisfy the condition of L3<L1. Accordingly, upon application of a reverse-biased voltage across the p⁻ substrate 200, the n-type impurity region 121, the n⁺ buried layer 27, and the n-buried layer 26, a depletion layer that spreads in the n-type impurity region 121 and a depletion layer that spreads in the n-buried layer 26 get connected to each other at a curved surface of the n-buried layer 26. And the width of the depletion layer that spreads in the n-buried layer 26 is wider than the width of a depletion layer that spreads in the n⁺ buried layer 27 when L3=L1. This relieves the electric fields more effectively than when L3=L1, allowing an increase in junction breakdown voltage.

Further in the semiconductor device according to the fifth preferred embodiment, the n⁺ buried layer 27 is formed in the n-buried layer 26. Accordingly, the base resistance of a parasitic p-n-p bipolar transistor resulting from a p-n-p structure composed of the p⁻ substrate 200, the n-type impurity region 121, the n-buried layer 26, the n⁺ buried layer 27, and the p-well 131 is reduced lower than that of the semiconductor device according to the fourth preferred embodiment in which the n⁺ buried layer 27 is not formed. Thus, the operation of the parasitic p-n-p bipolar transistor is suppressed even in the event of negative fluctuations of the high-voltage-side floating offset voltage VS during the regenerative period. This allows an increase from the semiconductor device according to the fourth preferred embodiment in absolute value of operation-starting voltage of a parasitic thyristor resulting from a p-n-p-n structure composed of the p substrate 200, the n-type impurity region 121, the n-buried layer 26, the n⁺ buried layer 27, the p-well 131, and the n⁺-type source region 133, which in turn allows an increase in latchup breakdown resistance of the CMOS 12.

Whereas the invention according to the fifth preferred embodiment has been described with a high breakdown voltage diode as an example, the invention is applicable also to an n-channel high breakdown voltage MOSFET, a p-channel high breakdown voltage MOSFET, an n-channel IGBT, or a p-channel IGBT.

Moreover, the invention according to the fifth preferred embodiment is also applicable by combination with the inventions according to the first to third preferred embodiments. When combined with the invention according to the first preferred embodiment, for instance, the n⁺ buried layer 20 in FIG. 1 or the n-buried layer 21 in FIG. 6, and the n-buried layer 26 in FIG. 24 are connected to each other at the bottom surface of the n-type impurity region 121.

Sixth Preferred Embodiment

Figure 33:
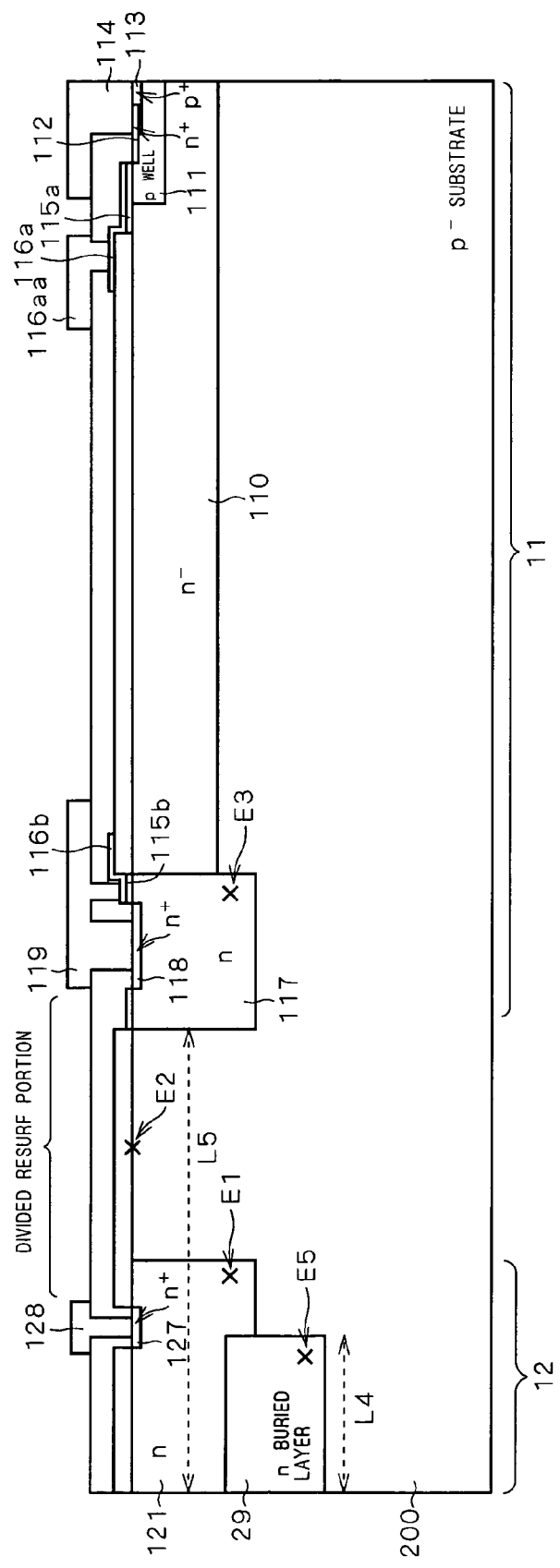
FIG. 33 is a cross-sectional view of the structure of a high breakdown voltage MOS part in a semiconductor device according to a sixth preferred embodiment of this invention.
Figure 58:
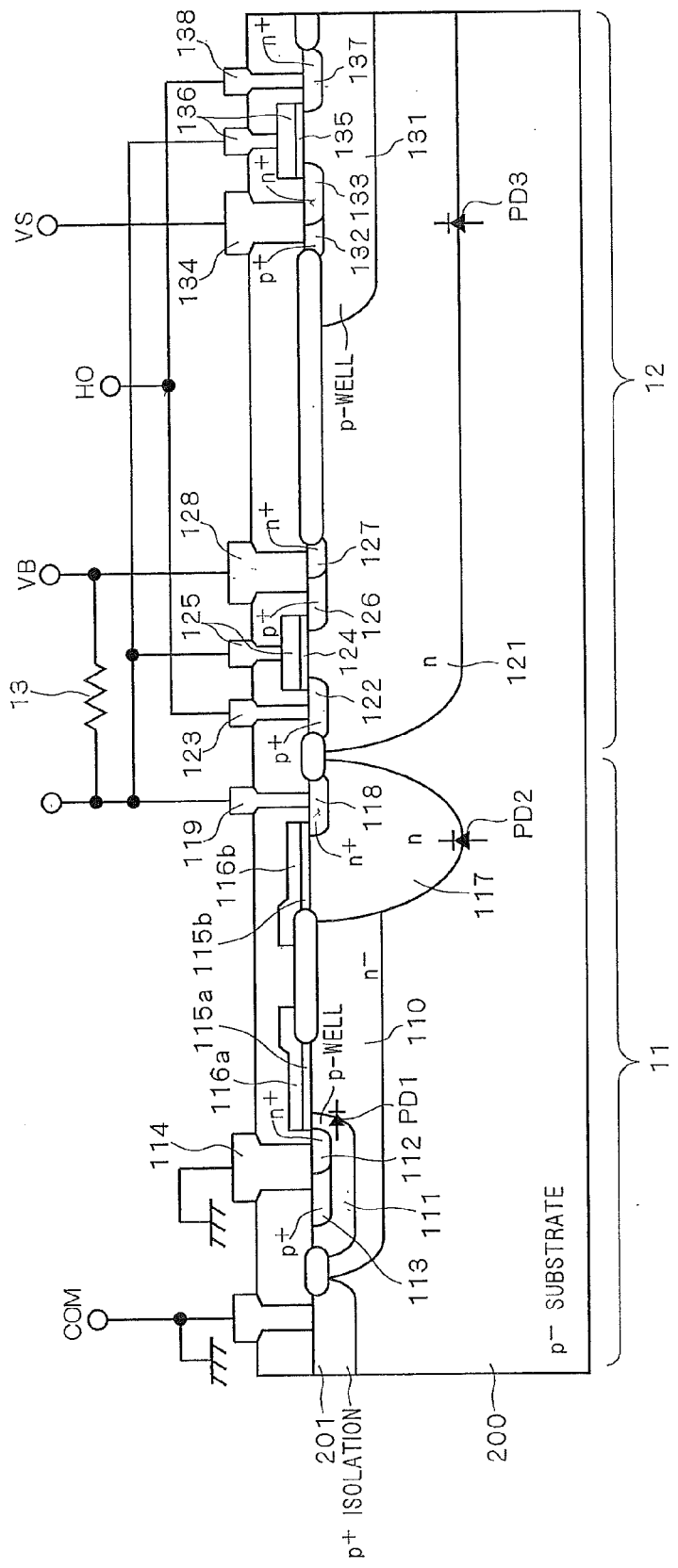
FIGS. 58 and 59 are cross-sectional views of the structure of the high-voltage-side driving section in a conventional semiconductor device.
Figure 70:
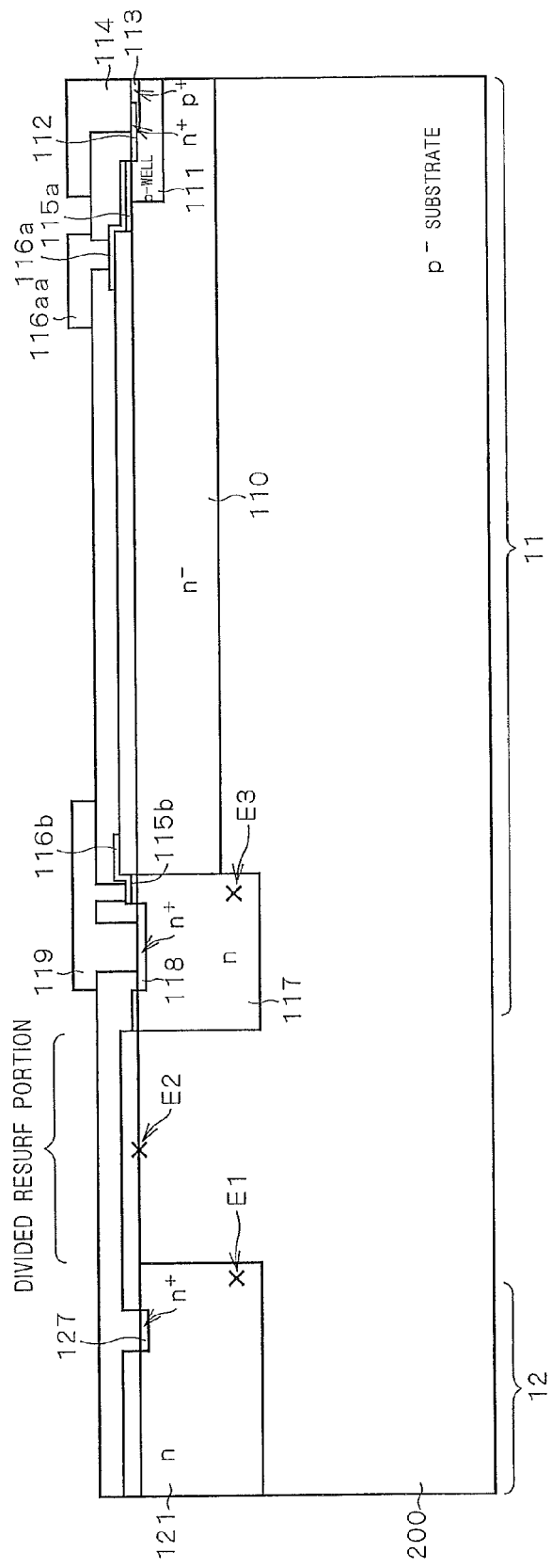
FIG. 70 is a cross-sectional view of the structure of the high breakdown voltage MOS part in the conventional semiconductor device.

FIG. 33 is a cross-sectional view of a semiconductor device according to a sixth preferred embodiment of this invention, showing an extracted region where the high breakdown voltage MOS 11 is formed from the FIG. 58 structure, correspondingly to FIG. 70 regarding the conventional semiconductor device. For convenience' sake, the positional relationship of the drain region 118 and the source region 112 in FIG. 58 is reversed in FIG. 33.

In the upper surface of the p⁻ substrate 200, the n-type impurity regions 117 and 121 are formed apart from each other, to form divided RESURF structure. In the upper surface of the n-type impurity region 117, the n⁺-type drain region 118 is formed in contact with the drain electrode 119 of the high breakdown voltage MOS 11. In the upper surface of the n-type impurity region 121, the n⁺-type impurity region 127 is formed in contact with the source electrode (hereafter called "VB electrode") 128 of the pMOSFET forming the CMOS 12. The VB electrode 128 is connected to the VB terminal, as shown in FIG. 1.

An n-type impurity region (hereafter called "n-buried layer") 29 is formed in contact with the bottom surface of the n-type impurity region 121 in the p⁻ substrate 200. By way of example, the peak value of impurity concentration of the n-buried layer 29 is of the order of $10^{15}$ cm⁻³. Letting the width of the n-buried layer 29 be L4 and the length from a left side surface of the n-type impurity region 121 to a left side surface of the n-type impurity region 117 be L5 in FIG. 33, the width of the n-buried layer 29 is determined in such a manner as to satisfy the condition of L4<L5 so that the n-buried layer 29 is not in contact with the n-type impurity region 117. Note, however, that as the width L4 increases and the n-buried layer 29 comes closer to the n-type impurity region 117, the breakdown voltage across the VB electrode 128 and the drain electrode 119 (divided-n-well-across breakdown voltage) decreases. Because of this, it is required that the space between the n-buried layer 29 and the n-type impurity region 117 be determined in such a manner as to ensure a desirable VB-and-drain-across breakdown voltage (which is set to approximately 15 V or higher by way of example in the sixth preferred embodiment) specified by design specifications.

With respect to the FIG. 33 structure, main electric field peaks upon application of a high voltage across the VB electrode 128 and the source electrode 114 (across VB and source) by short-circuiting the electrode 116aa connected to the gate electrode 116a and the source electrode 114 through the application of a voltage of approximately 15 V across the VB electrode 128 and the drain electrode 119, are the peak E2 in the p⁻ substrate 200, the peak E1 located in the right lower edge part of the n-type impurity region 121, the peak E3 located in the right lower edge part of the n-type impurity region 117, and a peak E5 located in the right lower edge part of the n-buried layer 29.

FIG. 34 is a graph showing the correlation between (L4−L5) and the VB-and-source-across breakdown voltage, the (L4−L5) in the lateral axis indicating the relationship between the width L4 and the length L5 in FIG. 33. It is shown that the VB-and-source-across breakdown voltage increases higher than that of the conventional semiconductor device by reducing the value of (L4−L5) to less than zero, namely by setting L4<L5. It is also shown that the VB-and-source-across breakdown voltage increases as the value of (L4−L5) increases. Note, however, that a too much increase of the value of (L4−L5) causes a depletion layer that spreads from the n-type impurity region 121 and a depletion layer that spreads from the n-type impurity region 117 to get connected to each other upon application of the VB potential as low as approximately 15 V, resulting in the VB-and-drain-across breakdown voltage falling short of approximately 15 V. For that reason, data in that range (range of the right side of dashed lines in FIG. 34) is not plotted.

FIG. 35A shows a simplified structure of the high breakdown voltage MOS part according to the sixth preferred embodiment on conditions of L4<L5, and the VB-and-drain-across breakdown voltage being approximately 15 V or higher. FIG. 35B shows an impurity concentration profile from the upper surface of the n-type impurity region 121 toward the depth direction of the p⁻ substrate 200 with respect to an arrow-indicated position in FIG. 35A.

Figure 36:
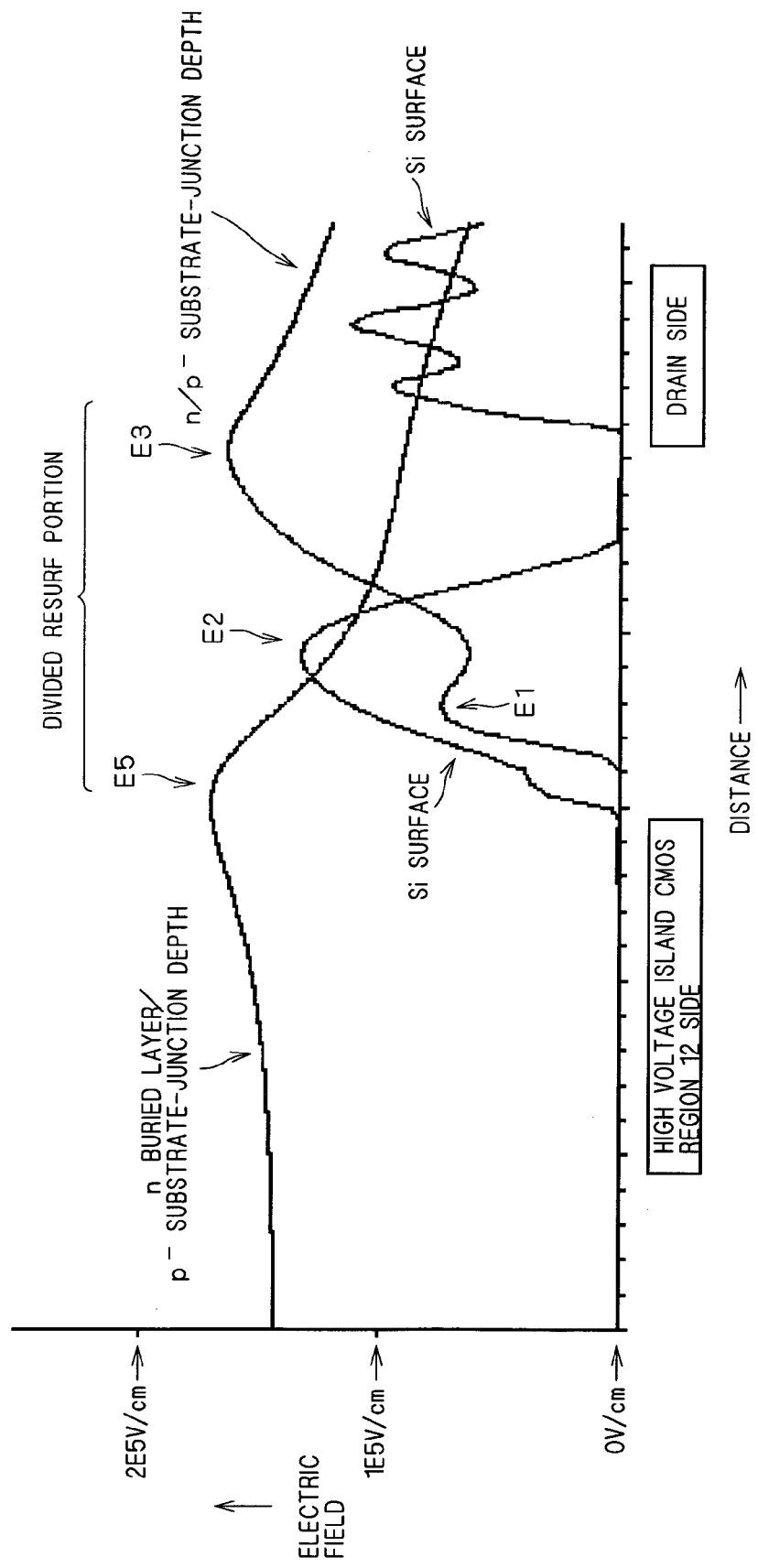
FIG. 36 is a graph showing electric fields upon application of a high voltage across VB and a source in the semiconductor device according to the sixth preferred embodiment.

FIG. 36 is a graph showing electric fields upon application of a high voltage across the VB electrode 128 and the source electrode 114 by short-circuiting the electrode 116aa connected to the gate electrode 116a and the source electrode 114 through the application of a voltage of approximately 15 V across the VB electrode 128 and the drain electrode 119, with respect to the FIG. 35A structure. FIG. 36 shows an electric field on the upper surface of the p⁻ substrate 200 (Si surface), an electric field at the interface between the n-type impurity regions 121 and 117, and the p⁻ substrate 200 (n/p⁻ substrate-junction depth), and an electric field at the interface between the n-buried layer 29 and the p⁻ substrate 200 (n-buried layer/p⁻ substrate-junction depth). It is shown from a comparison of FIG. 36 and FIG. 71 that the peaks E1 and E2 are much lower and the peak E3 is slightly lower in the FIG. 35A structure than in the conventional semiconductor device. It is also clear from the graph shown in FIG. 36 that the electric field value at the peak E5 is almost the same as the electric field value at the peak E3. The electric field values at the peaks E3 and E5 in FIG. 36 are lower than the electric field value at the peak E2 in FIG. 71.

Figure 37:
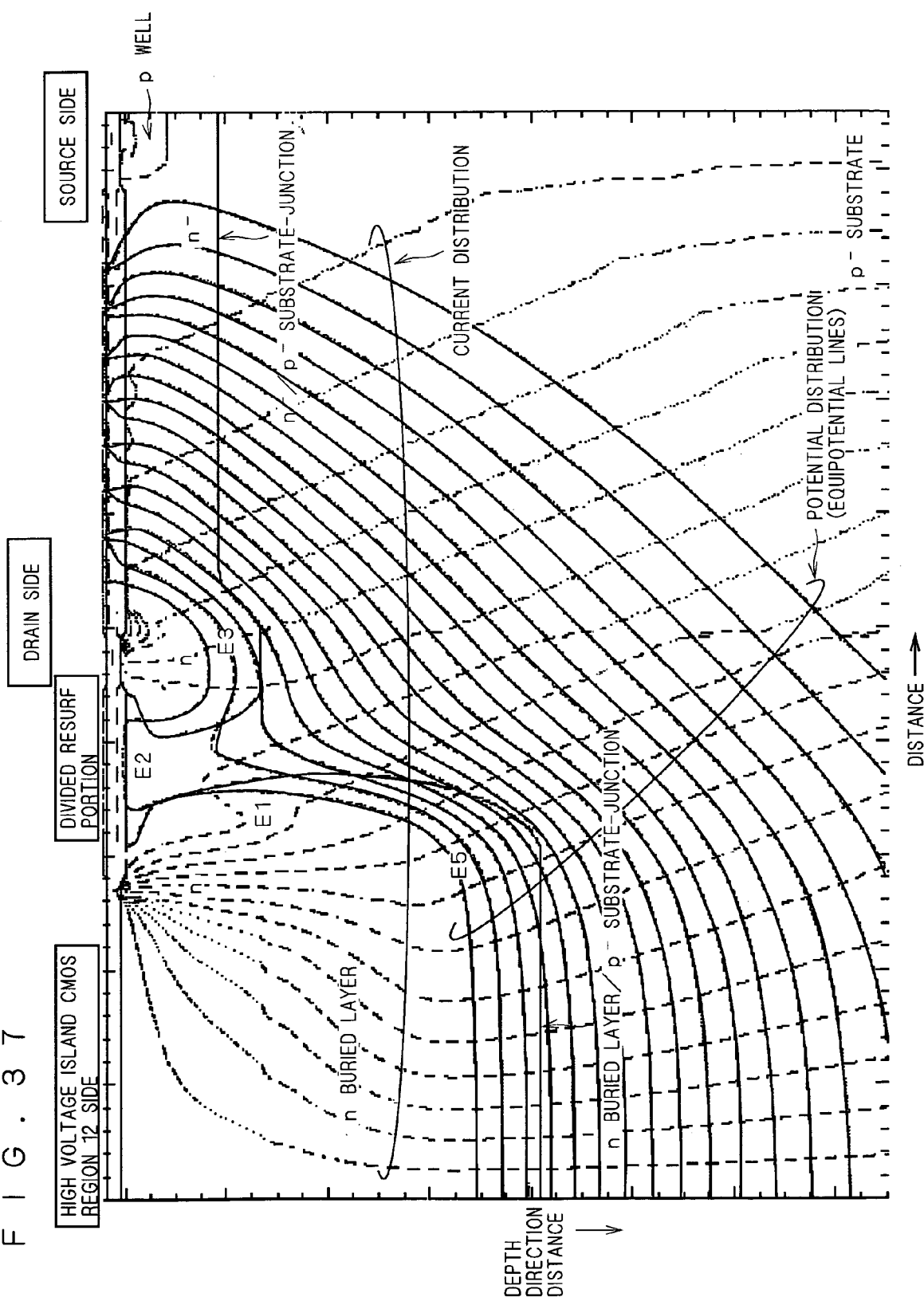
FIG. 37 shows potential distribution and current distribution upon application of a high voltage across the VB and the source in the semiconductor device according to the sixth preferred embodiment.
Figure 72:
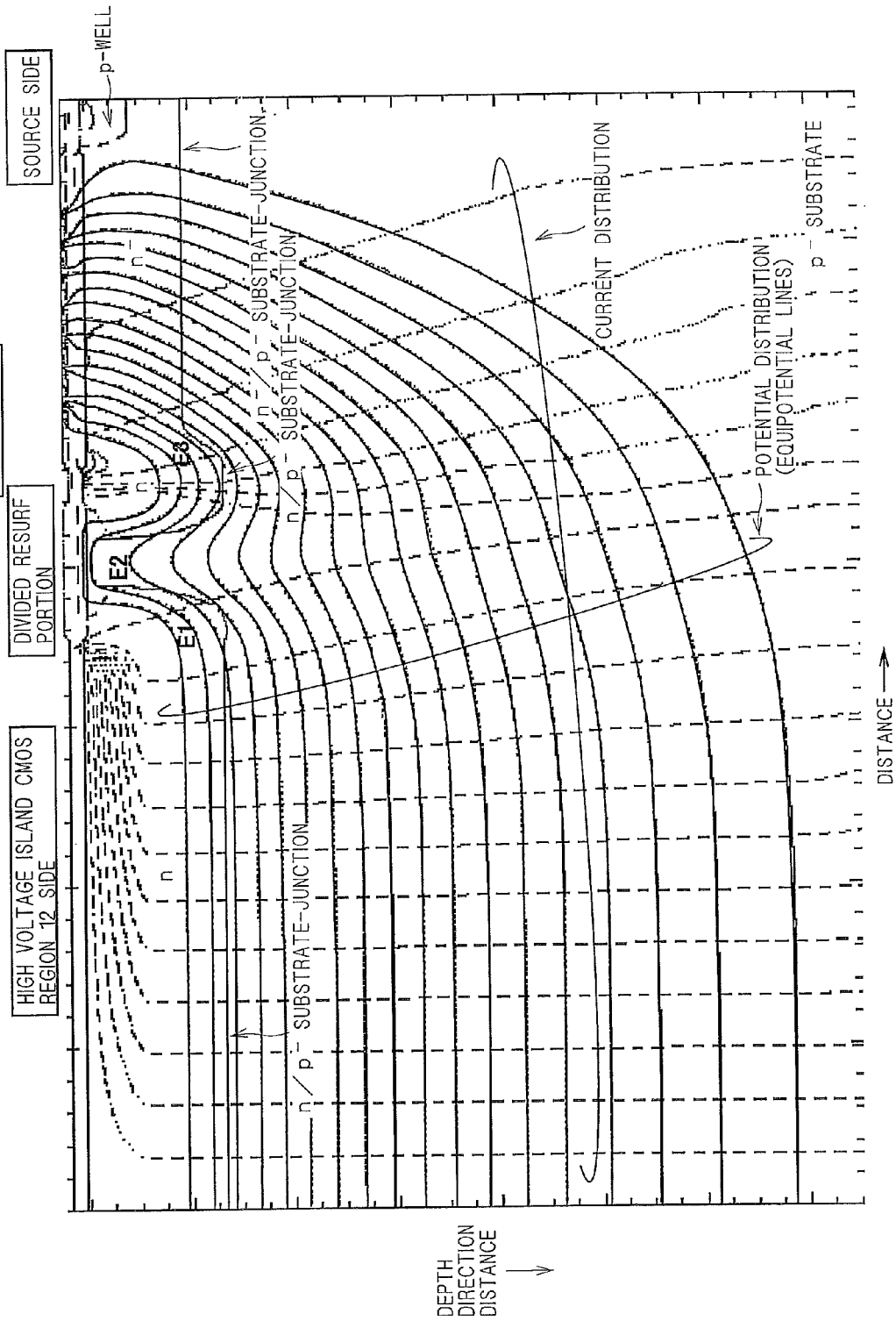
FIG. 72 shows potential distribution and current distribution upon application of a high voltage across the VB and the source in the conventional semiconductor device.

FIG. 37 shows potential distribution (equipotential lines) and current distribution upon application of a high voltage across the VB electrode 128 and the source electrode 114 with respect to the FIG. 35A structure. It is shown from a comparison of FIG. 37 and FIG. 72 that the curvature of equipotential lines at the peak E1 portion is much smaller in the FIG. 35A structure because of the additional n-buried layer 29 than in the conventional semiconductor device. Consequently, the space between adjacent equipotential lines at the peak E1 portion becomes wider, and the electric field value at the peak E1 portion becomes smaller. In response to the curvature reduction of equipotential lines at the peak E1 portion, the space between adjacent equipotential lines at the peak E2 portion becomes wider, and the electric field value at the peak E2 portion becomes smaller. In response to the widening of space between equipotential lines at the peak E2 portion, the curvature of equipotential lines at the peak E3 portion also becomes smaller. Consequently, the space between adjacent equipotential lines at the peak E3 portion also becomes wider, and the electric field value at the peak E3 portion also becomes smaller.

Figure 71:
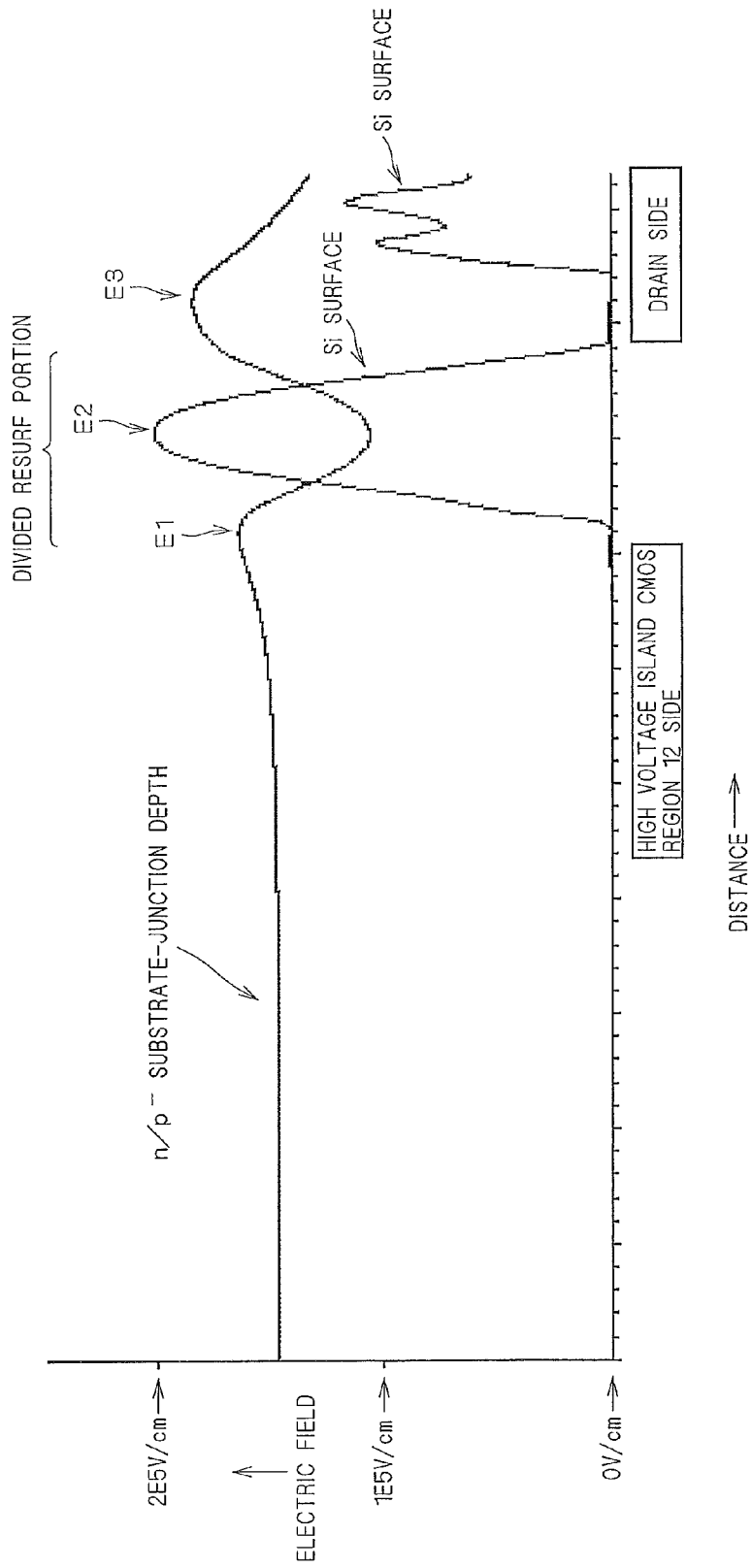
FIG. 71 is a graph showing electric fields upon application of a high voltage across VB and the source in the conventional semiconductor device.

In this manner, in the semiconductor device according to the sixth preferred embodiment, the electric field values at the peaks E3 and E5 in FIG. 36 are smaller than the electric field values at the peaks E2 and E3 in FIG. 71. Therefore, the VB-and-source-across voltage that leads to critical electric field strength can be increased higher than that of the conventional semiconductor device, attaining an increase in breakdown voltage of the semiconductor device.

Whereas the invention according to the sixth preferred embodiment has been described with an n-channel high breakdown voltage MOSFET as an example, the invention is applicable also to a p-channel high breakdown voltage MOSFET, an n-channel IGBT, or a p-channel IGBT.

Moreover, the invention according the sixth preferred embodiment is also applicable by combination with the inventions according to the first to third preferred embodiments. When combined with the invention according to the first preferred embodiment, for instance, the n⁺ buried layer 20 in FIG. 1 or the n-buried layer 21 in FIG. 6, and the n-buried layer 29 in FIG. 33 are connected to each other at the bottom surface of the n-type impurity region 121.

Seventh Preferred Embodiment

FIG. 38 is a cross-sectional view of the structure of a semiconductor device according to a seventh preferred embodiment of this invention, correspondingly to FIG. 33. An n⁺-type impurity region (hereafter called "n⁺ buried layer") 30 having an impurity concentration higher than that of the n-buried layer 29 is formed in the n-buried layer 29, on the basis of the FIG. 33 structure. By way of example, the peak value of impurity concentration of the n⁺ buried layer 30 is of the order of $10^{18}$ cm⁻³. A width L6 of the n⁺ buried layer 30 is narrower than the width L4 of the n-buried layer 29 and a width L7 of the n-type impurity region 121. In short, the n⁺ buried layer 30 is formed not to protrude from a side surface (right side surface in FIG. 38) of the n-buried layer 29 and a side surface (right side surface in FIG. 38) of the n-type impurity region 121 toward the n-type impurity region 117 side.

FIG. 39 is a graph showing the correlation between (L6−L4) and the breakdown voltage, the (L6−L4) in the lateral axis indicating the relationship between the width L6 of the n⁺ buried layer 30 and the width L4 of the n-buried layer 29 in FIG. 38. It is shown that the breakdown voltage is highly ensured when L6<L4, but the breakdown voltage decreases rapidly with an increase in L6 and increasing value of L6−L4.

FIG. 40A shows a simplified structure of the high breakdown voltage MOS part according to the seventh preferred embodiment on condition of L6<L4. FIG. 40B shows an impurity concentration profile from the upper surface of the n-type impurity region 121 toward the depth direction of the p⁻ substrate 200 with respect to an arrow-indicated position in FIG. 40A. It is shown from a comparison of FIG. 40B and FIG. 35B that the impurity concentration is higher in the semiconductor device according to the seventh preferred embodiment because of the n⁺ buried layer 30 than in the semiconductor device according to the sixth preferred embodiment.

Figure 41:
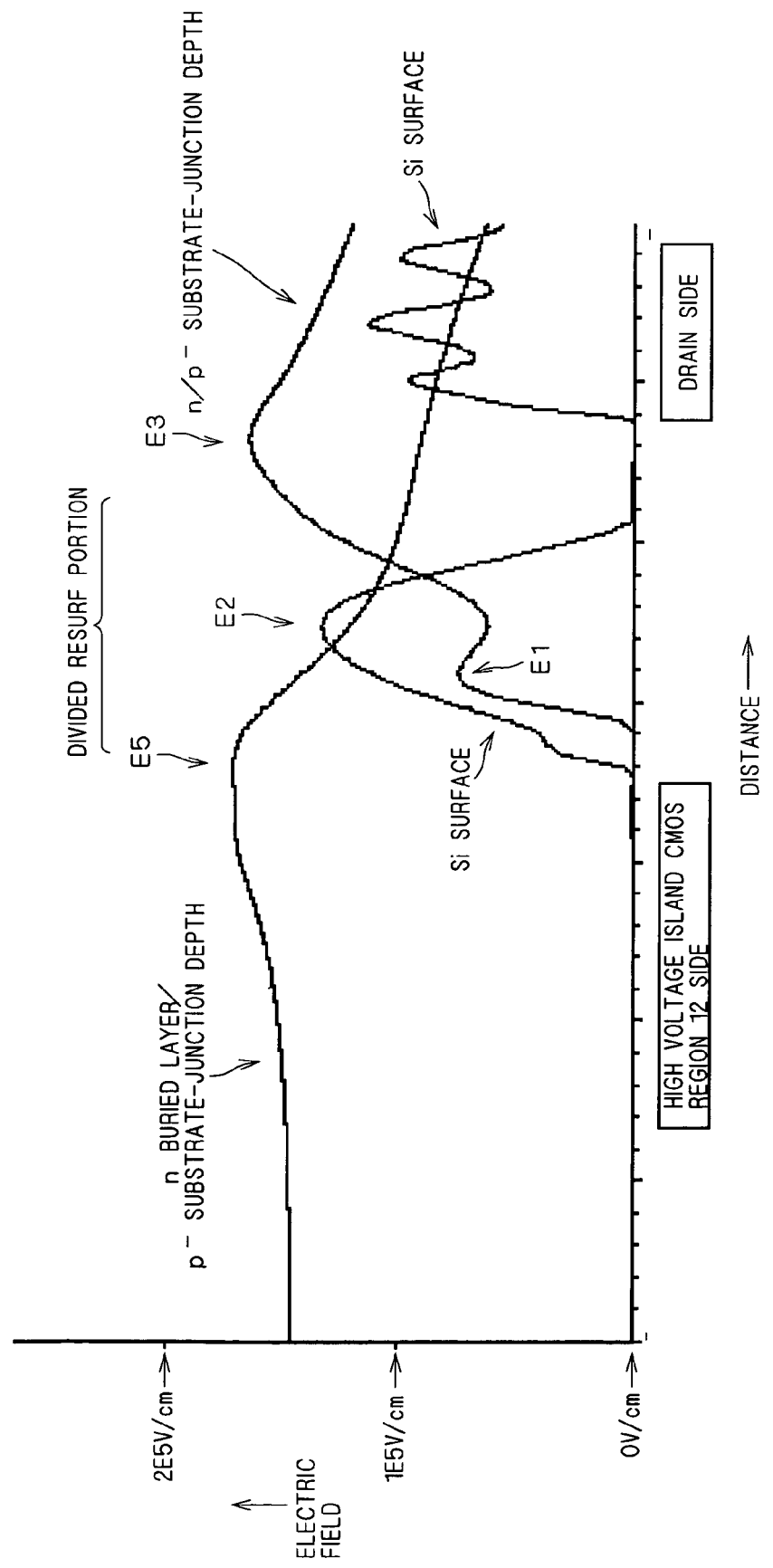
FIG. 41 is a graph showing electric fields upon application of a high voltage across VB and a source in the semiconductor device according to the seventh preferred embodiment.

FIG. 41 is a graph showing electric fields upon application of a high voltage across the VB electrode 128 and the source electrode 114 by short-circuiting the electrode 116aa connected to the gate electrode 116a and the source electrode 114 through the application of a voltage of approximately 15 V across the VB electrode 128 and the drain electrode 119, with respect to the FIG. 40A structure. As with FIG. 36, FIG. 41 shows an electric field on the Si surface, an electric field in the n/p substrate-junction depth, and an electric field in the n-buried layer/p⁻ substrate-junction depth. It is shown from a comparison of FIG. 41 and FIG. 36 that the electric field characteristics in the semiconductor device according to the seventh preferred embodiment are similar to those of the semiconductor device according to the sixth preferred embodiment. In short, as with the semiconductor device according to the sixth preferred embodiment, the electric field values at the peaks E3 and E5 in FIG. 41 are smaller than the electric field values at the peaks E2 and E3 in FIG. 71 in the semiconductor device according to the seventh preferred embodiment as well. Therefore, the VB-and-source-across voltage that leads to critical electric field strength can be increased higher than that of the conventional semiconductor device, attaining an increase in breakdown voltage of the semiconductor device.

Figure 42:
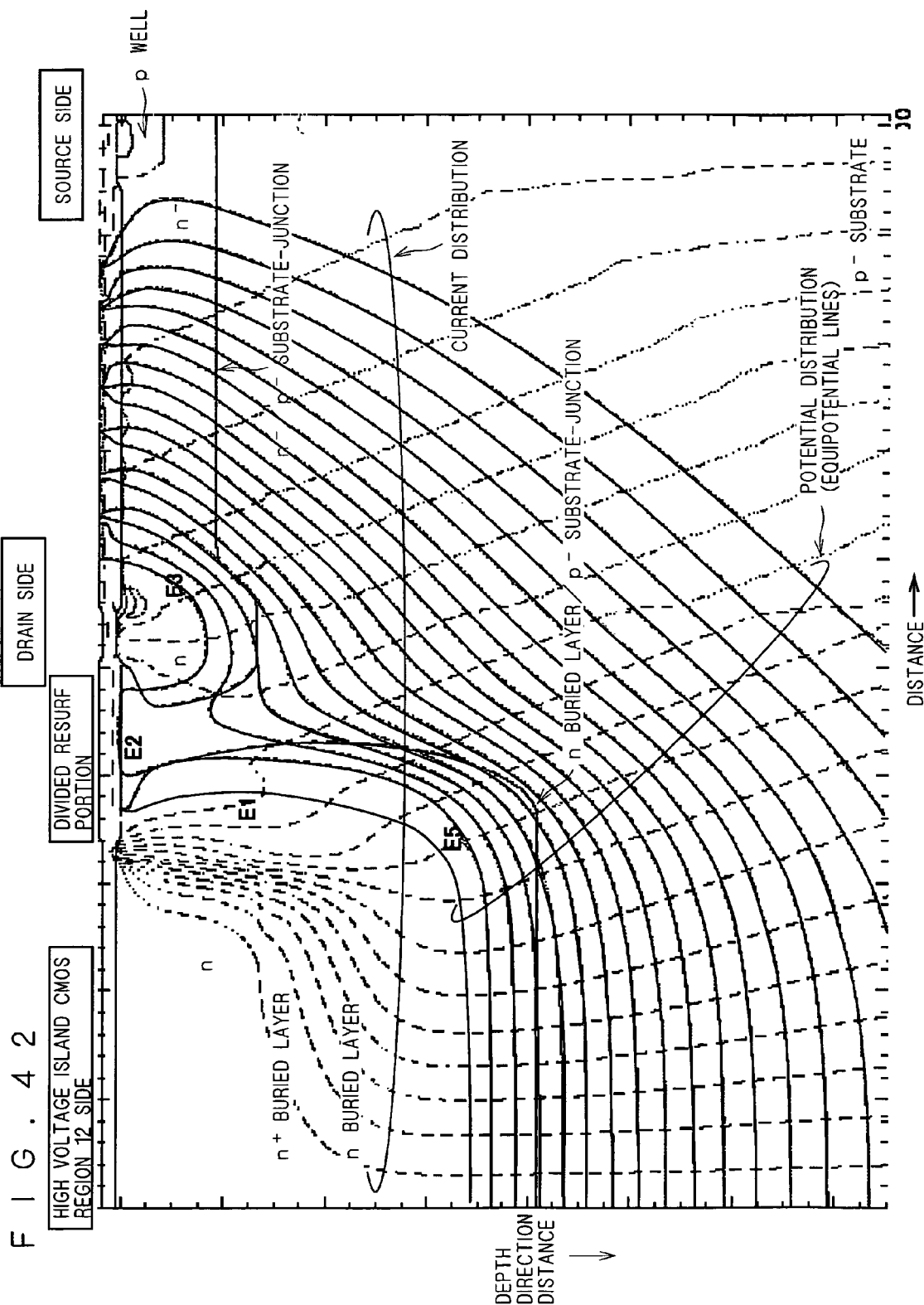
FIG. 42 shows potential distribution and current distribution upon application of a high voltage across the VB and the source in the semiconductor device according to the seventh preferred embodiment.

FIG. 42 shows potential distribution (equipotential lines) and current distribution upon application of a high voltage across the VB electrode 128 and the source electrode 114 with respect to the FIG. 40A structure. It is shown from a comparison of FIG. 42 and FIG. 72 that the curvature of equipotential lines at the peak E1 portion is much smaller in the FIG. 40A structure because of the additional n-buried layer 29 than in the conventional semiconductor device. Consequently, the space between adjacent equipotential lines at the peak E1 portion becomes wider, and the electric field value at the peak E1 portion becomes smaller. In response to the curvature reduction of equipotential lines at the peak E1 portion, the space between adjacent equipotential lines at the peak E2 portion becomes wider, and the electric field value at the peak E2 portion becomes smaller. In response to the widening of space between equipotential lines at the peak E2 portion, the curvature of equipotential lines at the peak E3 portion also becomes smaller. Consequently, the space between adjacent equipotential lines at the peak E3 portion also becomes wider, and the electric field value at the peak E3 portion also becomes smaller.

In this manner, in the semiconductor device according to the seventh preferred embodiment, the n⁺ buried layer 30 is formed in the n-buried layer 29 in such a manner as to satisfy the condition of L6<L4. Accordingly, upon application of a reverse-biased voltage across the p⁻ substrate 200, the n-type impurity region 121, the n⁺ buried layer 30, and the n-buried layer 29, a depletion layer that spreads in the n-type impurity region 121 and a depletion layer that spreads in the n-buried layer 29 get connected to each other at a curved surface of the n-buried layer 29. And the width of the depletion layer that spreads in the n-buried layer 29 is wider than the width of a depletion layer that spreads in the n⁺ buried layer 30 when L6=L4. This relieves the electric fields more effectively than when L6=L4, allowing an increase in junction breakdown voltage.

Further in the semiconductor device according to the seventh preferred embodiment in which the n⁺ buried layer 30 is formed in the n-buried layer 29, the base resistance of a parasitic p-n-p bipolar transistor resulting from a p-n-p structure composed of the p⁻ substrate 200, the n-type impurity region 121, the n-buried layer 29, the n⁺ buried layer 30, and the p-well 131 is reduced lower than that of the semiconductor device according to the sixth preferred embodiment in which the n⁺ buried layer 30 is not formed. Thus, the operation of the parasitic p-n-p bipolar transistor is suppressed even in the event of negative fluctuations of the high-voltage-side floating offset voltage VS during the regenerative period. This allows an increase from the semiconductor device according to the sixth preferred embodiment in absolute value of operation-starting voltage of a parasitic thyristor resulting from a p-n-p-n structure composed of the p⁻ substrate 200, the n-type impurity region 121, the n-buried layer 29, the n⁺ buried layer 30, the p-well 131, and the n⁺-type source region 133, which in turn allows an increase in latchup breakdown resistance of the CMOS 12.

Whereas the invention according to the seventh preferred embodiment has been described with an n-channel high breakdown voltage MOSFET as an example, the invention is applicable also to a p-channel high breakdown voltage MOSFET, an n-channel IGBT, or a p-channel IGBT.

Moreover, the invention according the seventh preferred embodiment is also applicable by combination with the inventions according to the first to third preferred embodiments. When combined with the invention according to the first preferred embodiment, for instance, the n⁺ buried layer 20 in FIG. 1 or the n-buried layer 21 in FIG. 6, and the n-buried layer 29 in FIG. 38 are connected to each other at the bottom surface of the n-type impurity region 121.

Eighth Preferred Embodiment

The inventions according to the first to third preferred embodiments are also applicable to the low-voltage-side driving section of the power device-driving device.

Figure 43:
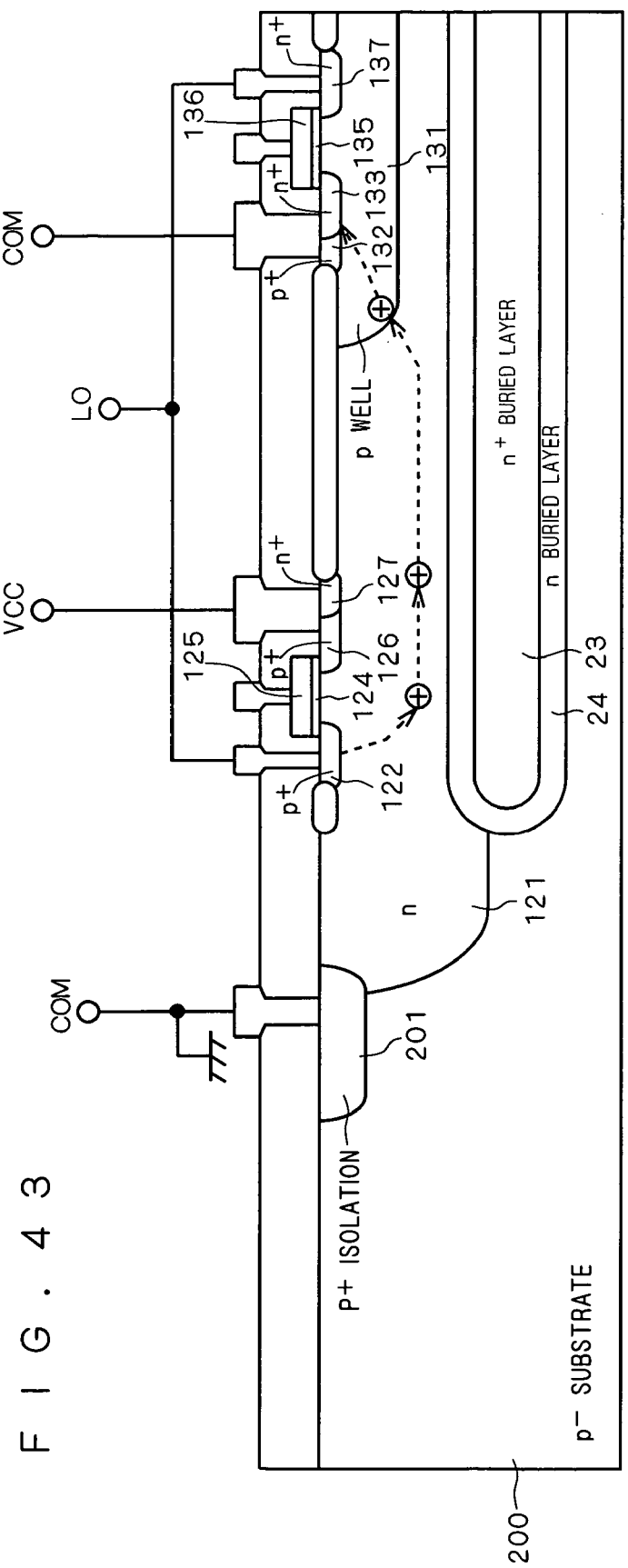
FIG. 43 is a cross-sectional view of the structure of a low-voltage-side driving section in a semiconductor device according to an eighth preferred embodiment of this invention.

FIG. 43 is a cross-sectional view of the structure of the low-voltage-side driving section 102 according to an eighth preferred embodiment of this invention. This is a case where the invention according to the third preferred embodiment is applied to the low-voltage-side driving section 102. The p⁺-type drain region 122 of the pMOSFET and the n⁺-type drain region 137 of the nMOSFET are connected to the LO terminal. The p⁺-type source region 126 of the pMOSFET is connected to the VCC terminal. The n⁺-type source region 133 of the nMOSFET is connected to the COM terminal. The n⁺ buried layer 23 is formed in contact with the bottom surface of the n-type impurity region 121 in the p⁻ substrate 200. The n-buried layer 24 is formed to cover the circumference of the n⁺ buried layer 23 while being in contact with the bottom surface of the n-type impurity region 121 in the p⁻ substrate 200.

In the low-voltage-side driving section 102, there exists a parasitic thyristor resulting from a p-n-p-n structure composed of the p⁺-type drain region 122, the n-type impurity region 121, the p-well 131, and the n⁺-type source region 133. Accordingly, upon application of a surge voltage higher than the VCC voltage to the LO terminal, holes flow from the p⁺-type drain region 122 connected to the LO terminal into the n-type impurity region 121. The hole current then flows into the p-well 131, causing a parasitic n-p-n bipolar transistor composed of the n-type impurity region 121, the p-well 131, and the n⁺-type source region 133, and a parasitic p-n-p bipolar transistor composed of the p⁺-type drain region 122, the n-type impurity region 121, and the p-well 131 to operate, possibly causing latchup in the parasitic thyristor mentioned above.

On the contrary, in the semiconductor device according to the eighth preferred embodiment in which the n+ buried layer 23 and the n-buried layer 24 are formed in contact with the bottom surface of the n-type impurity region 121, the base resistance of the above parasitic p-n-p bipolar transistor is reduced. Thus, the operation of the above parasitic p-n-p bipolar transistor is suppressed even upon application of a surge voltage higher than the VCC voltage to the LO terminal, thereby suppressing latchup in the above parasitic thyristor.

Moreover, the junction breakdown voltage can be increased higher in the structure (FIG. 43) in which the invention according to the third preferred embodiment is applied to the low-voltage-side driving section 102 than in a structure in which the invention according to the first preferred embodiment is applied to the low-voltage-side driving section 102, for the same reasons as described in the third preferred embodiment.

Ninth Preferred Embodiment

FIG. 44 is a cross-sectional view of a simplified structure of the CMOS part in a semiconductor device according to a ninth preferred embodiment of this invention, correspondingly to FIG. 2A. Instead of the n+ buried layer 20 in the semiconductor device according to the first preferred embodiment, an n+-type impurity region (hereafter called "n+ buried layer") 31 having an impurity concentration higher than that of the n+ buried layer 20 is formed. By way of example, the peak value of impurity concentration of the n+ buried layer 31 is of the order of $10^{18}$ cm$^3$.

The n+ buried layer 31 is formed in contact with the bottom surface of the n-type impurity region 121 in the p− substrate 200 while completely spreading below the n+-type source region 133 formed in the upper surface of the p-well 131. Letting the width of the n+ buried layer 31 be "X" and the width of the p-well 131 be "Y", the relationship of X>Y holds in the FIG. 44 example.

Figure 45:
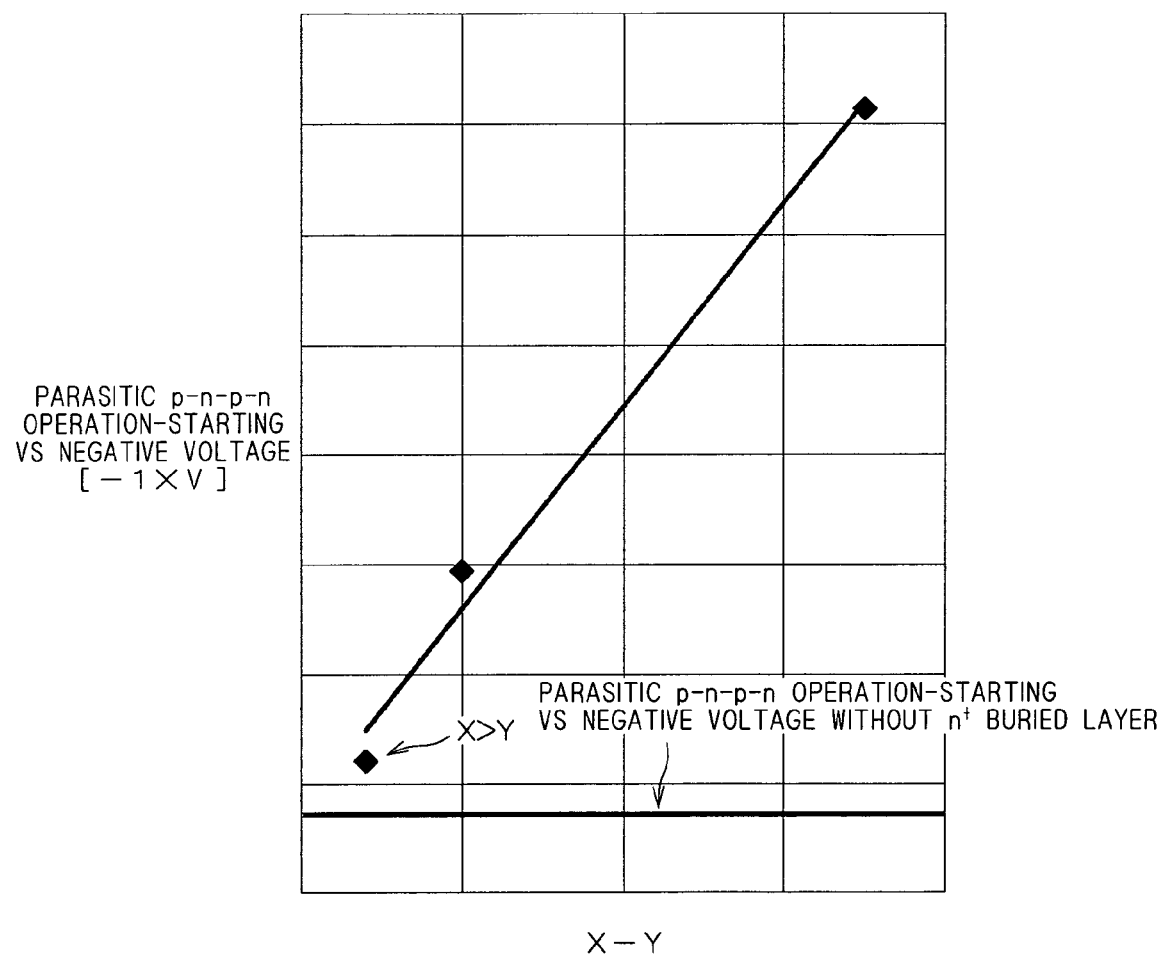
FIG. 45 is a graph showing the correlation between the width of an $n^+$-buried layer and the operation-starting voltage of a parasitic thyristor in the semiconductor device according to a ninth preferred embodiment.
Figure 60:
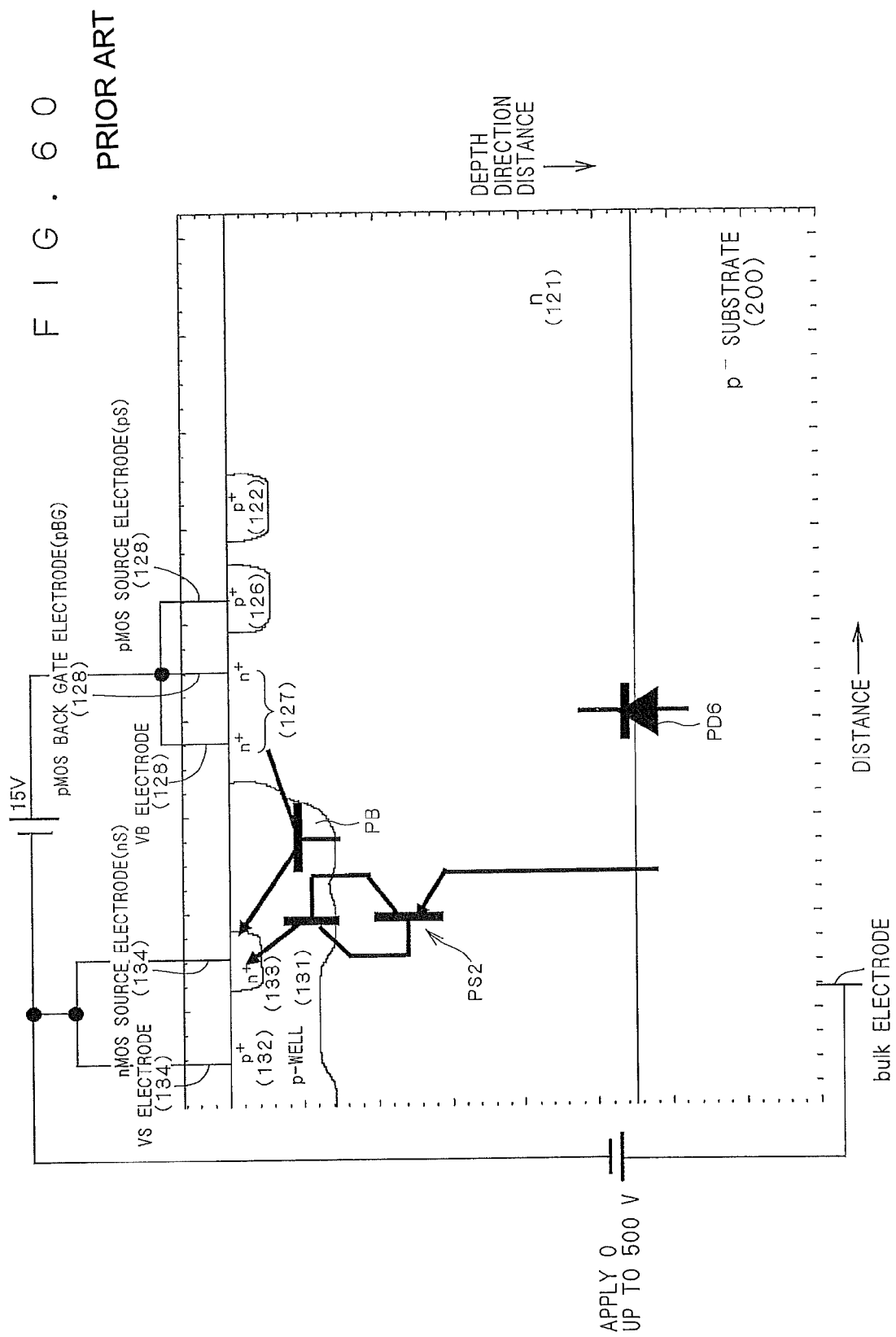
FIG. 60 is a cross-sectional view of the structure of a CMOS part in the conventional semiconductor device.
Figure 62:
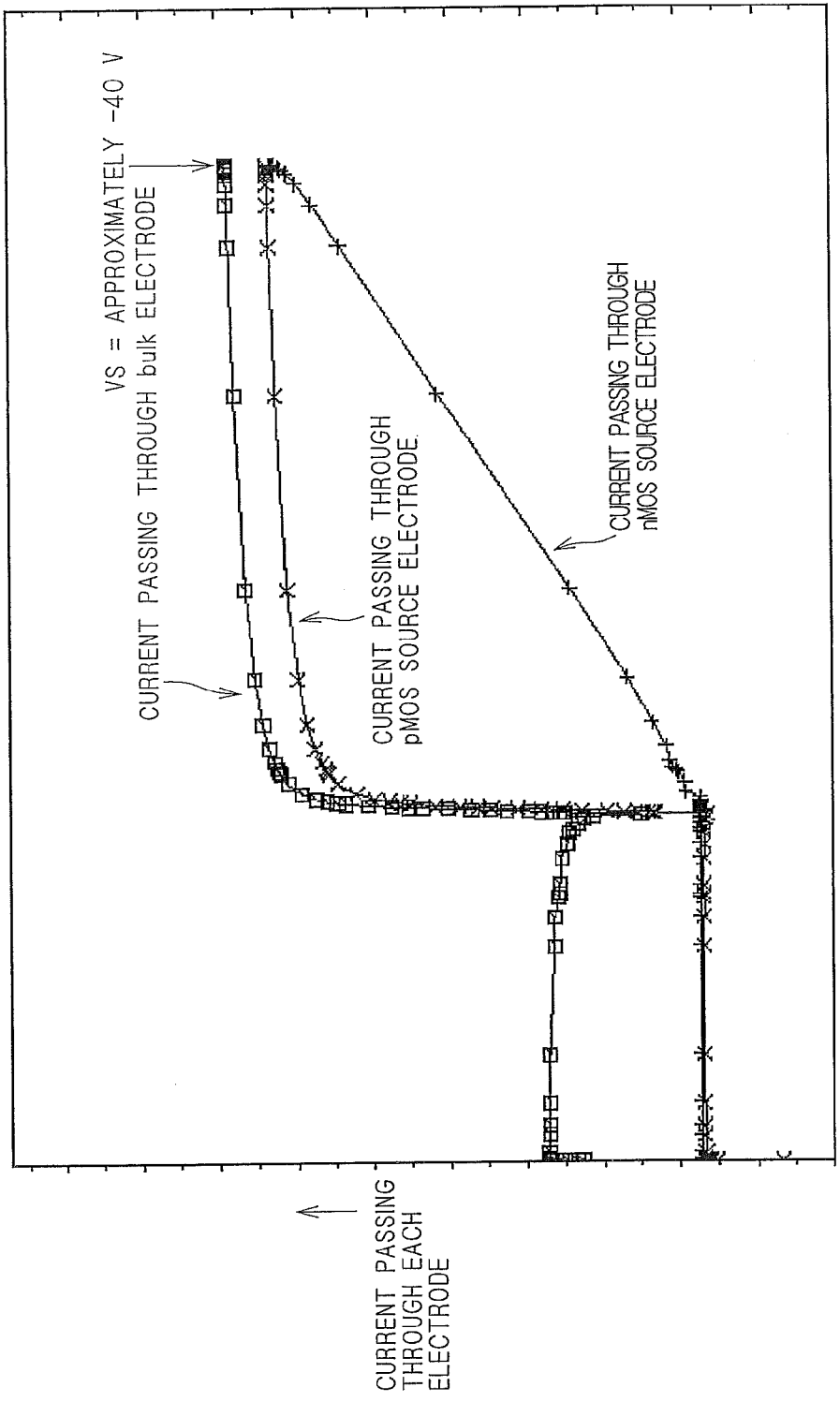
FIG. 62 is a graph showing the values of currents passing through electrodes upon application of the VS negative voltage in the conventional semiconductor device.
Figure 63:
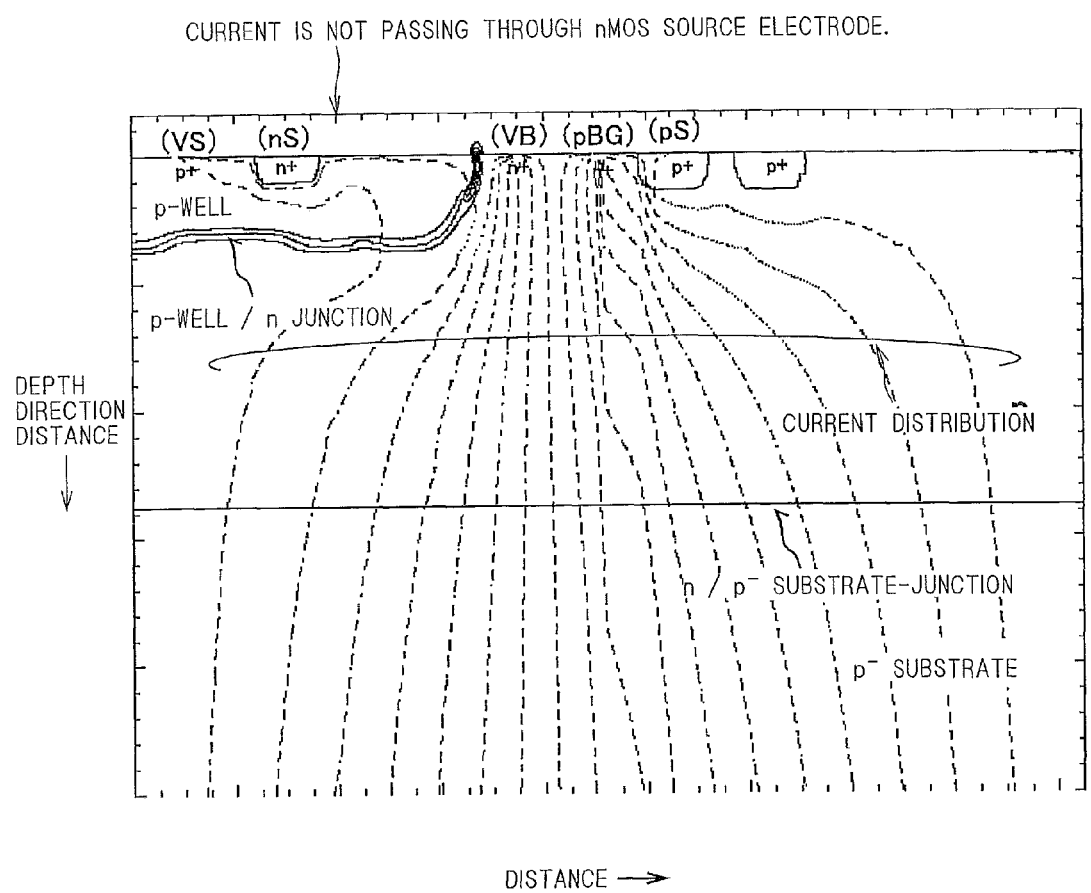
FIG. 63 shows current distribution when the VS negative voltage is −17 V in the conventional semiconductor device.

The simplified structure of the CMOS part in the conventional semiconductor device shown in FIG. 60 in which the n+ buried layer 31 is additionally formed under the n-type impurity region 121 is the structure of the semiconductor device according to the ninth preferred embodiment. FIG. 45 is a graph showing, upon application of the VS negative voltage to the VS electrode with respect to the FIG. 60 structure in which the n+ buried layer 31 is additionally formed, the correlation between (X-Y) indicating the relationship between the widths X and Y in FIG. 44 and operation-starting voltage of a parasitic p-n-p-n thyristor. This parasitic p-n-p-n thyristor results from a p-n-p-n-structure composed of the p− substrate 200, the n-type impurity region 121, the n+ buried layer 31, the p-well 131, and the n+-type source region 133. The lateral axis of the graph shown in FIG. 45 indicates the value of (X-Y) and the longitudinal axis indicates a value obtained by multiplying the VS negative voltage when the parasitic p-n-p-n thyristor starts the operation by −1 (namely the absolute value of the VS negative voltage).

It is shown in the graph shown in FIG. 45 that as the value of (X-Y) increases, the absolute value of the VS negative voltage for the parasitic p-n-p-n thyristor to start the operation also increases. It is therefore shown that as the width X of the n+ buried layer 31 increases, the latchup resistance of the CMOS 12 with respect to negative fluctuations of the high-voltage-side floating offset voltage VS increases.

FIG. 46 is a graph showing, upon application of the VS negative voltage to the VS electrode with respect to the FIG. 60 structure in which the n+ buried layer 31 is additionally formed, the value of current passing through each of the bulk electrode, the pMOS source electrode, and the nMOS source electrode. It is shown in FIG. 46 that the current passing through the nMOS source electrode becomes almost the same as the current passing through the pMOS source electrode when the VS negative voltage is approximately −150 V.

Figure 47:
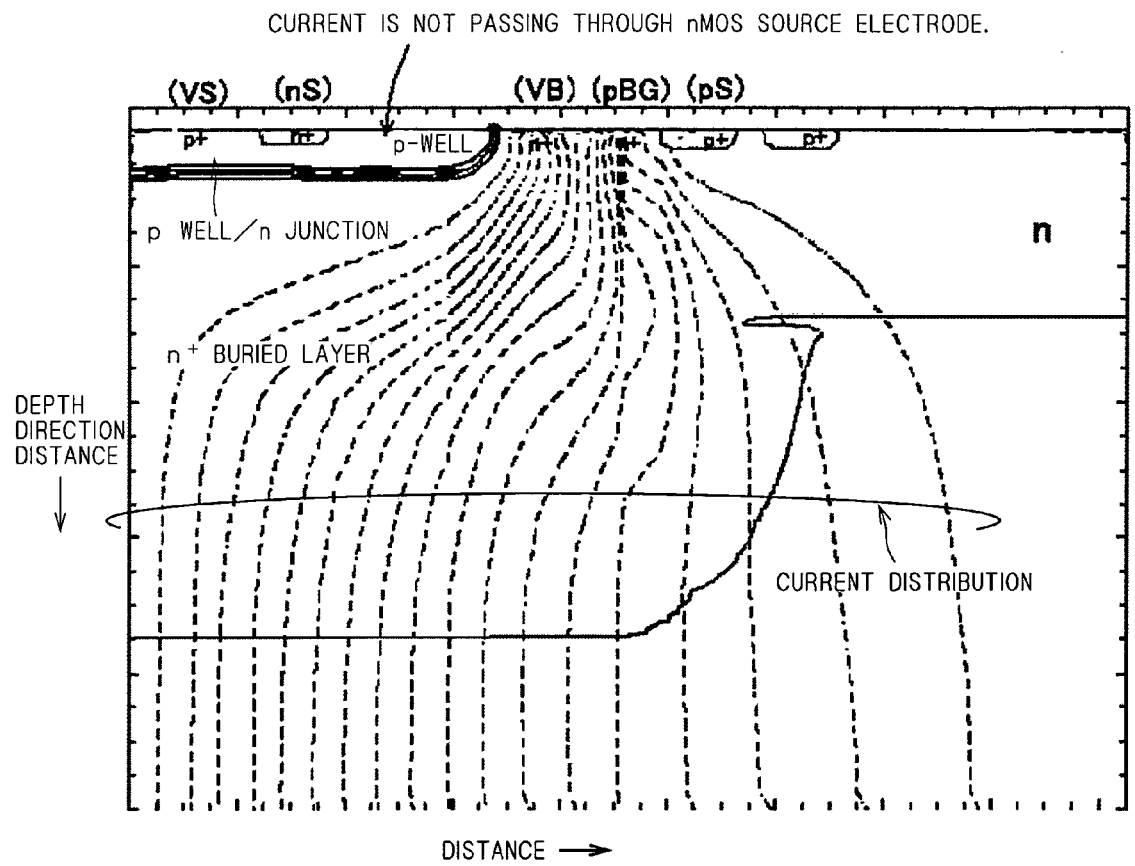
FIG. 47 shows current distribution when the VS negative voltage is −140 V in the semiconductor device according to the ninth preferred embodiment.

FIG. 47 shows current distribution when the VS negative voltage in FIG. 46 is −140 V. It is shown that current does not pass through the nMOS source electrode when the VS negative voltage is −140 V, not causing the above parasitic p-n-p-n thyristor to operate.

Figure 48:
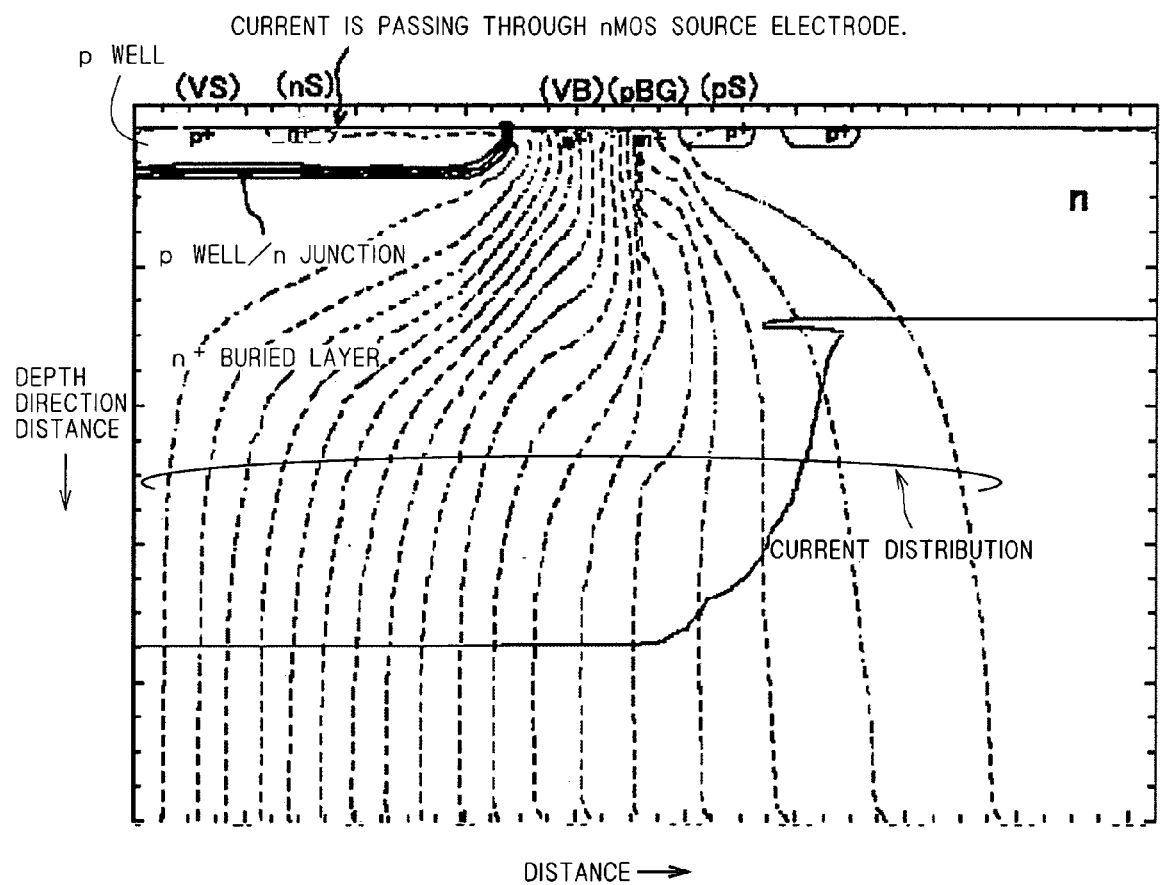
FIG. 48 shows current distribution when the VS negative voltage is −150 V in the semiconductor device according to the ninth preferred embodiment.

FIG. 48 shows current distribution when the VS negative voltage in FIG. 46 is −150 V. It is shown that current passes through the nMOS source electrode when the VS negative voltage is −150 V, causing the above parasitic p-n-p-n thyristor to operate.

As mentioned above, as the width X of the n+ buried layer 31 increases, the latchup resistance of the CMOS 12 with respect to negative fluctuations of the high-voltage-side floating offset voltage VS increases. A too much increase of the width X, however, will lead to an increase in region (invalid region) where an active element such as an NMOS cannot be formed on a wafer surface, resulting in an increase in chip size and an increase in cost.

Figure 49:
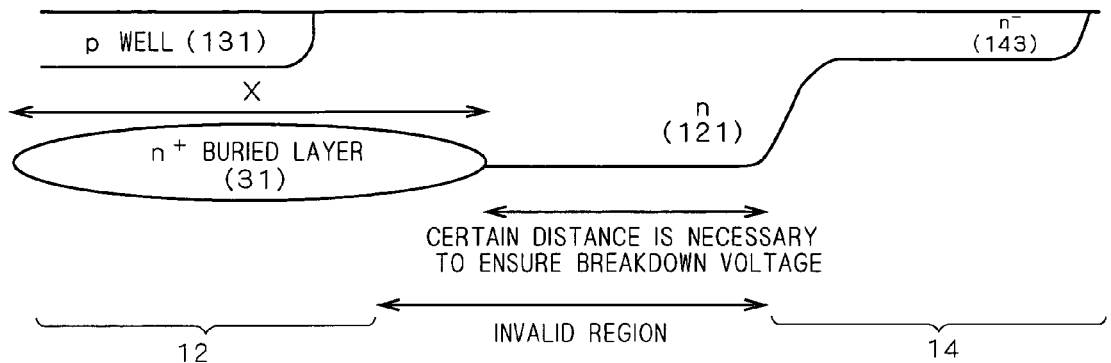
FIGS. 49 to 51 are cross-sectional views of the structure of the CMOS part in the semiconductor device according to the ninth preferred embodiment.

In the FIG. 49 example, the width X of the n+ buried layer 31 is wide such that the n+ buried layer 31 protrudes substantially rightward from a right side surface of the p-well 131. This results in an increased invalid region and an increased chip size.

Figure 50:
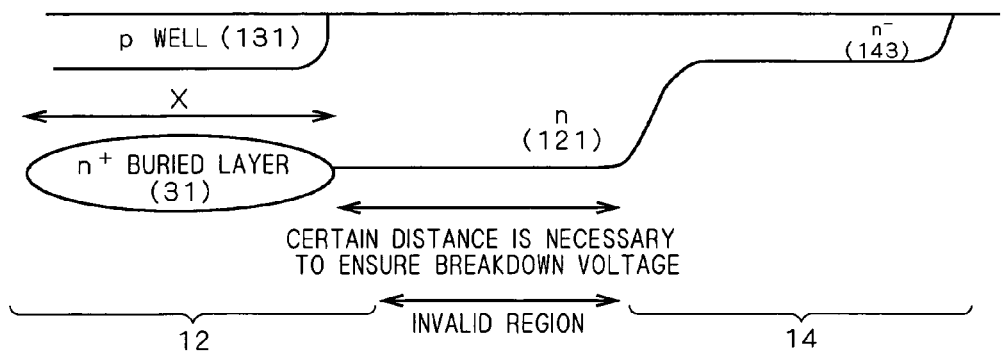

In the FIG. 50 example, on the other hand, the width X of the n+ buried layer 31 is relatively narrow such that the n+ buried layer 31 is only formed below the p-well 131, and does not protrude rightward from the right side surface of the p-well 131. This results in a smaller invalid area than in the FIG. 49 structure and thus a smaller chip size. Moreover, the n+ buried layer 31 formed below the p-well 131 is formed to completely include a region (i.e. unfailingly spreads) below the n+-type source region 133 formed in the p-well 131, maintaining the improved latchup resistance effect.

Figure 51:
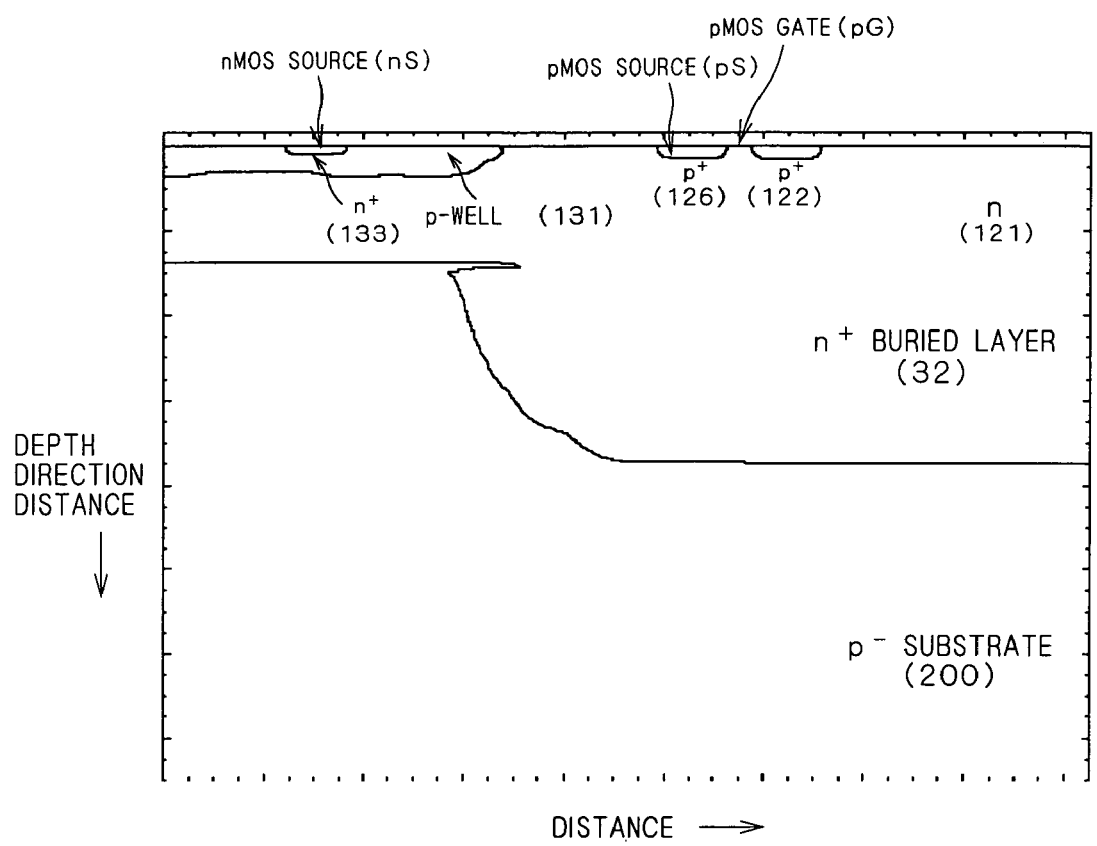

FIG. 51 shows, for comparison with FIG. 44, the FIG. 44 structure in which an n+buried layer 32 is formed instead of the n+ buried layer 31. The n+ buried layer 32 is formed in contact with the bottom surface of the n-type impurity region 121, but spreads not below the n+-type source region 133 of the nMOSFET but below the p+-type source region 126 and the gate region of the pMOSFET.

FIG. 52 is a graph showing, upon application of the VS negative voltage to the VS electrode with respect to the FIG. 60 structure in which the n+ buried layer 32 is additionally formed, the value of current passing through each of the bulk electrode, the pMOS source electrode, and the nMOS source electrode. It is shown in FIG. 52 that the current passing through the nMOS source electrode becomes almost the same as the current passing through the pMOS source electrode when the VS negative voltage is approximately −40 V.

FIG. 53 shows current distribution when the VS negative voltage in FIG. 52 is −17 V. It is shown that current does not pass through the nMOS source electrode when the VS negative voltage is −17 V, not causing the above parasitic p-n-p-n thyristor to operate.

Figure 54:
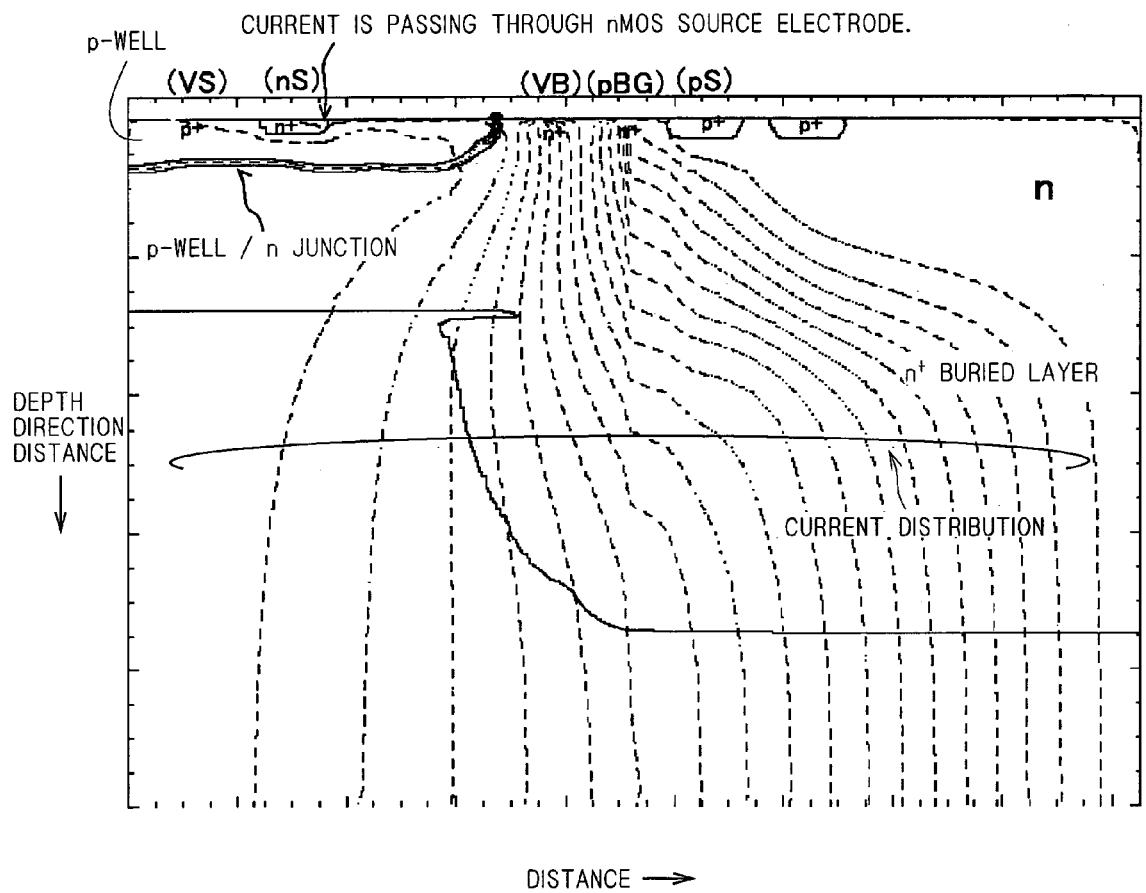
FIG. 54 shows current distribution when the VS negative voltage is −40 V in the semiconductor device according to the ninth preferred embodiment.

FIG. 54 shows current distribution when the VS negative voltage in FIG. 52 is −40 V. It is shown that current passes through the nMOS source electrode when the VS negative voltage is −40V, causing the above parasitic p-n-p-n thyristor to operate.

Consideration of the results shown in FIGS. 52 to 54 indicates that the latchup resistance obtained by additionally forming the n⁺ buried layer 32 is almost the same as that of the conventional semiconductor device (see FIG. 61) in which the n⁺ buried layer 32 is not formed, and therefore the additional n⁺ buried layer 32 is not effective.

That is, the latchup resistance of the CMOS 12 with respect to negative fluctuations of the high-voltage-side floating offset voltage VS is increased effectively not by the n⁺ buried layer 32 spreading below p⁺-type source region 126 and the gate region of the pMOSFET, but by the n⁺ buried layer 31 spreading below the n⁺-type source region 133 formed in the upper surface of the p-well 131.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device for driving a switching device that includes a first electrode, a second electrode, and a control electrode, said semiconductor device comprising:
   a first terminal connected to said first electrode;
   a second terminal connected to said first electrode via a capacitive element;
   a semiconductor substrate of a first conductivity type, and having a first impurity concentration;
   a first impurity region of a second conductivity type formed in a main surface of said semiconductor substrate, said first impurity region having a second impurity concentration higher than that of said first impurity concentration;
   a second impurity region of said first conductivity type forming a well in a main surface of said first impurity region;
   a first transistor including a source/drain region of said second conductivity type, said source/drain region being formed in a main surface of said well and connected to said first terminal;
   a second transistor including a source/drain region of said first conductivity type, said source/drain region of said second transistor being formed in said main surface of said first impurity region and connected to said second terminal; and
   a buried layer of said second conductivity type having a third impurity concentration higher than that of said second impurity concentration and formed in said semiconductor substrate beneath said well and said source/drain region of said second transistor, said third impurity region being in contact with a bottom surface of said first impurity region.

2. The semiconductor device according to claim 1, wherein said buried layer includes:
   a high concentration impurity region of said second conductivity type formed in said semiconductor substrate, said high concentration impurity region having a third impurity concentration higher than said second impurity concentration; and
   a low concentration impurity region of said second conductivity type formed in said semiconductor substrate, said low concentration impurity region covering the circumference of said high concentration impurity region while being in contact with said bottom surface of said first impurity region, and having said second impurity concentration.

3. A semiconductor device comprising:
   a semiconductor substrate of a first conductivity type, and having a first impurity concentration;
   a first electrode and a second electrode formed on a main surface of said semiconductor substrate;
   a first impurity region of said first conductivity type forming a well in said main surface of said semiconductor substrate, said first impurity region being connected to said first electrode;
   a second impurity region of a second conductivity type formed in said main surface of said semiconductor substrate, and having a second impurity concentration higher than said first impurity concentration, said second impurity region being connected to said second electrode;
   a third impurity region of said second conductivity type formed in said main surface of said semiconductor substrate, and having an impurity concentration lower than said second impurity concentration, said third impurity region including a portion sandwiched between a side surface of said first impurity region and a side surface of said second impurity region; and
   a first buried layer of said second conductivity type formed in contact with a bottom surface of said second impurity region, said first buried layer having an impurity concentration higher than said first impurity concentration and being formed in said semiconductor substrate in such a manner as not to protrude from said side surface of said second impurity region toward said first impurity region side.

4. The semiconductor device according to claim 3, further comprising a second buried layer of said second conductivity type formed in said first buried layer in such a manner as not to protrude from a side surface of said first buried layer toward said third impurity region side, said second buried layer having an impurity concentration higher than the impurity concentration of said first buried layer.

5. A semiconductor device comprising:
   a semiconductor substrate of a first conductivity type, and having a first impurity concentration;
   a first electrode and a second electrode formed on a main surface of said semiconductor substrate;
   a first impurity region of a second conductivity type formed in said main surface of said semiconductor substrate, and having a second impurity concentration higher than said first impurity concentration, said first impurity region being connected to said first electrode;
   a second impurity region of said second conductivity type formed in said main surface of said semiconductor substrate, and having the second impurity concentration higher than said first impurity concentration, said second impurity region being apart from said first impurity region, being connected to said second electrode, and having a side surface opposed to a side surface of said first impurity region; and
   a first buried layer of said second conductivity type having an impurity concentration higher than that of said substrate and formed in said semiconductor substrate, said first buried layer being in contact with a bottom surface of said second impurity region, and having a side surface not in contact with said side surface of said first impurity region.

6. The semiconductor device according to claim 5, further comprising a second buried layer of said second conductivity type formed in said first buried layer in such a manner as not to protrude from each of said side surfaces of said second impurity region and said first buried layer toward said first impurity region side, said second buried layer having an impurity concentration higher than the impurity concentration of said first buried layer.

7. A semiconductor device for driving a switching device that includes a first electrode, a second electrode, and a control electrode, said semiconductor device comprising:
- a first terminal connected to said first electrode;
- a second terminal connected to said first electrode via a capacitive element;
- a first impurity region of a first conductivity type having a first impurity concentration;
- a second impurity region of a second conductivity type forming a well in a main surface of said first impurity region;
- a first transistor including a source/drain region of said first conductivity type, said source/drain region being formed in a main surface of said well and connected to said first terminal;
- a second transistor including a source/drain region of said second conductivity type, said source/drain region of said second transistor being formed in said main surface of said first impurity region and connected to said second terminal; and
- a buried layer of said first conductivity type having an impurity concentration higher than that of said first impurity region and located beneath said well and said source/drain region of said second transistor, said third impurity region being in contact with a bottom surface of said first impurity region.

8. The semiconductor device according to claim 7, wherein said buried layer includes:
- a high concentration impurity region of said first conductivity type, said high concentration impurity region having a second impurity concentration higher than said first impurity concentration; and
- a low concentration impurity region of said first conductivity type formed to cover the circumference of said high concentration impurity region while being in contact with said bottom surface of said first impurity region, said low concentration impurity region having said first impurity concentration lower than said second impurity concentration.

9. A semiconductor device for driving a switching device that includes a first electrode, a second electrode, and a control electrode, said semiconductor device comprising:
- a first terminal connected to said first electrode;
- a second terminal connected to said first electrode via a capacitive element;
- a semiconductor substrate of a first conductivity type, and having a first impurity concentration;
- a first impurity region of a second conductivity type formed in a main surface of said semiconductor substrate, and having a second impurity concentration higher than that of said first impurity concentration;
- a second impurity region of said first conductivity type forming a well in a main surface of said first impurity region;
- a first transistor including a source/drain region of said second conductivity type, said source/drain region being formed in a main surface of said well and connected to said first terminal;
- a second transistor including a source/drain region of said first conductivity type, said source/drain region of said second transistor being formed in said main surface of said first impurity region and connected to said second terminal; and
- a buried layer of said second conductivity type formed in said semiconductor substrate, said buried layer including at least a region below said source/drain region of said first transistor while being in contact with a bottom surface of said first impurity region, and having a third impurity concentration higher than the second impurity concentration of said first impurity region.

10. The semiconductor device according to claim 9, wherein said buried layer is only formed below said well.

* * * * *